United States Patent
Fukutome et al.

(10) Patent No.: US 11,403,833 B2
(45) Date of Patent: Aug. 2, 2022

(54) IMAGE DETECTION MODULE AND INFORMATION MANAGEMENT SYSTEM

(71) Applicant: Semiconductor Energy Laboratory Co., Ltd., Kanagawa-ken (JP)

(72) Inventors: Takahiro Fukutome, Kanagawa (JP); Hiromichi Godo, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 98 days.

(21) Appl. No.: 16/612,241

(22) PCT Filed: May 10, 2018

(86) PCT No.: PCT/IB2018/053237
§ 371 (c)(1),
(2) Date: Nov. 8, 2019

(87) PCT Pub. No.: WO2018/211366
PCT Pub. Date: Nov. 22, 2018

(65) Prior Publication Data
US 2021/0150241 A1  May 20, 2021

(30) Foreign Application Priority Data
May 18, 2017  (JP) .............................. JP2017-099346

(51) Int. Cl.
*G06V 10/147* (2022.01)
*G06K 9/62* (2022.01)
(Continued)

(52) U.S. Cl.
CPC ......... *G06V 10/147* (2022.01); *G06K 9/6256* (2013.01); *G06N 3/04* (2013.01);
(Continued)

(58) Field of Classification Search
CPC ................... H01L 25/167; H01L 2924/12043
See application file for complete search history.

(56) References Cited

U.S. PATENT DOCUMENTS 5,331,422 A * 7/1994 Nishida .................. H04N 5/238
  348/363
6,410,899 B1 * 6/2002 Merrill .................... H04N 5/374
  250/208.1
(Continued)

FOREIGN PATENT DOCUMENTS

EP  3 351 089 A1  7/2018
JP  2000-340779 A  12/2000
(Continued)

OTHER PUBLICATIONS

Arvanitis CD, Bohndiek SE, Segneri G, Venanzi C, Royle G, Clark A, Crooks J, Halsall R, Key-Charriere M, Martin S, Prydderch M. A novel active pixel sensor with on-pixel analog-to-digital converter for mammography. In2006 IEEE Nuclear Science Symposium Conference Record (Year: 2006).*
International Search Report re Application No. PCT/IB2018/053237, dated Aug. 7, 2018.
Written Opinion re Application No. PCT/IB2018/053237, dated Aug. 7, 2018.

*Primary Examiner* — Clifford Hilaire
(74) *Attorney, Agent, or Firm* — Husch Blackwell LLP

(57) ABSTRACT

Environmental information is managed by a neural network. An image detection module includes a first neural network, a first communication module, a first position sensor, a first processor, and a passive element. The first neural network includes an imaging device. The imaging device has a function of obtaining an image, and the first position sensor has a function of detecting positional information on where the image is obtained. When the first neural network determines whether the image has learned features, the first processor can transmit the positional information on where the image is obtained. The first processor receives a detec- (Continued)

tion result through the first communication module, and the first processor can operate the passive element in accordance with the detection result.

11 Claims, 25 Drawing Sheets

(51) Int. Cl.
  *G06N 3/04* (2006.01)
  *G06N 3/08* (2006.01)
  *H01L 27/146* (2006.01)
  *H04N 5/3745* (2011.01)
  *H04N 5/378* (2011.01)
  *G01J 1/42* (2006.01)
  *G06V 20/68* (2022.01)
  *G01K 13/00* (2021.01)

(52) U.S. Cl.
  CPC ......... *G06N 3/08* (2013.01); *H01L 27/14612* (2013.01); *H04N 5/378* (2013.01); *H04N 5/3745* (2013.01); *G01J 1/42* (2013.01); *G01K 13/00* (2013.01); *G06V 20/68* (2022.01)

(56) References Cited

U.S. PATENT DOCUMENTS

| | | | |
|---|---|---|---|
| 9,455,287 | B2 | 9/2016 | Kurokawa |
| 10,262,244 | B2 | 4/2019 | Yamaguchi et al. |
| 2017/0063351 | A1 | 3/2017 | Kurokawa |
| 2017/0078608 | A1 | 3/2017 | Kurokawa |
| 2017/0195654 | A1* | 7/2017 | Powers ................ H04N 5/2256 |
| 2017/0338264 | A1* | 11/2017 | Kwag .................... H04N 5/378 |
| 2019/0056498 | A1* | 2/2019 | Sonn ..................... G01S 17/931 |

FOREIGN PATENT DOCUMENTS

| | | |
|---|---|---|
| JP | 2012-175920 A | 9/2012 |
| JP | 2013-054005 A | 3/2013 |
| JP | 2016-027699 A | 2/2016 |
| JP | 2017-054502 A | 3/2017 |
| JP | 2017-055745 A | 3/2017 |
| JP | 2019-009640 A | 1/2019 |
| WO | WO 2017/037568 A1 | 3/2017 |
| WO | WO 2017/047814 A1 | 3/2017 |

* cited by examiner

13

91

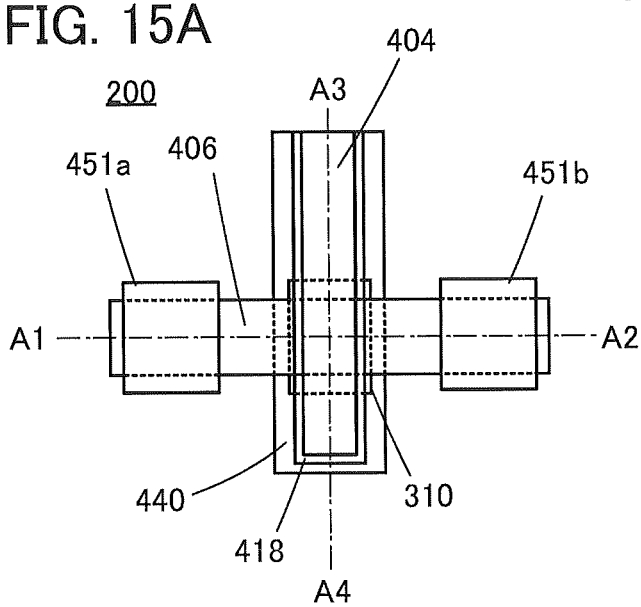
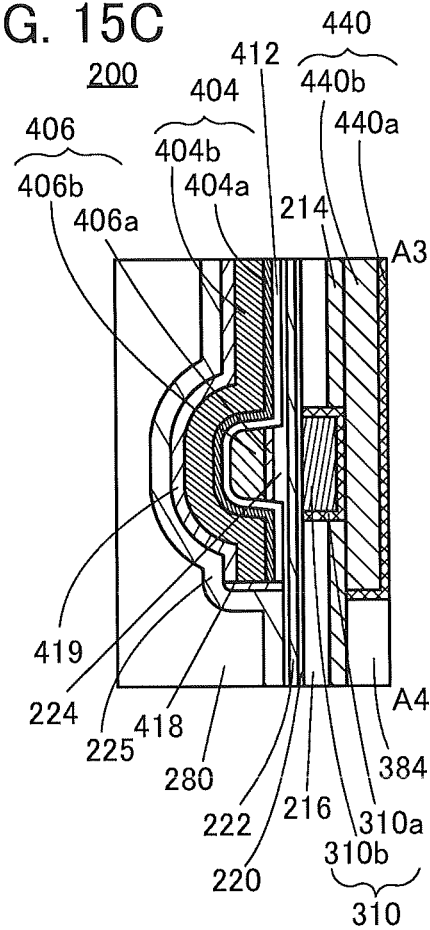
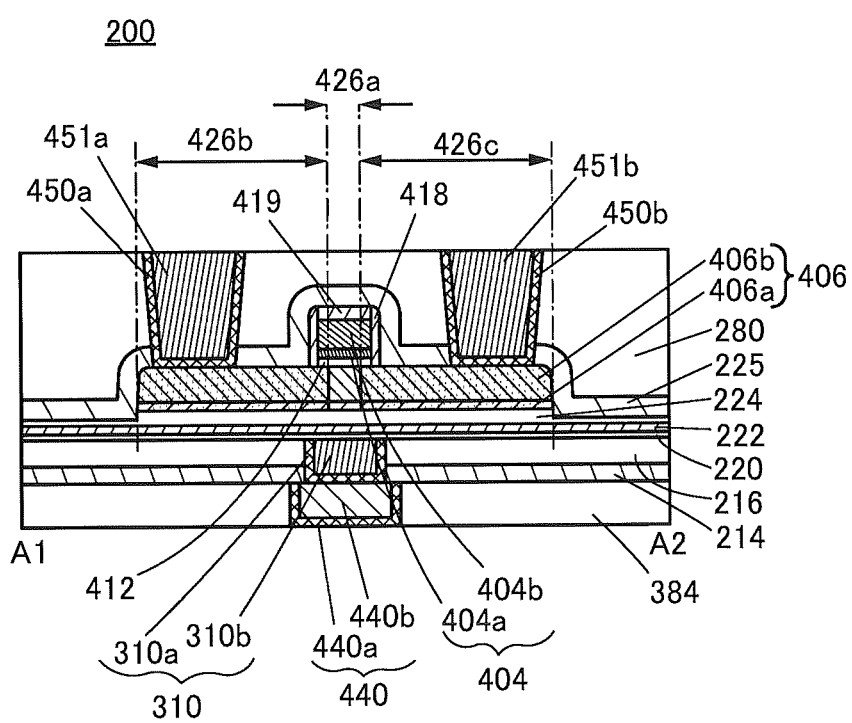
FIG. 15A
FIG. 15B
FIG. 15C

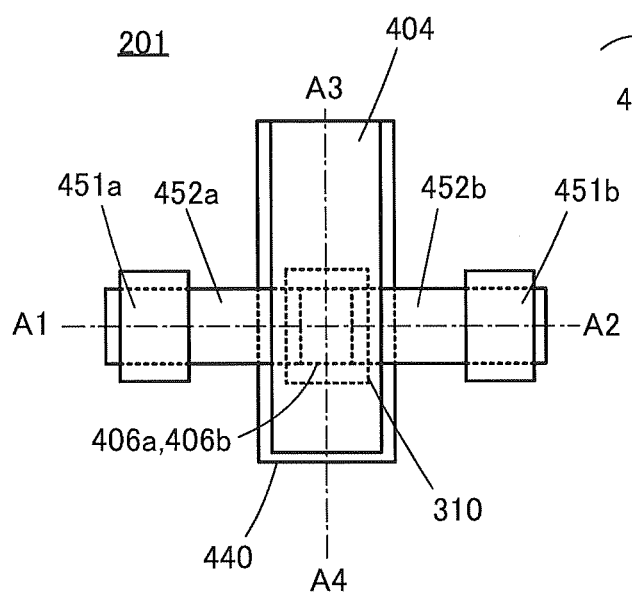
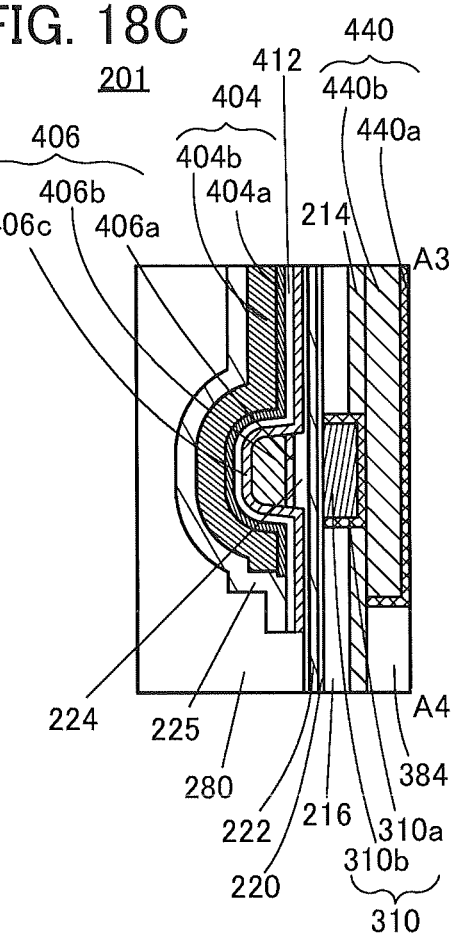
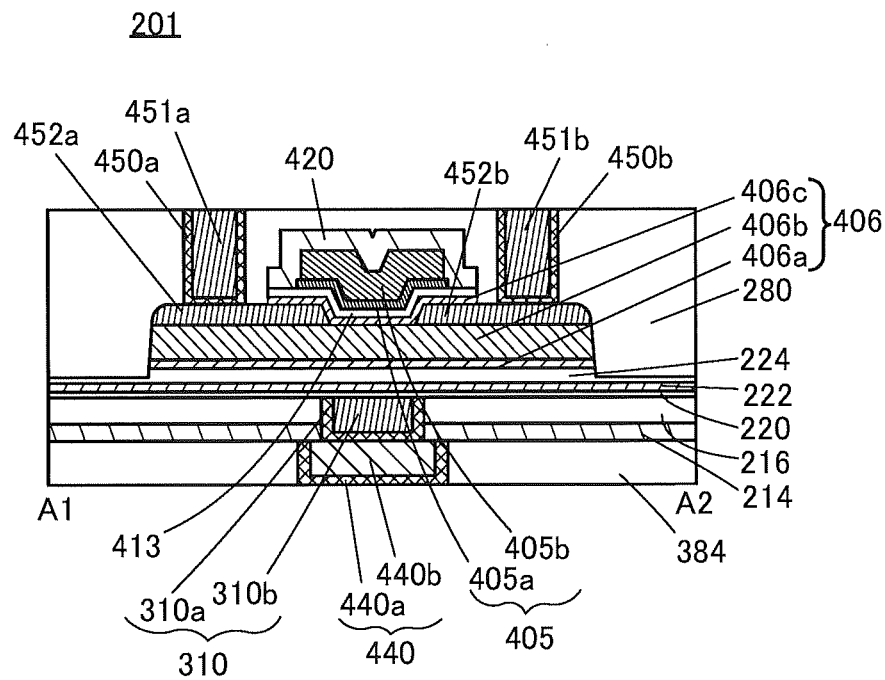
FIG. 18A
FIG. 18B
FIG. 18C

FIG. 23A1
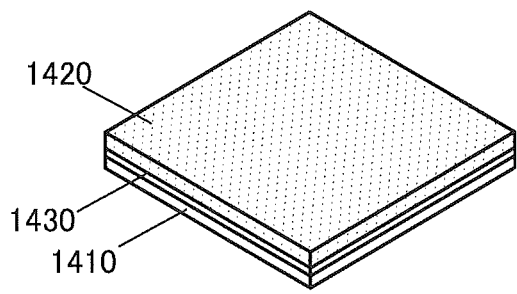
FIG. 23B1
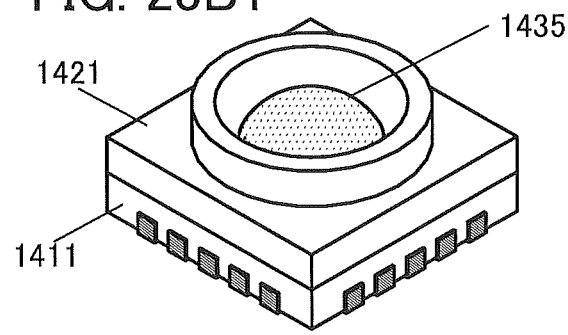
FIG. 23A2
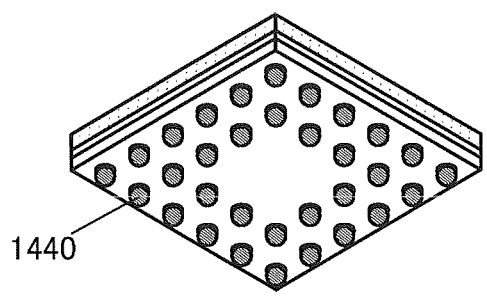
FIG. 23B2
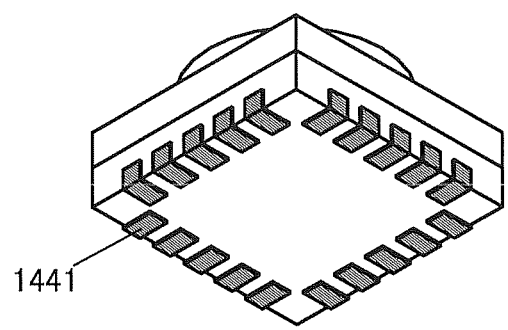
FIG. 23A3
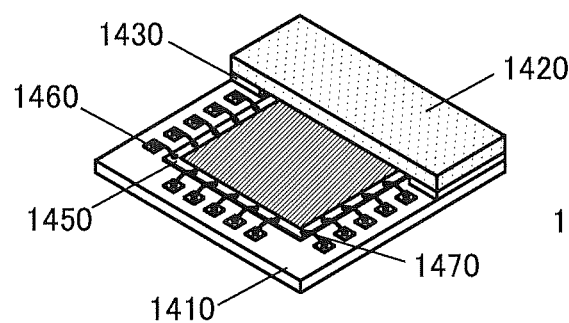
FIG. 23B3
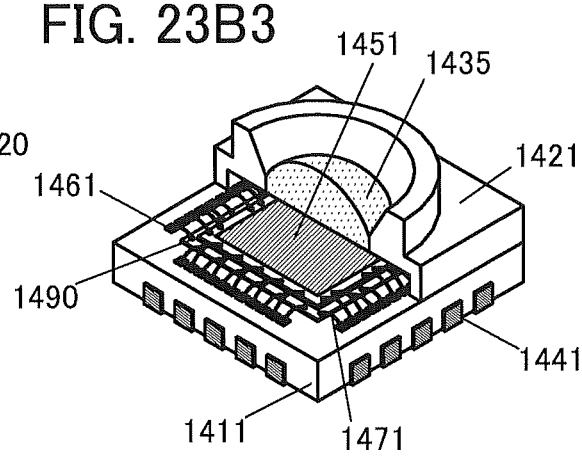

2120

2130

2140

2150

IMAGE DETECTION MODULE AND INFORMATION MANAGEMENT SYSTEM

This application is a 371 of international application PCT/IB2018/053237 filed on May 10, 2018 which is incorporated herein by reference.

TECHNICAL FIELD

One embodiment of the present invention relates to an image detection module and an information management system.

Note that one embodiment of the present invention is not limited to the above technical field. The technical field of one embodiment of the invention disclosed in this specification and the like relates to an object, a method, or a manufacturing method. In particular, one embodiment of the present invention relates to a semiconductor device, a display device, a light-emitting device, a power storage device, a memory device, a driving method thereof, or a manufacturing method thereof.

In this specification and the like, a semiconductor device means an element, a circuit, a device, or the like that can function by utilizing semiconductor characteristics. As an example, a semiconductor element such as a transistor or a diode is a semiconductor device. As another example, a circuit including a semiconductor element is a semiconductor device. As another example, a device provided with a circuit including a semiconductor element is a semiconductor device.

BACKGROUND ART

With the development of information technology such as IoT (Internet of things) or AI (Artificial Intelligence), the amount of handled data has been showing an increasing tendency. In order that electronic devices utilize information technology such as IoT or AI, dispersive control of a large amount of data has been needed.

Management of quality and improvement in productivity by managing environmental information in a space have been examined. For example, a management device for managing cultivation and harvest of plants that uses a weather detection device is proposed in Patent Document 1.

REFERENCES

Patent Documents

[Patent Document 1] Japanese Published Patent Application No. 2012-175920

SUMMARY OF THE INVENTION

Problems to be Solved by the Invention

Environmental information in a space is managed with a sensor. The sensor can collect environmental information of a place where the sensor is installed, but there is a problem that an environmental situation in the space does not change uniformly due to the flow of air, an obstacle, a heat source existing inside or outside the space, or the like.

It is known that there is a close correlation between environmental information and a cultivation situation of plants in a plant factory or the like where plants are cultivated. For example, vegetables such as tomatoes and fruits such as grapes are provided with environmental information specific to target products and managed. As for tomatoes, for example, accumulated temperature is important management information for the cultivation of tomatoes. There is a problem that the maturity degrees of tomatoes are different between each other due to positions where each fruit is borne or obstacles such as leaves even in the same plant factory.

In order to ensure stability of quality, it is important to grasp environmental information over time, but there is a problem of the difficulty in grasping environmental information of a position where the sensor is not placed in its vicinity.

In view of the above problems, an object of one embodiment of the present invention is to provide an information management system with a novel structure. Alternatively, an object of one embodiment of the present invention is to provide an information management system including a neural network. Alternatively, an object of one embodiment of the present invention is to provide an information management system that provides environmental information based on positional information. Alternatively, an object of one embodiment of the present invention is to provide an image detection module with a novel structure. Alternatively, an object of one embodiment of the present invention is to provide an image detection module including a neural network.

Note that the descriptions of these objects do not disturb the existence of other objects. One embodiment of the present invention does not need to achieve all the objects. Other objects will be apparent from the description of the specification, the drawings, the claims, and the like, and other objects can be derived from the description of the specification, the drawings, the claims, and the like.

Note that the objects of one embodiment of the present invention are not limited to the objects listed above. The objects listed above do not preclude the existence of other objects. The other objects are the objects that are not described in this section and will be described below. Objects that are not described in this section will be apparent from the description of the specification, the drawings, and the like and can be derived from the description by those skilled in the art. One embodiment of the present invention is to solve at least one object of the objects listed above and/or the other objects.

Means for Solving the Problems

One embodiment of the present invention is an image detection module including a first neural network, a first communication module, a first position sensor, a first processor, and a passive element. The first neural network includes an imaging device; the imaging device has a step of obtaining an image; the first position sensor has a step of detecting first positional information on where the image is obtained; the first neural network has a step of determining whether the image has learned features; the first processor has a step of transmitting the first positional information on where the image is obtained through the first communication module; the first processor has a step of receiving a detection result through the first communication module; and the first processor has a step of operating the passive element in accordance with the detection result.

One embodiment of the present invention is an information management system including a data server, a first environment monitor module, and a second environment monitor module, and the data server includes a second neural network, a second communication module, and a second processor. The first environment monitor module includes a first environment sensor module, a second position sensor, a third communication module, and a third processor. The second environment monitor module includes a second environment sensor module, a third position sensor, a fourth communication module, and a fourth processor. The first or second environment sensor module includes one or more of a temperature sensor, a humidity sensor, an illuminance sensor, and an air flow meter. The second position sensor has a step of detecting second positional information; the third position sensor has a step of detecting third positional information; the first environment sensor module has a step of detecting first environmental information; the second environment sensor module has a step of detecting second environmental information; the third processor has a step of transmitting the first environmental information and the second positional information to the data server through the third communication module; the fourth processor has a step of transmitting the second environmental information and the third positional information to the data server through the fourth communication module; the second processor has a step of recording the first environmental information and the second positional information received from the first environment monitor module through the second communication module; the second processor has a step of recording the second environmental information and the third positional information received from the second environment monitor module through the second communication module; and the second neural network has a step of calculating the environmental information of any one of positions in a space interposed between the first environment sensor module and the second environment sensor module.

One embodiment of the present invention is an information management system including an image detection module, environment monitor modules, and a data server.

The image detection module includes a first neural network, a first communication module, a first position sensor, a first processor, and a passive element. The first neural network includes an imaging device. The data server includes a second neural network, a second communication module, and a second processor. The environment monitor modules each include a plurality of environment sensor modules, a second position sensor, a third communication module, and a third processor. The environment sensor modules each include one or more of a temperature sensor, a humidity sensor, an illuminance sensor, and an air flow meter. The environment sensor modules have a step of detecting respective environmental information; the first position sensor has a step of detecting first positional information; the second position sensor has a step of detecting second positional information; the data server has a function of collecting and storing the environmental information and the second positional information through the second communication module; the second neural network has a function of calculating the environmental information of any one of positions in a space interposed between the environment sensor modules by using the environmental information and the second positional information detected by the environment sensor modules; the imaging device has a step of obtaining an image; the first position sensor has a step of detecting the first positional information on where the image is obtained; the first neural network has a step of determining whether the image has learned features; the first processor has a step of transmitting the first positional information on where the image is detected to the data server through the first communication module; the data server has a step of calculating an accumulated value of the environmental information from the first positional information by the second neural network; the second processor has a step of transmitting the accumulated value of the environmental information to the image detection module through the second communication module; the first processor has a step of determining the accumulated value of the environmental information received through the first communication module; and the first processor has a step of operating the passive element in accordance with a detection result.

In each of the above embodiments, the information management system in which the first neural network has a step of learning by an image for learning received through the first communication module is preferable.

In each of the above embodiments, the information management system in which the passive element is a light-emitting element is preferable.

In each of the above embodiments, the information management system in which the passive element is a vibrating element is preferable.

In each of the above embodiments, the information management system in which the environment sensor module is positioned in soil is preferable.

In each of the above embodiments, the information management system in which the environment sensor module is positioned in water is preferable.

In each of the above embodiments, the information management system determining a harvest time of a harvest target in a plant factory is preferable.

In each of the above embodiments, the information management system determining indoor environment is preferable.

One embodiment of the present invention is an image detection module including a first neural network, characterized in that the first neural network includes an imaging device; the imaging device includes a plurality of pixels, a first signal line (65), a second signal line (66), a third signal line (67), a fourth signal line (68), a fifth signal line (69), a first wiring (75), a second wiring (76), a third wiring (77), and a fourth wiring (21*a*); the pixel includes a first transistor (51), a second transistor (52), a third transistor (53), a fourth transistor (54), a fifth transistor (55), a first capacitor (33), a second capacitor (34), and a photodiode; a gate of the first transistor (51) is electrically connected to the first signal line (65); one of a source and a drain of the first transistor (51) is electrically connected to the first wiring (75); the other of the source and the drain of the first transistor (51) is electrically connected to one of a source and a drain of the second transistor (52) and one electrode of the photodiode; the other electrode of the photodiode is electrically connected to the second wiring (76); a gate of the second transistor (52) is electrically connected to the second signal line (66); the other of the source and the drain of the second transistor (52) is electrically connected to a gate of the third transistor (53) and one electrode of the first capacitor; one of a source and a drain of the third transistor (53) is electrically connected to the first wiring (75); the other of the source and the drain of the third transistor (53) is electrically connected to one of a source and a drain of the fourth transistor (54); a gate of the fourth transistor (54) is electrically connected to the third signal line (67); the other of the source and the drain of the fourth transistor (54) is electrically connected to the fourth wiring (21*a*); the other electrode of the first capacitor is electrically connected to one electrode of the second capacitor and one of a source and a drain of the fifth transistor (55); a gate of the fifth transistor (55) is electrically connected to the fourth signal line (68); the other of the source and the drain of the fifth transistor (55) is electrically connected to the fifth signal line (69); the other electrode of the second capacitor is electrically connected to the third wiring (77); a first node is formed by connecting the other of the source and the drain of the second transistor (52), the gate of the third transistor (53), and the one electrode of the first capacitor; and a second node is formed by connecting the other electrode of the first capacitor, the one electrode of the second capacitor, and the one of the source and the drain of the fifth transistor (55).

In each of the above embodiments, the image detection module characterized in that the imaging device further includes a gate driver (22), a plurality of adder circuits (23), a plurality of analog/digital converter circuits (13b), a sixth signal line (61), a seventh signal line (62), a fifth wiring (71), a sixth wiring (72), a seventh wiring (73), and an eighth wiring (74); the adder circuit (23) includes a sixth transistor (56), a seventh transistor (57), an eighth transistor (58), a third capacitor (31), and a fourth capacitor (32); the gate driver is electrically connected to the plurality of pixels (21) through the third signal line (67); the adder circuit (23) is electrically connected to the plurality of pixels through the fourth wiring (21a); the fourth wiring (21a) is electrically connected to the analog/digital converter circuit (13b) through the adder circuit (23); the fourth wiring (21a) is electrically connected to one electrode of the third capacitor, one of a source and a drain of the sixth transistor (56), and one of a source and a drain of the eighth transistor (58); a gate of the sixth transistor (56) is electrically connected to the sixth signal line (61); the other of the source and the drain of the sixth transistor (56) is electrically connected to the fifth wiring (71); the other electrode of the third capacitor is electrically connected to one electrode of the fourth capacitor and one of a source and a drain of the seventh transistor (57); a gate of the seventh transistor (57) is electrically connected to the seventh signal line (62); the other of the source and the drain of the seventh transistor (57) is electrically connected to the sixth wiring (72); the other electrode of the fourth capacitor is electrically connected to the eighth wiring (74); a gate of the eighth transistor (58) is electrically connected to the other of the source and the drain of the eighth transistor (58) and the seventh wiring (73); a third node is formed by connecting the one electrode of the third capacitor, the one of the source and the drain of the sixth transistor (56), the one of the source and the drain of the eighth transistor (58), the analog/digital converter circuit, and the fourth wiring (21a); and a fourth node is formed by connecting the other electrode of the third capacitor, the one electrode of the fourth capacitor, and the one of the source and the drain of the seventh transistor (57) is preferable.

In each of the above embodiments, the image detection module in which a first voltage is supplied from the fifth signal line (69) to the one electrode of the second capacitor through the fifth transistor (55); the first voltage is supplied from the third wiring (77) to the other electrode of the second capacitor; the second capacitor has a function of an electrode having the first voltage; the first voltage is supplied from the sixth wiring (72) to the one electrode of the fourth capacitor through the seventh transistor (57); the first voltage is supplied from the eighth wiring (74) to the other electrode of the fourth capacitor; the fourth capacitor has a function of an electrode having the first voltage; a signal supplied to the first signal line (65) turns on the first transistor (51); a signal supplied to the second signal line (66) turns on the second transistor (52); the first node is updated by a reset voltage supplied to the first wiring (75); a signal supplied to the first signal line (65) turns off the first transistor (51); at the first node, imaging data is updated by a photocurrent flowing through the photodiode; a signal supplied to the second signal line (66) turns off the second transistor (52); the imaging data retained in the first capacitor is retained in the first node; the imaging data is supplied to the gate of the third transistor (53); the gate driver (22) has a function of supplying a scan signal to the third signal line (67); the scan signal controls the fourth transistor (54); the imaging data is converted into a first current by the third transistor; the first current is supplied to the fourth wiring (21a) through the fourth transistor; the first current is supplied to the third capacitor of the adder circuit (23) through the fourth wiring (21a); the third capacitor converts the first current into a first output voltage and changes a potential of the third node; and the first output voltage is supplied to the analog/digital converter circuit, whereby the image detection module functions as an imaging element is preferable.

In each of the above embodiments, the image detection module in which an offset potential is supplied from the fifth wiring (71) to the third node through the sixth transistor (56); the offset potential is supplied from the sixth wiring (72) to the fourth node through the seventh transistor (57); the first voltage is supplied from the eighth wiring (74) to the other electrode of the fourth capacitor; a signal supplied to the first signal line (65) turns on the first transistor (51); a signal supplied to the second signal line (66) turns on the second transistor (52); the first node is updated by a reset voltage supplied to the first wiring (75) through the first transistor (51); the second node is updated by the first voltage supplied to the fifth signal line (69) through the fifth transistor (55); a second voltage is supplied from the third wiring (77) to the other electrode of the second capacitor as a weight coefficient; a signal supplied to the first signal line (65) turns off the first transistor (51); a signal supplied to the fourth signal line (68) turns off the fifth transistor (55); at the first node, the imaging data is updated by the photocurrent flowing through the photodiode; a signal supplied to the second signal line (66) turns off the second transistor (52); the imaging data retained in the first capacitor is retained in the first node; the third wiring (77) is updated from the second voltage to the first voltage; the first node generates a third voltage obtained by adding the second voltage to the imaging data by capacitive coupling between the first capacitor and the second capacitor; the third voltage has a multiplication function corresponding to a difference from the second voltage when supplied to the gate of the third transistor (53); the gate driver (22) has a function of supplying scan signals to a plurality of the third signal lines (67); the scan signals control the fourth transistors (54) of the plurality of pixels; the imaging data of each of the pixels is converted into the first current by the third transistor; the first current is supplied to the fourth wiring (21a) through the fourth transistor; the fourth wiring (21a) generates a second current obtained by adding the first currents output from the pixels; the second current is supplied to the third capacitor of the adder circuit (23) through the fourth wiring (21a); the third capacitor converts the second current into a second output voltage using the offset potential as a reference and changes a potential of the third node; and the second output voltage is supplied to the analog/digital converter circuit, whereby the imaging device functions as a neuron having a product-sum operation function is preferable.

In each of the above embodiments, the image detection module in which the eighth transistor (58) has a function of a diode; the second output voltage has a function of being output while a potential higher than or equal to a determination voltage supplied to the seventh wiring (73) is clipped; the analog/digital converter circuit has a function of setting the determination voltage supplied to the seventh wiring (73) to a maximum value of an analog input voltage; when the second output voltage is the same as the determination voltage, the analog/digital converter circuit detects the maximum value; and when the analog/digital converter circuit detects the maximum value, the neuron of the first neural network has a function of determining ignition is preferable.

In each of the above embodiments, the image detection module in which a pixel data potential for learning is supplied from the fifth signal line (69) to the second node through the fifth transistor (55); the second voltage is supplied from the third wiring (77) to the other electrode of the second capacitor as a weight coefficient; a signal supplied to the first signal line (65) turns off the first transistor (51); a signal supplied to the second signal line (66) turns off the second transistor (52); a signal supplied to the fourth signal line (68) turns off the fifth transistor (55); the first node retains the reset voltage; the third wiring (77) is updated from the second voltage to the pixel data potential for learning; and the first node has a function of generating a fourth voltage obtained by adding the reset voltage, the pixel data potential for learning, and the second voltage by capacitive coupling, whereby the first neural network has a learning function is preferable.

In each of the above embodiments, the image detection module including a transistor in which the transistor includes a metal oxide in a semiconductor layer is preferable.

In each of the above embodiments, the image detection module characterized in that the transistor including a metal oxide in a semiconductor layer includes a back gate is preferable.

Effect of the Invention

One embodiment of the present invention can provide an information management system with a novel structure. Alternatively, one embodiment of the present invention can provide an information management system including a neural network. Alternatively, one embodiment of the present invention can provide an information management system that provides environmental information based on positional information. Alternatively, one embodiment of the present invention can provide an image detection module with a novel structure. Alternatively, one embodiment of the present invention can provide an image detection module including a neural network.

Note that the effects of one embodiment of the present invention are not limited to the effects listed above. The effects listed above do not preclude the existence of other effects. The other effects are the effects that are not described in this section and will be described below. Effects that are not described in this section will be apparent from the description of the specification, the drawings, and the like and can be derived from the description by those skilled in the art. One embodiment of the present invention is to solve at least one effect of the effects listed above and/or the other effects. Therefore, one embodiment of the present invention does not have the effects listed above in some cases.

BRIEF DESCRIPTION OF DRAWINGS

FIGS. 15A-15C are a top view and cross-sectional views illustrating a structure example of a transistor.

FIGS. 18A-18C are a top view and cross-sectional views illustrating a structure example of a transistor.

FIGS. 23A1-23B3 are perspective views of a package including an imaging device.

Embodiment 1

In this embodiment, an image detection module is described with reference to FIG. 1 to FIG. 8.

Figure 1A:
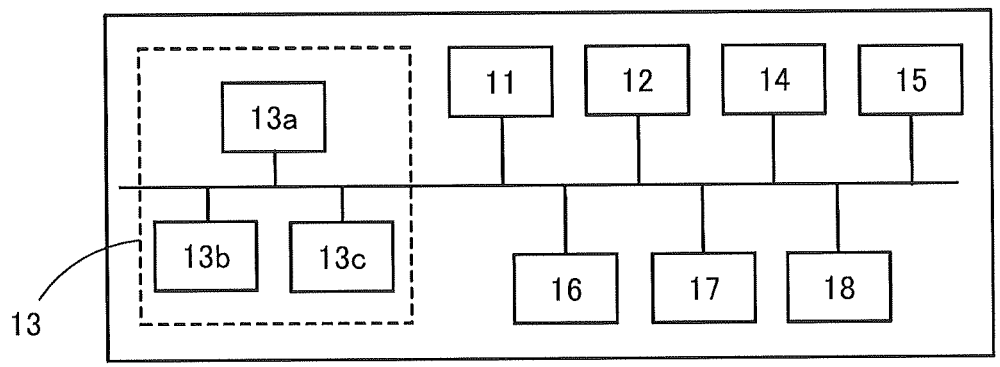
FIG. 1A is a block diagram illustrating an image detection module and FIG. 1B is a usage example.

FIG. 1(A) illustrates a block diagram of an image detection module 10. The image detection module 10 includes a processor 11, a memory device 12, a first neural network 13, a light-emitting element 14, a position sensor 15, a battery 16, a passive element 17, a communication module 18, a housing 10a, and a fixing unit 10c.

The first neural network 13 includes an imaging device 13a, an analog/digital converter circuit 13b, and a graphics processing unit (hereinafter, GPU) 13c. The light-emitting element 14 is preferably an LED (Light Emitting Diode), but may be any element capable of controlling light emission. For example, an OLED (Organic Light Emitting Diode), a QLED (Quantum-dot Light Emitting Diode), or the like may be used. The battery 16 is preferably capable of being charged by renewable energy (sunlight, vibration, or heat), wireless power feeding, or a DC power source.

Figure 1B:
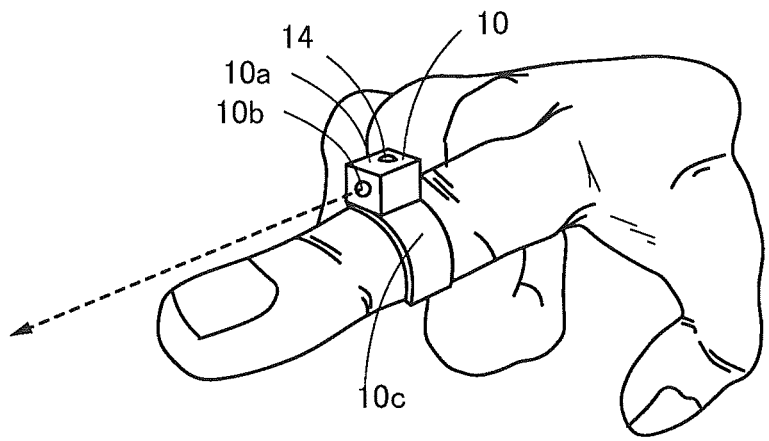

FIG. 1(B) illustrates an example in which the image detection module 10 is worn on a finger. The fixing unit 10c is used for fixing the housing 10a of the image detection module 10 to a finger, an arm, a head, or the like. As the fixing unit 10c, a resin, a metal, a cloth, or the like can be used. Furthermore, as a different wearing example, the fixing unit 10c may have a mechanism which allows it to be built in an edge portion such as a fingertip of a robot.

In FIG. 1(B), the housing 10a includes an opening portion 10b in the direction indicated by the finger. The opening direction of the opening portion 10b is preferably a direction in which the imaging device 13a obtains an image. It is known that in the case where the housing 10a is worn on a finger, for example, a fingertip indicates a target when the target is grabbed. Thus, the imaging device 13a can capture an image of the target in the direction indicated by the finger. In the image detection module 10, the light-emitting element 14 or the passive element 17 preferably has a notification function for a user. For the passive element 17, a vibration motor or the like can be used. Thus, the image detection module 10 can change the kind or method of notification in accordance with the detection target of the imaging device 13a.

The position sensor 15 can detect positional information at the time when the imaging device 13a captures an image of a target. The image detection module 10 can grasp positional information at the time when the imaging device 13a captures an image of a specified target. The image detection module 10 is preferably a small and highly portable housing and preferably operates with low power consumption.

However, the imaging device 13a constantly captures images of targets indicated by a fingertip and the processor 11 performs processing of detecting a specified target from the captured images, so that a large amount of power is used. Thus, the imaging device 13a preferably has not only an imaging function but also a function of detecting a target from a captured image easily.

By having a function of the imaging device 13a, the first neural network 13 can perform processing with simple switching between an imaging function and processing of detecting a specified target from a captured image in accordance with circumstances. The first neural network 13 can detect a learned target from a captured image easily, and thus the power consumption of the image detection module 10 can be reduced.

Figure 2A:
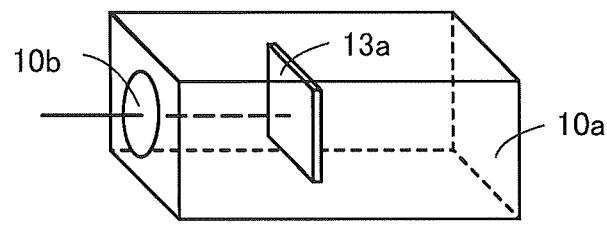
FIGS. 2A-2C are diagrams illustrating structures of an image detection module.

In FIG. 2, a structure of the image detection module 10 is described. FIG. 2(A) illustrates an example in which the imaging device 13a is placed in the housing 10a. A light-exposure surface of the imaging device 13a is placed so that light incident from the opening portion 10b is perpendicularly incident thereon. The imaging device 13a of FIG. 2(A) is preferably provided with a color filter. The imaging device 13a provided with a color filter can capture a full-color image. A detection target can be recognized precisely from a full-color image. When a detection target has features such as a small size or a thin width, a full-color image is preferable. For example, determination based on a full-color image is preferable in the case of a needle, a thread, or the like. Note that it is known that the image data of a full-color image is large. The power consumption of the image detection module 10 is increased when processed image data is large.

Figure 2B:
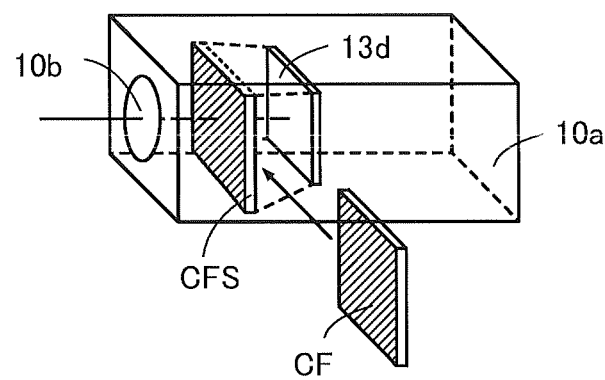

FIG. 2(B) is different from FIG. 2(A) in that an imaging device 13d can capture a gray-scale image. Furthermore, an insertion slot CFS into which a color filter CF can be inserted is preferably provided between the imaging device 13d and the opening portion 10b. The color filter CF to be inserted preferably has a color in accordance with the color of a detection target. The color filter CF of the color of a detection target can clarify the detection target. This allows the first neural network 13 to easily detect a detection target from image data. The color filter CF is not limited to being placed between the opening portion 10b and the imaging device 13d, and may be placed between a target and the opening portion 10b.

The merit of the capability of selecting any color filter CF is that color information to be detected can be set to the intermediate color or the like of a detection target unlike the imaging device 13a without being limited to three primary colors (RGB, CMY, or the like). Using combination of any color filter CF and the imaging device 13d, the first neural network 13 can easily recognize a target. Furthermore, a filter that transmits infrared rays may be used as the color filter CF. By detecting infrared rays, temperature, sugar content, or the like can be detected.

Figure 2C:
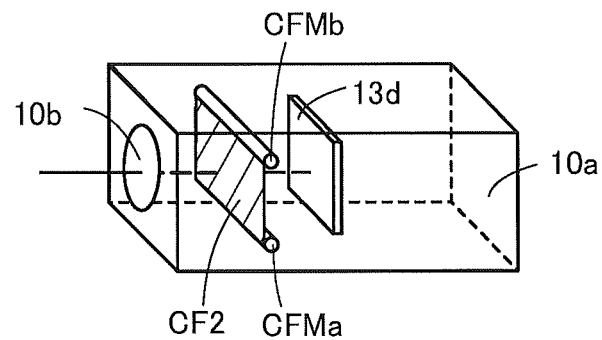

FIG. 2(C) is different from FIG. 2(B) in having a mechanism with which a color filter CF2 can be changed by a motor CFMa and a motor CFMb. In FIG. 2(C), the detection color of a desired target can be changed by the motor CFMa and the motor CFMb. Note that the mechanism for changing the color filter CF2 is not limited to the motor CFMa and the motor CFMb, and a shutter mechanism may also be used. Furthermore, in FIG. 2(C), it is preferable that the imaging device 13d can capture a gray-scale image.

In FIG. 3, the first neural network 13 is described. A typical structure of a neural network includes an input layer, an intermediate layer, and an output layer. The input layer, the intermediate layer, and the output layer are each called a perceptron. Each of the perceptrons has a plurality of neurons. Note that instead of the neurons, input data, detection data, or the like detected by a sensor may be included in the input layer.

The neurons can actualize the features of input data by providing a weight coefficient to the input data. The neurons can also identify the features by adding a plurality of pieces of input data to which a weight coefficient is added. The neurons determine ignition when the result of adding the plurality of pieces of input data to which a weight coefficient is added exceeds a learned determination threshold, and can output a certain value. The output certain value is preferably, but not limited to, digital "1". In the case where the maximum value is "1", a value less than or equal to 1 can also be output. Moreover, an offset may be added to an output value. The determination of ignition is facilitated by addition of the offset.

Figure 3A:
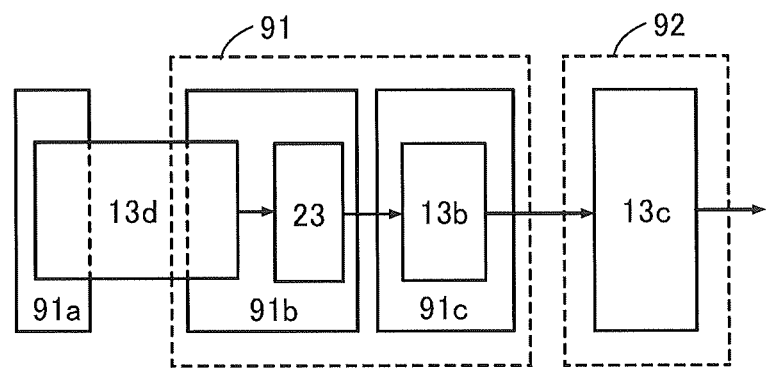
FIGS. 3A and 3B are block diagrams illustrating an image detection module.

FIG. 3(A) illustrates a block diagram of the first neural network 13. The first neural network 13 has functions of the above-described input layer and intermediate layer. An example in which the arithmetic operation of an output layer is performed by the GPU 13c is illustrated. Alternatively, the arithmetic operation of the output layer may be performed by the processor 11.

FIG. 3(A) illustrates an example in which the first neural network 13 includes a neuron 91. An input element 91a corresponds to an input layer, the neuron 91 corresponds to an intermediate layer, and the GPU 13c corresponds to an output layer. The neuron 91 includes a synapse circuit 91b and a sigmoid function circuit 91c. The synapse circuit 91b includes an adder circuit 23. The sigmoid function circuit 91c includes the analog/digital converter circuit 13b.

The synapse circuit 91b is supplied with input data from the input element 91a and has a multiplication function of adding a weight coefficient to the input data. In this embodiment, the input element 91a represents a photodiode included in a pixel of the imaging device 13d. For simplifying description, the imaging device 13d not including the color filter CF is used below. In the synapse circuit 91b, the multiplication results obtained by adding a weight coefficient to input data are added by the adder circuit 23. The addition result by the adder circuit 23 is supplied to the analog/digital converter circuit 13b. The output data of the analog/digital converter circuit 13b is supplied to the GPU 13c, whereby an image having learned features can be detected.

In other words, the first neural network 13 can function by sharing the circuit of the imaging device 13d. The imaging device 13d having a function of the first sensor network 13 will be described in detail with FIG. 4.

Figure 3B:
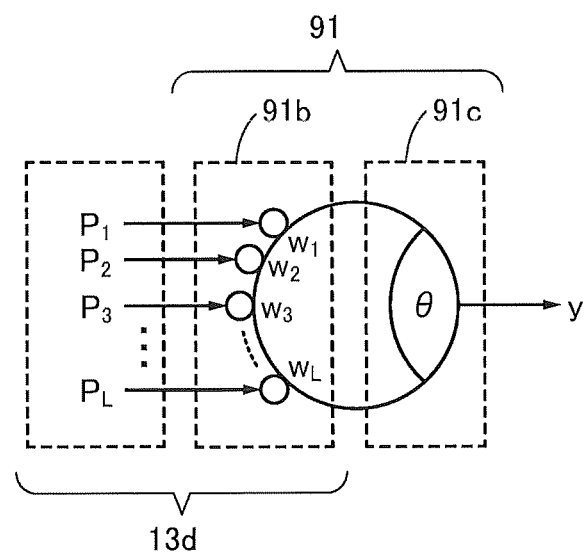

The neuron 91 is described in FIG. 3(B). Input data $P_1$ to $P_L$ of the input layer correspond to image data output from respective pixels of the imaging device 13d. The synapse circuit 91b can multiply the input data $P_1$ to $P_L$ by their respective weight coefficients $w_1$ to $w_L$. Furthermore, the synapse circuit 91b can add the respective multiplication results of the input data. The sigmoid function can determine whether the addition result ignites with a determination threshold θ. The determination result is supplied to the analog/digital converter circuit. It is preferable that digital "1" be output as the determination result, but an analog gray level may be output.

The neurons 91 whose number is equal to the number of the pixels included in the imaging device 13d are preferably included. Note that the number of necessary neurons 91 increases in proportion to an increase in the number of pixels in the imaging device 13d, increasing power consumption and the circuit area. Thus, the imaging device preferably does not include the color filter CF unlike the imaging device 13d. Furthermore, an example is described with FIG. 4 in which the imaging device 13d is divided into a plurality of areas and the neuron 91 performs processing on the divided area basis, so that power consumption is reduced.

Figure 4:
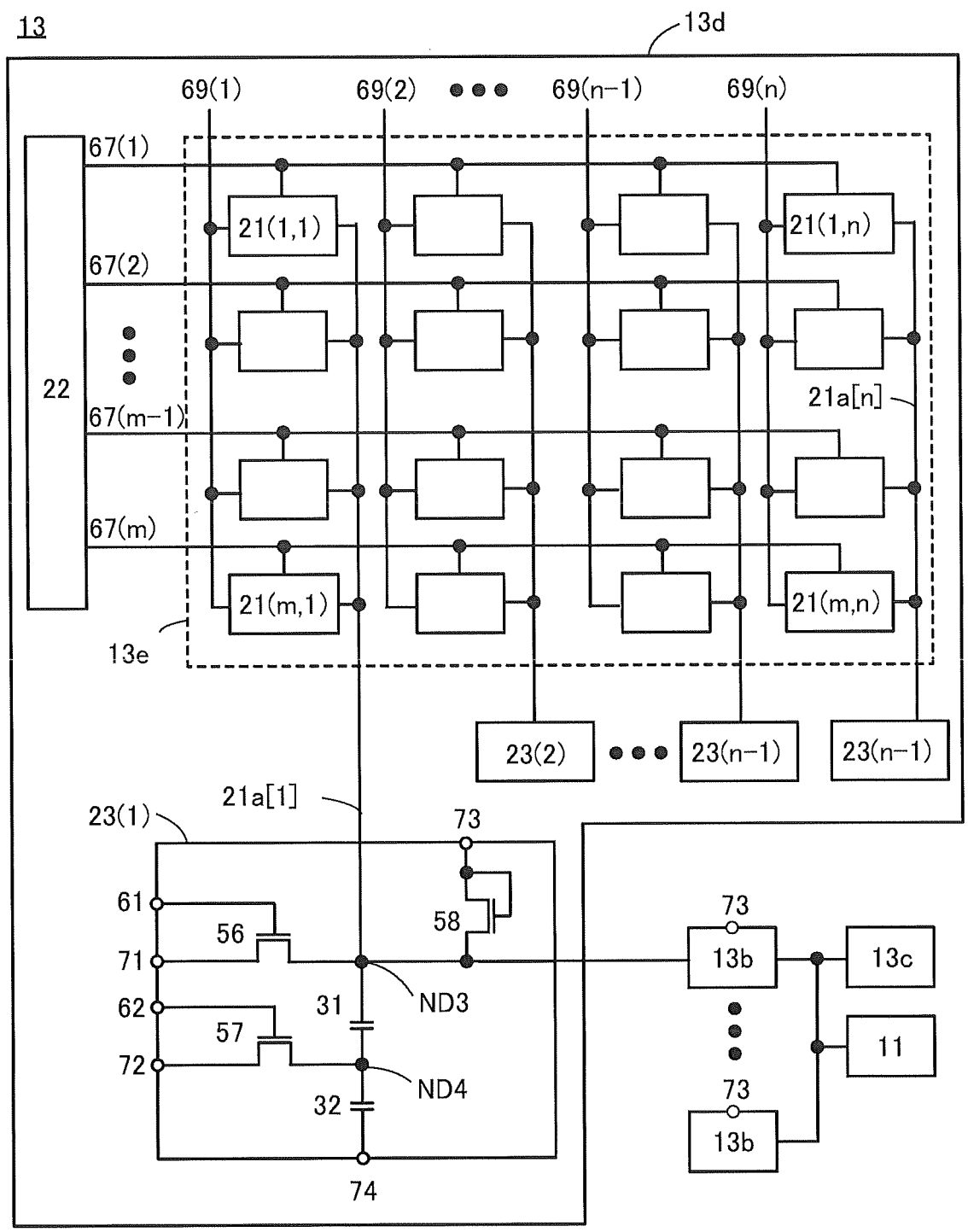
FIG. 4 is a block diagram illustrating an image detection module.

FIG. 4 illustrates a block diagram of the first neural network 13. The first neural network 13 includes the imaging device 13d, a plurality of adder circuits 23, a plurality of analog/digital converter circuits 13b, and the GPU 13c. The imaging device 13d includes a gate driver 22 and an imaging portion 13e. Note that the imaging device 13d corresponds to the imaging device 13a in FIG. 1. The imaging portion 13e includes m pixel circuits in the row direction (m is an integer greater than or equal to 1) and n pixel circuits in the column direction (n is an integer greater than or equal to 1), that is, m×n pixel circuits in total; a plurality of signal lines 67; a plurality of signal lines 69; and a plurality of wirings 21a. The adder circuit 23 includes a transistor 56, a transistor 57, a transistor 58, a capacitor 31, and a capacitor 32.

The gate driver 22 is electrically connected to the plurality of signal lines 67. The signal line 67 is electrically connected to the n pixels in the column direction. The signal line 69 is electrically connected to the m pixels in the row direction. The wiring 21a is electrically connected to the m pixels in the row direction.

The gate driver 22 supplies a scan signal to the signal line 67, and a pixel selected by the scan signal can output an output signal to the wiring 21a. The gate driver 22 preferably has a function of supplying a scan signal to one or more of signal lines 67 and a function of supplying scan signals to all of the plurality of signal lines 67. The signal line 69 can supply a first voltage to the pixels connected to the signal line 69.

A plurality of pixels connected to the wiring 21a are electrically connected to the analog/digital converter circuit 13b through the adder circuit 23. The plurality of analog/digital converter circuits 13b are electrically connected to the GPU 13c. Furthermore, the plurality of analog/digital converter circuits 13b are preferably electrically connected to the processor 11.

The wiring 21a is electrically connected to one electrode of the capacitor 31, one of a source and a drain of the transistor 56, and one of a source and a drain of the transistor 58. A gate of the transistor 56 is electrically connected to a signal line 61, and the other of the source and the drain of the transistor 56 is electrically connected to a wiring 71. The other electrode of the capacitor 31 is electrically connected to one electrode of the capacitor 32 and one of a source and a drain of the transistor 57. A gate of the transistor 57 is electrically connected to a signal line 62, and the other of the source and the drain of the transistor 57 is electrically connected to a wiring 72. The other electrode of the capacitor 32 is electrically connected to a wiring 74. A gate of the transistor 58 is electrically connected to the other of the source and the drain of the transistor 58 and a wiring 73.

A node ND3 is formed by connecting the wiring 21a, the one electrode of the capacitor 31, the one of the source and the drain of the transistor 56, the one of the source and the drain of the transistor 58, and the analog/digital converter circuit 13b. A node ND4 is formed by connecting the other electrode of the capacitor 31, the one electrode of the capacitor 32, and the one of the source and the drain of the transistor 57.

Figure 5A:
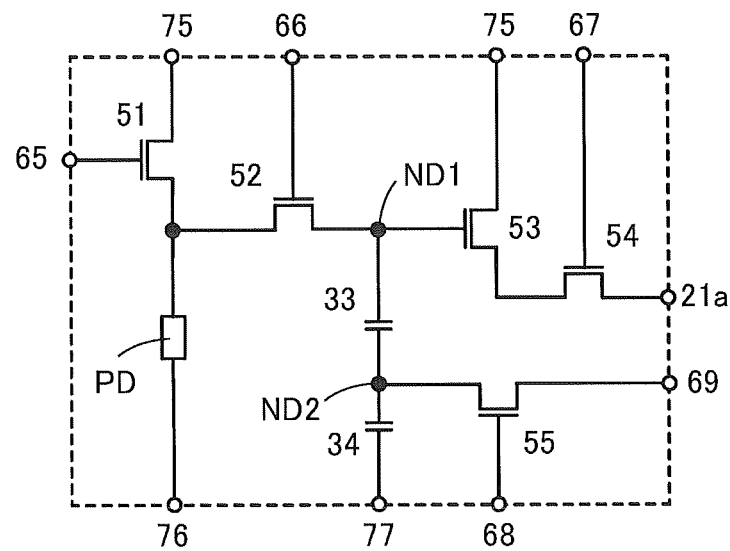
FIGS. 5A and 5B are circuit diagrams illustrating an image detection module.

Next, a pixel 21 is described. FIG. 5(A) illustrates a circuit diagram of the pixel 21. The pixel 21 includes a transistor 51, a transistor 52, a transistor 53, a transistor 54, a transistor 55, a capacitor 33, a capacitor 34, a photodiode PD, a signal line 65, a signal line 66, the signal line 67, a signal line 68, the signal line 69, a wiring 75, a wiring 76, and a wiring 77.

A gate of the transistor 51 is electrically connected to the signal line 65, and one of a source and a drain of the transistor 51 is electrically connected to the wiring 75. The other of the source and the drain of the transistor 51 is electrically connected to one of a source and a drain of the transistor 52 and one electrode of the photodiode PD, and the other electrode of the photodiode PD is electrically connected to the wiring 76.

A gate of the transistor 52 is electrically connected to the signal line 66, and the other of the source and the drain of the transistor 52 is electrically connected to a gate of the transistor 53 and one electrode of the capacitor 33.

One of a source and a drain of the transistor 53 is electrically connected to the wiring 75, and the other of the source and the drain of the transistor 53 is electrically connected to one of a source and a drain of the transistor 54.

A gate of the transistor 54 is electrically connected to the signal line 67, and the other of the source and the drain of the transistor 54 is electrically connected to the wiring 21a. The other electrode of the capacitor 33 is electrically connected to one electrode of the capacitor 34 and one of a source and a drain of the transistor 55.

A gate of the transistor 55 is electrically connected to the signal line 68, the other of the source and the drain of the transistor 55 is electrically connected to the signal line 69, and the other electrode of the capacitor 34 is electrically connected to the wiring 77.

A node ND1 is formed by connecting the other of the source and the drain of the transistor 52, the gate of the transistor 53, and the one electrode of the capacitor 33. A node ND2 is formed by connecting the other electrode of the capacitor 33, the one electrode of the capacitor 34, and the one of the source and the drain of the transistor 55.

The imaging device 13d preferably has a function of the neuron 91 and a function of an imaging element. The imaging device 13d having a function of the neuron 91 and a function of an imaging element can switch the functions in accordance with circumstances.

First, an operation method in which the imaging device 13d functions as an imaging element is described. FIG. 4 and FIG. 5 are used in the description.

The first voltage is supplied from the signal line 69 to the one electrode of the capacitor 34 of the pixel 21 through the transistor 55. The first voltage is supplied from the wiring 77 to the other electrode of the capacitor 34, whereby the capacitor 34 can become an electrode having the first voltage.

A first potential is supplied from the wiring 72 to the one electrode of the capacitor 32 of the adder circuit 23 through the transistor 57. The first voltage is supplied from the wiring 74 to the other electrode of the capacitor 32, whereby the capacitor 32 can become an electrode having the first voltage.

A signal supplied to the signal line 65 of the pixel 21 turns on the transistor 51, and a signal supplied to the signal line 66 turns on the transistor 52. Thus, the node ND1 can be updated by a reset voltage supplied to the wiring 75. As the reset voltage supplied to the wiring 75, a power supply voltage is preferably supplied. Furthermore, the reset voltage supplied to the wiring 75 is preferably supplied to the one of the source and the drain of the transistor 53.

When the signal supplied to the signal line 65 turns off the transistor 51, imaging data is updated at the node ND1 by a photocurrent flowing through the photodiode PD.

When the signal supplied to the signal line 66 turns off the transistor 52, the imaging data at the node ND1 is retained in the capacitor 33.

Thus, the imaging data is supplied to the gate of the transistor 53. The imaging data is converted into a first current by the transistor 53, and the first current is supplied to the wiring 21a through the transistor 54. The transistor 54 can control the output of the transistor 53 by a scan signal supplied to the signal line 67.

The first current is supplied to the capacitor 31 of the adder circuit 23 through the wiring 21a, and the capacitor 31 can convert the first current into a first output voltage and change the potential of the node ND3. Thus, the imaging data detected by the photodiode PD is supplied to the analog/digital converter circuit 13b as the first output voltage, and can be received by the processor 11 after being converted into digital data. This means that the function as an imaging element is achieved.

Next, an operation method in which the imaging device 13d functions as the neuron 91 is described. FIG. 4 and FIG. 5 are used in the description.

An offset potential is supplied from the wiring 71 to the node ND3 of the adder circuit 23 through the transistor 56. An offset potential is supplied from the wiring 72 to the node ND4 through the transistor 57, and the first voltage is supplied from the wiring 74 to the other electrode of the capacitor 32.

A signal supplied to the signal line 65 turns on the transistor 51, and a signal supplied to the signal line 66 turns on the transistor 52. The node ND1 is updated by a reset voltage supplied to the wiring 75 through the transistor 51.

The node ND2 is updated by the first voltage supplied to the signal line 69 through the transistor 55. Moreover, a second voltage is supplied from the wiring 77 to the other electrode of the capacitor 34 as a weight coefficient.

A signal supplied to the signal line 65 turns off the transistor 51, and a signal supplied to the signal line 68 turns off the transistor 55. At the node ND1, imaging data is updated by a photocurrent flowing through the photodiode PD.

When the signal supplied to the signal line 66 turns off the transistor 52, imaging data at the node ND1 is retained in the capacitor 33.

The wiring 77 is updated from the second voltage to the first voltage.

At the node ND1, a third voltage obtained by adding the second voltage to the imaging data can be generated by capacitive coupling between the capacitor 33 and the capacitor 34. Thus, the third voltage is supplied to the gate of the transistor 53. Therefore, the capacitive coupling between the capacitor 33 and the capacitor 34 has a multiplication function in accordance with a weight coefficient.

The gate driver 22 can supply a scan signal to one or more of signal lines 67 at the same time. The scan signal can control the fourth transistors 54 of the plurality of pixels. The imaging data of each pixel is converted into the first current by the transistor 53, and the first current is supplied to the wiring 21a through the transistor 54.

A second current obtained by adding the first currents output from the pixels 21 is generated in the wiring 21a illustrated in FIG. 4. The second current is supplied to the capacitor 31 of the adder circuit 23 through the wiring 21a. The capacitor 31 can convert the second current into a second output voltage using an offset potential as a reference and change the potential of the node ND3. The second output voltage is supplied to the analog/digital converter circuit 13b. Thus, the imaging device 13d can function as a neuron having a product-sum operation function.

Note that since a plurality of first currents are added to obtain the second current, a high voltage might be generated when the second current is converted into the second output voltage by the capacitor 31. Therefore, a diode is preferably connected to the wiring 21a in the adder circuit 23. The transistor 58 in FIG. 4 corresponds to the diode. The diode is not necessarily formed of a transistor, and a pn-junction diode may be used. A cathode of the diode is connected to the wiring 73, and an anode of the diode is connected to the wiring 21a. A determination voltage is supplied to the wiring 73.

When the second output voltage is higher than or equal to the determination voltage supplied to the wiring 73, the output of the diode is clipped to the determination voltage supplied to the wiring 73. This means that the diode has the same function as that of the sigmoid function described in FIG. 3(B). That is, it can be determined that the addition result ignites when the second output voltage (a product-sum operation result) is higher than the determination voltage (the determination value θ). Although an example in which the same determination voltage is supplied to the plurality of adder circuits 23 is illustrated in FIG. 4, the adder circuits 23 may have different determination voltages.

In the analog/digital converter circuit 13b, the determination voltage supplied to the wiring 73 is preferably set to the maximum voltage of an analog input voltage. When the second output voltage is the same as the determination voltage, the analog/digital converter circuit 13b detects the maximum value, so that the neuron can easily determine whether ignition is performed.

Next, a method in which the imaging device 13d functions as the neuron 91 and learns as the neural network 13 is described. FIG. 1, FIG. 4, and FIG. 5 are used in the description.

An operation in which the imaging device 13d functions as the neuron 91 and also learns from an image is described. The operation is different from other operations in that the image detection module 10 receives image data for learning through the communication module 18. The received image data is supplied from the processor 11 to the imaging device 13d, and thus can be learned by the imaging device 13d functioning as a neuron of the neural network 13. In the case where the neural network 13 performs detection of features and learning by the same imaging device 13d, learning operation including variation among elements or the like can be performed. Moreover, the neural network 13 performs extraction of features using imaging data, and can perform further learning. The description of the same operation as that when the imaging device 13d functions as the neuron 91 is omitted.

First, a reset voltage is supplied from the wiring 75 to the node ND1 through the transistor 51 and the transistor 52. A pixel data potential for learning is supplied from the signal line 69 to the second node ND2 through the transistor 55. The second voltage is supplied from the wiring 77 to the other electrode of the capacitor 34 as a weight coefficient.

Next, a signal supplied to the signal line 65 turns off the transistor 51, a signal supplied to the signal line 66 turns off the transistor 52, and a signal supplied to the signal line 68 turns off the transistor 55. In learning, imaging data from the photodiode PD is preferably interrupted. Thus, the transistor 52 is preferably a transistor with low off-state leakage. The transistor with low off-state leakage is described in detail in Embodiment 5.

The node ND1 retains the reset voltage. The wiring 77 is updated from the second voltage to the pixel data potential for learning. At the node ND1, a fourth voltage obtained by adding the reset voltage, the pixel data potential for learning, and the second voltage can be generated by capacitive coupling between the capacitor 33 and the capacitor 34. Thus, the image data for learning is supplied to the gate of the transistor 53. Note that the potential supplied to the wiring 77 may be an arbitrary potential.

By the fourth voltage supplied to the gate of the transistor 53, the imaging device 13d performs the product-sum operation of the neuron 91, and the neural network 13 can learn.

Although not displayed in FIG. 5, a switch may be provided between the wiring 77 and the other electrode of the capacitor 34. The provision of the switch is preferable for data retention at the capacitor 34 when a weight coefficient is supplied from the other electrode of the capacitor 34 in each of the pixels 21. The switch is preferably formed using a transistor.

Figure 5B:
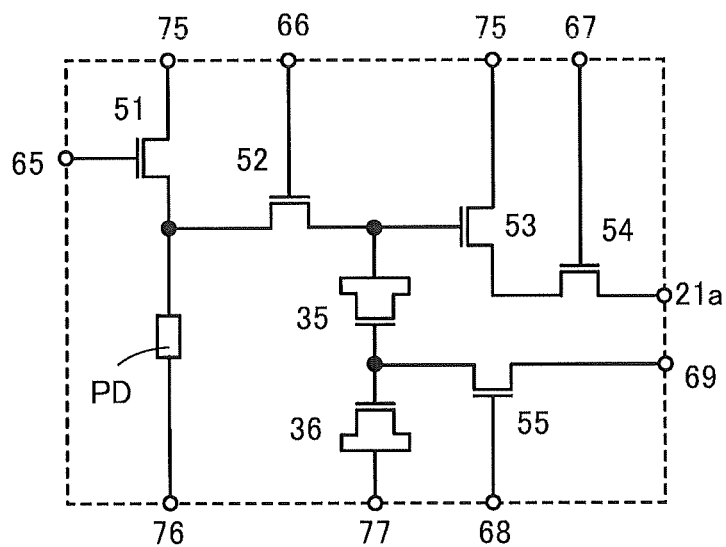

Note that FIG. 5(B) illustrates a configuration example in which a capacitor 35 and a capacitor 36 use the gate capacitance of the transistor. Moreover, the capacitor 31 and the capacitor 32 in FIG. 4 that have the same capacitance can facilitate the arithmetic operation by capacitive coupling. Furthermore, the capacitor 33 and the capacitor 34 in FIG. 5(A) that have the same capacitance can facilitate the operation by capacitive coupling.

Figure 6:
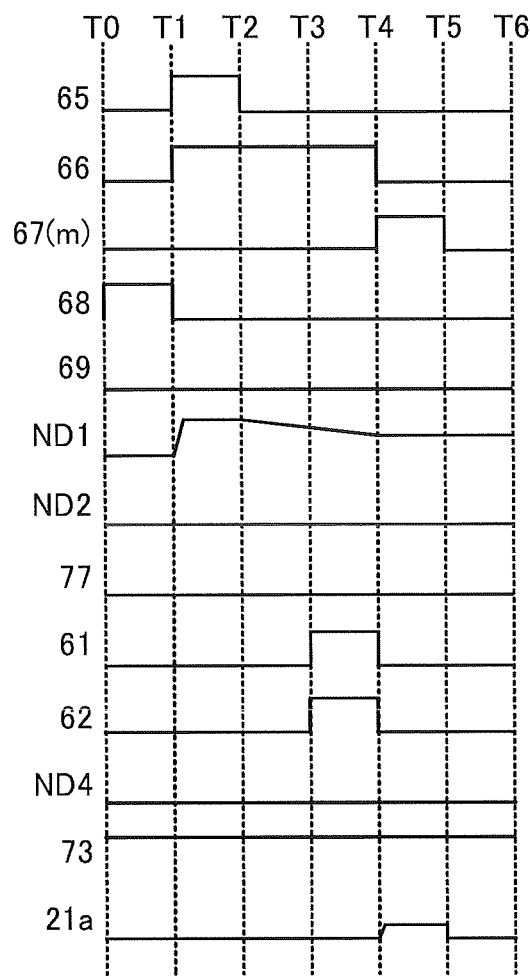
FIG. 6 is a timing chart illustrating an operation of an image detection module.

FIG. 6 illustrates an example of a timing chart in the case where the imaging device 13d of the image detection module 10 functions as an imaging element.

At T0, the signal line 68 is set at "H" and the transistor 55 is turned on. The first voltage is supplied from the signal line 69 to the node ND2. The first voltage is supplied to the wiring 77.

At T1, the signal line 65 is set at "H" and the transistor 51 is turned on. In addition, the signal line 66 is set at "H" and the transistor 52 is turned on. A reset voltage is supplied from the wiring 75 to the node ND1. The reset voltage is retained in the capacitor 33 as charge. The reset voltage is supplied to the gate of the transistor 53 at the node ND1. The reset voltage is preferably a high potential.

At T2, the signal line 65 is set at "L" and the transistor 51 is turned off. The charge retained in the capacitor 33 flows to the wiring 76 by a photocurrent generated by light detection of the photodiode PD. Thus, the updated potential of the node ND1 depends on the amount of the photocurrent.

At T3, the signal line 61 is set at "H" and the transistor 56 of the adder circuit 23 in FIG. 4 is turned on. The first voltage is supplied to the wiring 21a (the node ND3) by the wiring 71. Furthermore, the signal line 62 is set at "H" and the transistor 57 is turned on. The first voltage is supplied to the node ND4 by the wiring 72. The same first voltage is supplied to both of the electrodes of the capacitor 31, so that the capacitor 31 can be regarded as an electrode having the first voltage. The same first voltage as those of the node ND3 and the node ND4 is preferably being supplied to the wiring 74. Note that writing of the first voltage to the node ND3 and the node ND4 may be performed at any of T1 to T3 without limitation to T3.

At T4, the signal line 66 is set at "L" and the transistor 52 is turned off. A signal supplied to the signal line 66 can turn off the transistor 52. Thus, imaging data is retained at the node ND1. Thus, the imaging data is supplied to the gate of the transistor 53. The imaging data is converted into the first current by the transistor 53. Thus, the transistor 53 can make the first current corresponding to the imaging data retained at the node ND1 flow.

Furthermore, at T4, the signal line 67(m) is set at "H" and the transistor 54 is turned on. Therefore, the first current corresponding to the imaging data is supplied to the wiring 21a through the transistor 54. The current supplied to the wiring 21a is supplied to and retained in the capacitor 31. That is, the charge supplied to the capacitor 31 is retained at the node ND3. The charge supplied to the capacitor 31 is subjected to current-voltage conversion by the capacitor 31 and converted into digital data by the analog/digital converter circuit 13b. Thus, the imaging device 13d can function as an imaging element.

Figure 7:
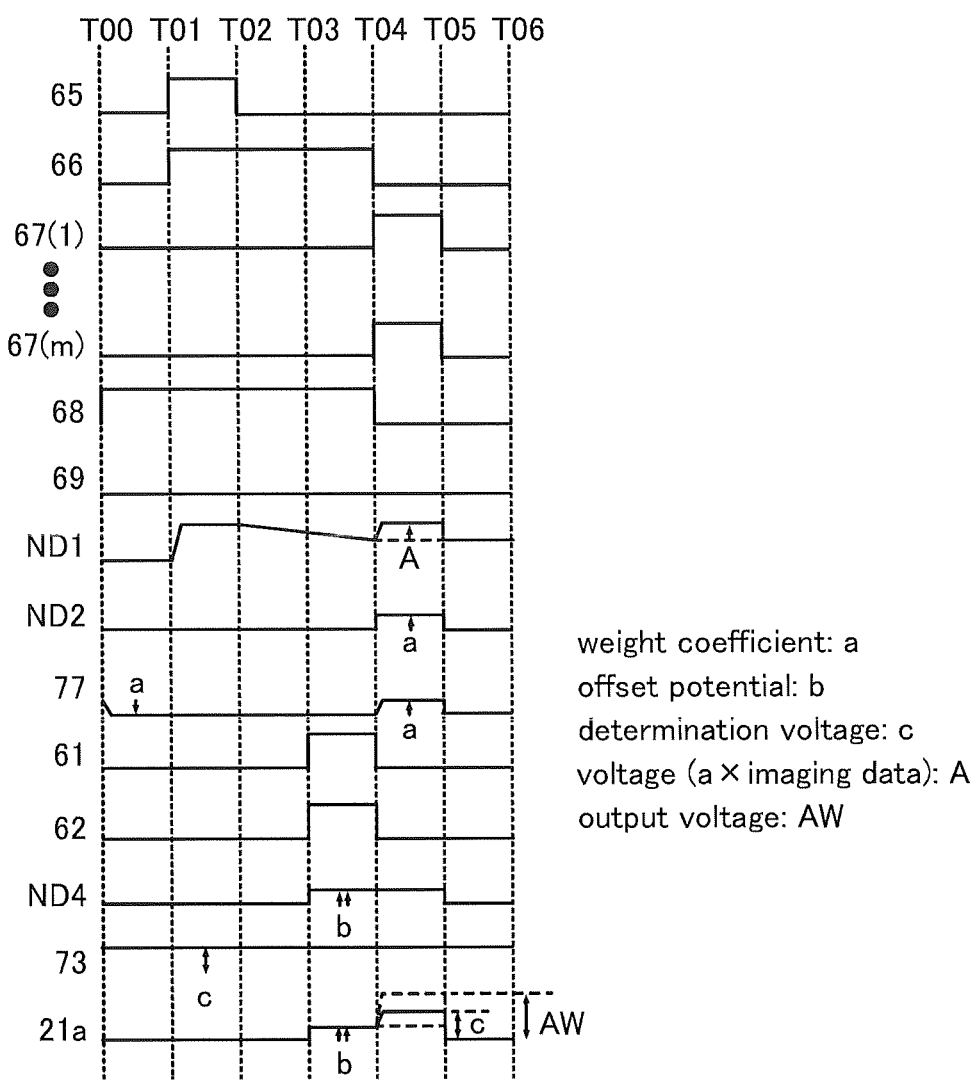
FIG. 7 is a timing chart illustrating an operation of an image detection module.

FIG. 7 illustrates an example of a timing chart in the case where the imaging device 13d of the image detection module 10 functions as a neuron.

At T00, the signal line 68 is set at "H" and the transistor 55 is turned on. The first voltage is supplied from the signal line 69 to the node ND2. The second voltage is supplied to the wiring 77 as a weight coefficient a. In addition, a determination voltage c is supplied to the wiring 73 as a clip voltage of an output signal of the adder circuit 23. Note that the determination voltage c has a function of a determination threshold of the sigmoid function.

At T01, the signal line 65 is set at "H" and the transistor 51 is turned on. In addition, the signal line 66 is set at "H" and the transistor 52 is turned on. A reset voltage is supplied from the wiring 75 to the node ND1. The charge of the reset voltage is retained in the capacitor 33. The reset voltage is supplied to the gate of the transistor 53 at the node ND1. The reset voltage is preferably a high potential.

At T02, the signal line 65 is set at "L" and the transistor 51 is turned off. The charge retained in the capacitor 33 flows to the wiring 76 by a photocurrent generated by light detection of the photodiode PD. Thus, the updated potential of the node ND1 depends on the amount of the photocurrent.

At T03, the signal line 61 is set at "H", the transistor 56 of the adder circuit 23 is turned on, the signal line 62 is also set at "H", and the transistor 57 of the adder circuit 23 is turned on. An offset potential b is supplied to the wiring 21a (the node ND3) by the wiring 71, and the offset potential b is supplied to the node ND4 by the wiring 72. The capacitor 31 can add currents supplied to the wirings 21a (the node ND3), and can add the offset potential b thereto through the capacitor 32. The first voltage is preferably being supplied to the wiring 74. Writing of the offset potential b to the node ND3 and the node ND4 may be performed at any of T01 to T03 and without limitation to T03.

At T04, the signal line 66 is set at "L" and the transistor 52 is turned off. A signal supplied to the signal line 66 can turn off the transistor 52. Thus, imaging data is retained at the node ND1. Thus, the imaging data is supplied to the gate of the transistor 53. The imaging data is converted into the first current by the transistor 53. Thus, the transistor 53 can make the first current corresponding to the imaging data retained at the node ND1 flow.

In addition, at T04, the transistor 55 is turned off, whereby the node ND2 becomes floating. Thus, the capacitor 33 is capacitively coupled with the capacitor 34. By updating the wiring 77 from the second voltage to the first voltage, the node ND1 generates a third voltage A (a×the imaging data) obtained by adding the voltage of the weight coefficient a to the imaging data. Therefore, when supplied with the third voltage A, the gate of the transistor 53 can output the multiplication result corresponding to a difference from the second voltage as the first current.

In addition, at T04, the signal lines 67(1) to 67(m) are set at "H" and the transistor 54 of each of the pixels 21 is turned on. In the case where the imaging device 13d functions as a neuron, scan signals are preferably supplied to the plurality of signal lines 67 at the same time. Outputs of the pixels 21 supplied with the scan signals are added by the adder circuit 23.

The second current obtained by adding the first currents output from the pixels is generated in the wiring 21a. The second current is supplied to the capacitor 31 of the adder circuit 23 through the wiring 21a. The capacitor 31 can convert the second current into a second output voltage AW ($\Sigma$(A)+b) using an offset potential as a reference and change the potential of the node ND3. The second output voltage AW is supplied to the analog/digital converter circuit 13b, whereby the imaging device 13d can function as a neuron having a product-sum operation function.

Note that since the first currents flowing through a plurality of pixels 21 are added to obtain the second current, a high voltage might be generated when the second current is converted into the second output voltage AW by the capacitor 31. Therefore, a diode is preferably connected to the wiring 21a in the adder circuit 23. Note that the second output voltage AW is preferably clipped to the determination voltage c by the diode. Thus, the product-sum operation result of the neuron 91 can be determined, so that the determination voltage c has a function of a determination threshold of the sigmoid function.

In FIG. 7, an example in which scan signals are supplied to the signal line 67(1) to the signal line 67(m) at the same time is illustrated. Thus, outputs of all the pixels 21 of the imaging device 13d are processed by the adder circuit 23(1) to the adder circuit 23(n) at the same time. That is, the pixel connected to the adder circuit 23 has a function of one of the neurons 91, which is the neuron 91 of a global shutter method in which imaging data is subjected to product-sum operation at the same time. Note that by changing the range of the signal lines 67 to which scan signals are supplied, the selected range to be subjected to product-sum operation can be changed. In other words, the neuron 91 can optimize an input range subjected to the operation.

Figure 8A:
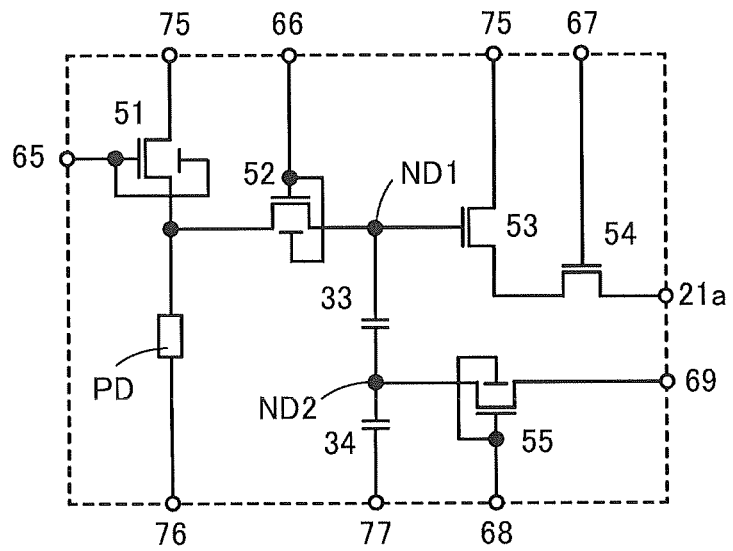
FIGS. 8A and 8B are circuit diagrams illustrating an image detection module.
Figure 8B:
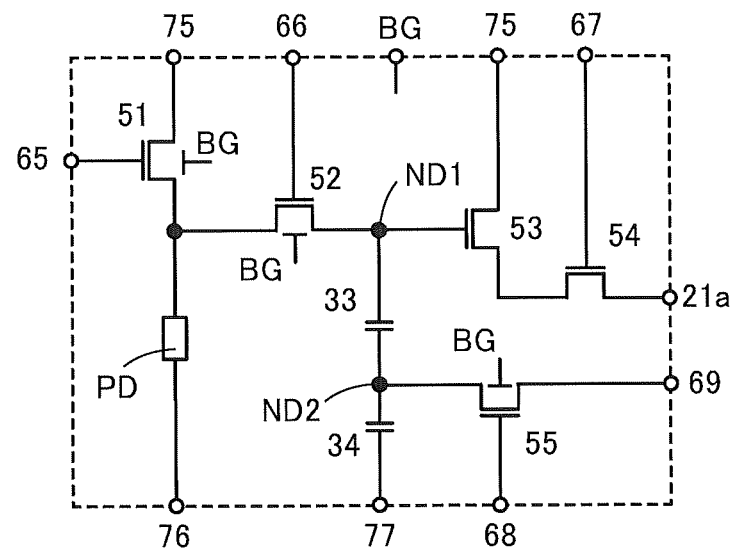

In particular, when a transistor including an oxide semiconductor (OS transistor) is used for each pixel, the off-state current of the OS transistor is extremely low. FIGS. 8(A) and 8(B) illustrate examples in which OS transistors are used.

FIG. 8(A) illustrates an example in which OS transistors are used as the transistor 51, the transistor 52, the transistor 54, and the transistor 55 of the pixel 21. Each of the OS transistors preferably has a back gate. FIG. 8(A) illustrates an example in which the back gates are electrically connected to gates of their respective OS transistors.

FIG. 8(B) illustrates an example in which the back gates of the OS transistor are connected to a common wiring BG.

The degradation of imaging data in the pixel 21 can be suppressed by reducing the off-state current of the transistor, so that the accuracy of detecting imaging data can be improved. Thus, an OS transistor is preferably used in the pixel 21. The OS transistor is described in detail in Embodiment 5.

The structures and methods described above in this embodiment can be implemented in combination as appropriate with the structures and methods described in the other embodiments.

Embodiment 2

In this embodiment, an information management system that includes a neural network is described with reference to FIG. 9 and FIG. 10.

Figure 9A:
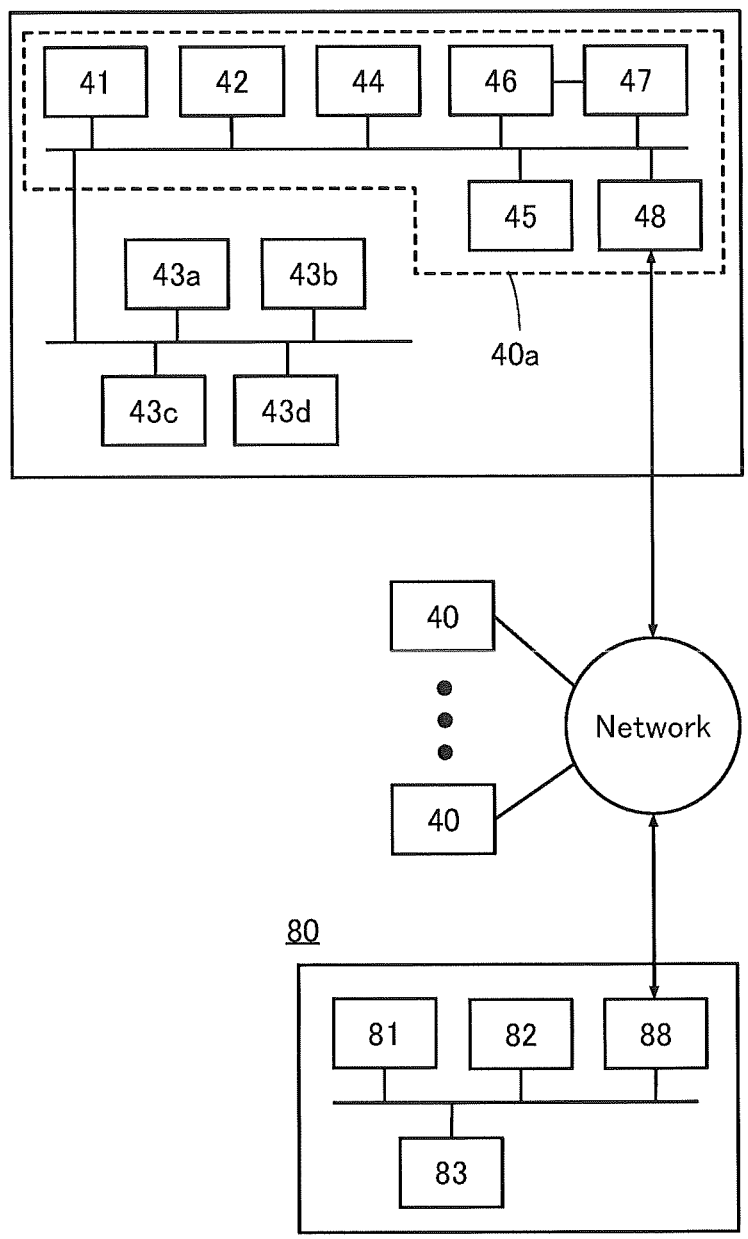
FIGS. 9A and 9B are block diagrams illustrating an information management system.

FIG. 9(A) illustrates a block diagram of the information management system including a neural network. The information management system includes a data server 80 and a plurality of environment monitor modules 40. The data server 80 includes a processor 81, a memory device 82, a neural network 83, and a communication module 88.

The environment monitor module 40 includes a control portion 40a and a plurality of environment sensor modules 43a to 43d. The control portion 40a includes a processor 41, a memory device 42, a light-emitting element 44, a position sensor 45, a battery 46, a second battery 47, and a communication module 48. The environment sensor modules 43a to 43d (described as the environment sensor module 43 in the case where the position is not limited) each include one or more of a temperature sensor, a humidity sensor, an illuminance sensor, and an air flow meter.

The second battery 47 has a function of an auxiliary battery, and preferably has a function of a solar battery that generates electric power from sunlight, temperature difference power generation that generates electric power from a temperature difference, wireless charging, or the like.

The environment sensor module 43 can detect environmental information with one or more of a temperature sensor, a humidity sensor, an illuminance sensor, and an air flow meter. The control portion 40a can manage the environmental information from the environment sensor module 43. In addition, the position sensor 45 includes first positional information of the environment monitor module 40. The processor 41 of the control portion 40a can transmit the environmental information and the first positional information to the data server 80 through the communication module 48.

The data server 80 can receive environmental information related to the first positional information from each of the environment monitor modules 40 through a network and store the environmental information in the memory device 82.

The neural network 83 can calculate environmental information between the environment sensor modules 43 by using the first positional information and the environmental information of each of the environment sensor modules 43.

Figure 9B:
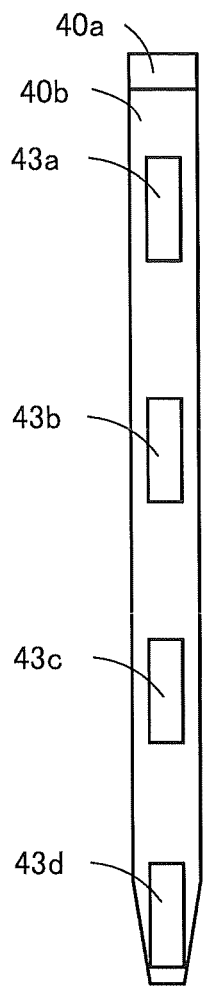

FIG. 9(B) illustrates a structure example of the environment monitor module 40. The environment monitor module 40 includes a housing 40b. The environment sensor modules 43a to 43d are placed in different positions of the housing 40b.

FIG. 9(B) illustrates an example in which the control portion 40a of the environment monitor module 40 is placed at an end portion. The control portion 40a is at least stored in the housing 40b, and the position where the control portion 40a is stored is not limited. Note that a position where the communication function of the communication module 48 is not interfered is preferable. Moreover, when the second battery has solar power generation, a position where sufficient light can be obtained is preferable. Although FIG. 9(B) illustrates an example in which the environment monitor module 40 is provided with the environment sensor modules 43a to 43d, the number of the environment sensor modules 43 is not limited.

Figure 10A:
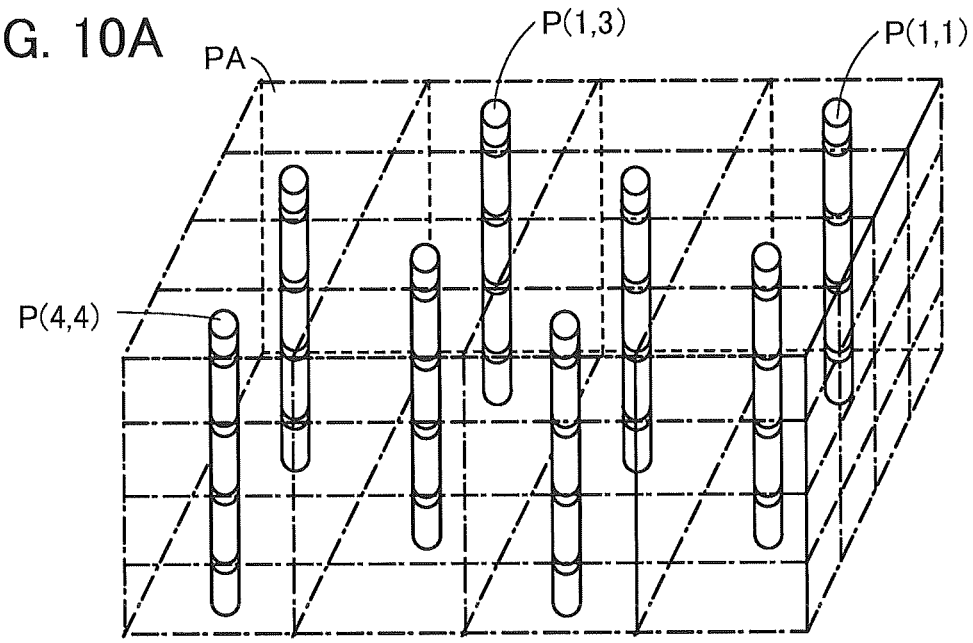
FIGS. 10A-10C are diagrams illustrating an information management system.

FIG. 10 is a perspective view illustrating an example in which the plurality of environment monitor modules 40 are placed in a space PA. In the space PA, environmental information in the space PA can be managed with the plurality of environment monitor modules 40 placed.

Figure 10B:
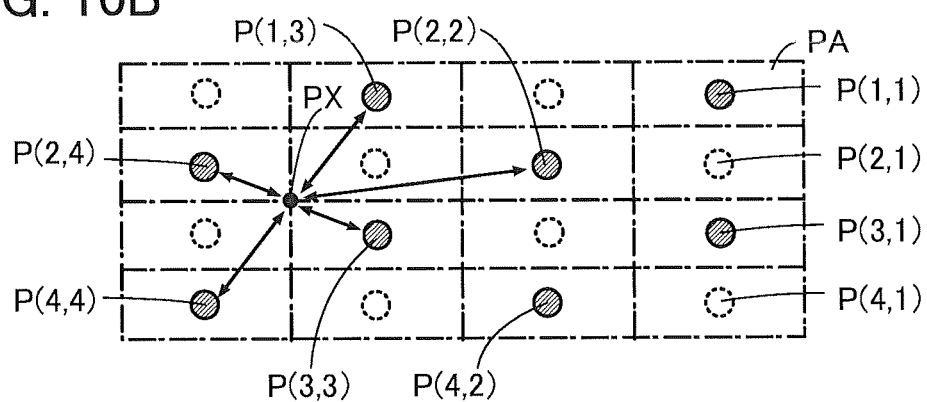

FIG. 10(B) is a top view illustrating an example in which the plurality of environment monitor modules 40 are placed in a staggered arrangement in the space PA. The environment monitor modules 40 are placed at P(1,1), P(1,3), P(2,2), P(2,4), P(3,1), P(3,3), P(4,2), and P(4,4) indicated by solid lines.

Figure 10C:
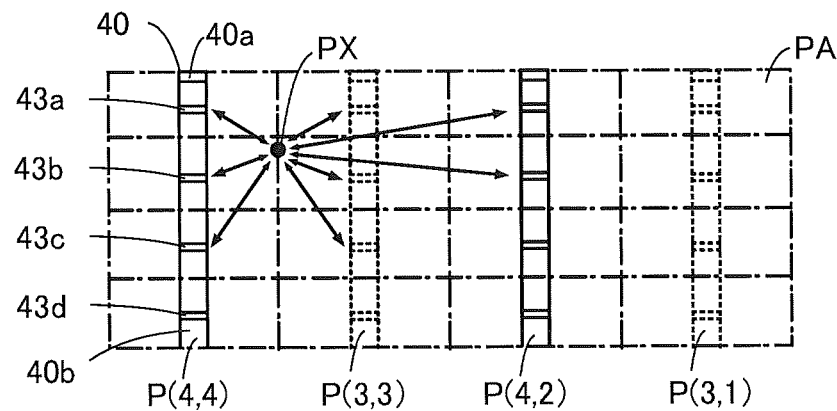

FIG. 10(C) is a side view illustrating an example in which the plurality of environment monitor modules 40 are placed in a staggered arrangement in the space PA. The environment sensor modules 43a to 43d are placed in four positions in the vertical direction, whereby the environmental information of a given position PX in the space PA can be compensated by calculation of the neural network 83. That is, the environmental information preferably includes the height information of each of the environment sensor modules.

Although the specific description is omitted, the environmental information of the given position PX in the space PA is preferably calculated from the first positional information and the environmental information of the environment sensor modules 43 placed at a plurality of positions. As an example, in FIG. 10(B) and FIG. 10(C), auxiliary lines are illustrated between the environment sensor modules 43 used for calculating the environmental information of the given position PX.

It is known that temperature information is not evenly distributed in a space but exists as layers, for example. Therefore, it is difficult to manage an interface between a high-temperature layer and a low-temperature layer only by linear interpolation of environmental information from the environment sensor module 43 by the first positional information. Calculation in which a weight coefficient is added to temperature information detected by the environment sensor module 43 is preferable. To calculate the environmental information of the given position PX in the space PA, it is preferable to perform calculation using the neural network 83.

The structure and method described above in this embodiment can be implemented in combination as appropriate with the structures and methods described in the other embodiments.

Embodiment 3

In this embodiment, an information management system including the neural network described in Embodiment 2, which operates in conjunction with the image detection module described in Embodiment 1, is described with reference to FIG. 11 to FIG. 12.

Figure 11A:
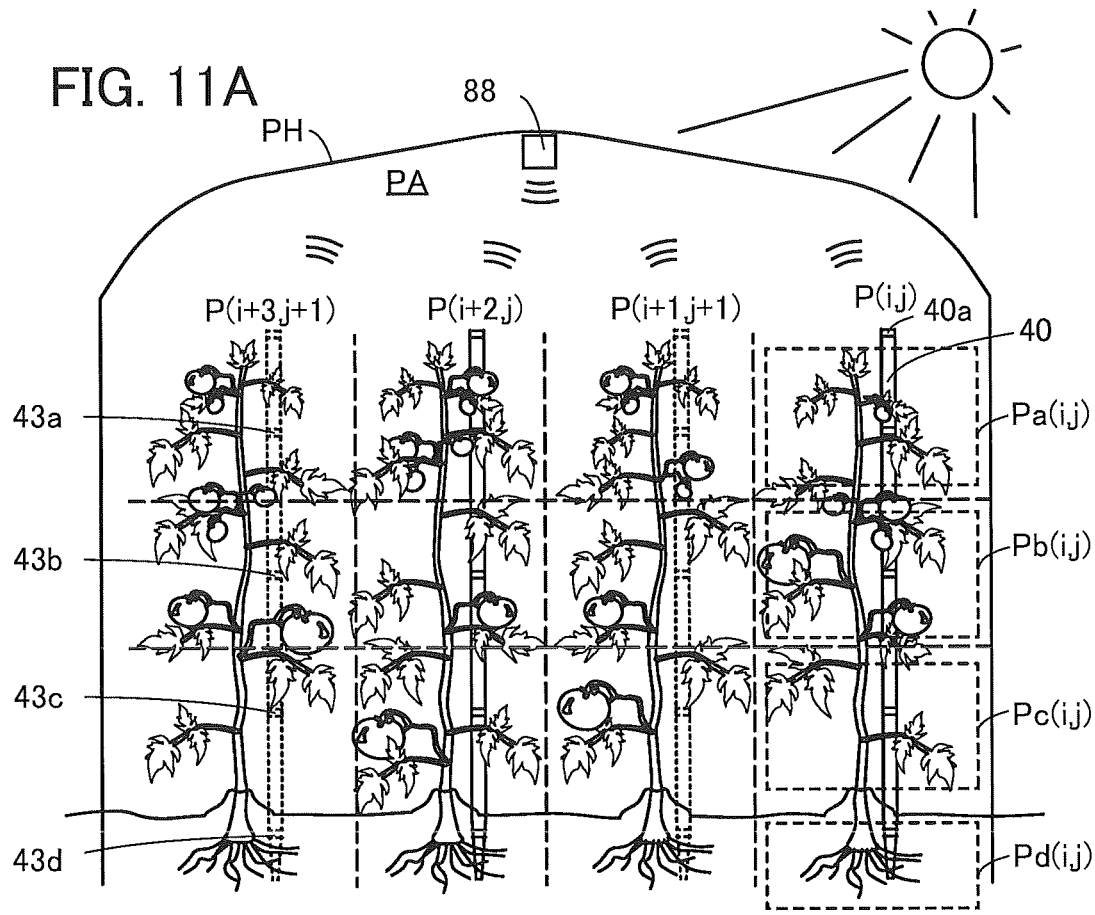
FIGS. 11A and 11B are diagrams illustrating an information management system.

FIG. 11 illustrates an example in which an information management system including a neural network is used in a plant factory. An example in which vegetables which are harvest targets are cultivated in a house PH in the plant factory is illustrated in FIG. 11(A). An example in which the space PA in the house PH is managed by an information management system is described. Note that the information management system can also be used in an open-air farm or the like without limitation to a closed space such as the house PH. Harvest targets can be vegetables, fruits, or the like. The information management system can also be used for cultivation of marine products, algae, and the like which require water temperature management.

It is known that the maturity degrees of fruits and vegetables are managed by accumulated temperature after pollination. In addition, moisture, the amount of sunlight, and the like are also important management parameters for the maturity degrees of fruits and vegetables. Thus, environmental information such as temperature, humidity, or illuminance changes depending on the position of the sun or obstacles such as leaves. It is also preferable to consider a change due to wind or flow of air. An environmental information difference affects a variation in the maturity degrees of vegetables and fruits and affects a variation in the qualities of products to be shipped.

The house PH is managed by the data server 80 and the plurality of environment monitor modules 40. The data server 80 includes the communication module 88 and the neural network 83. In FIG. 11, the communication module 88 of the data server 80 is displayed. Note that the data server 80 is at least connected through a network and is not displayed in the drawing.

The environment monitor module 40 includes the environment sensor modules 43a to 43d and the control portion 40a. The environment sensor module 43 includes one or more of a temperature sensor, a humidity sensor, an illuminance sensor, and an air flow meter. The environment sensor module 43 may further include an odor sensor, an ion sensor, a gas concentration sensor, or the like.

The communication module 88 has a function of collecting through a communication module environmental information and the first positional information detected by the environment sensor module 43 of the environment monitor module 40, and storing the information. In FIG. 11(A), as an example, the first positional information of the environment monitor module 40 is denoted by P(i,j), P(i+1,j+1), P(i+2,j), P(i+3,j+1), or the like.

Furthermore, the environment sensor modules 43 can be placed at positions with different heights and can collect environmental information. For example, in the environment monitor module 40 placed at P(i,j), the environment sensor module 43a can obtain environmental information of Pa(i,j), the environment sensor module 43b can obtain environmental information of Pb(i,j), the environment sensor module 43c can obtain environmental information of Pc(i,j), and the environment sensor module 43d can obtain environmental information of Pd(i,j). The control portion 40a can add height information to environmental information and transmit that information to the data server 80 with the first positional information of the environment monitor module 40.

In this case, any one of the environment sensor modules 43 may be in soil or in water. It is known that the temperature of soil or water where roots of a plant develop affects the growth of the plant, and thus is preferably managed. Detected environmental information such as soil temperature or water temperature is handled as an offset variable in the neural network 83.

The data server 80 can receive and store the first positional information and the environmental information of the environment monitor module 40 received through the communication module 88. The neural network 83 can calculate environmental information between the environment sensor modules by using the first positional information and the environmental information.

The accumulated temperature after pollination of a fruit or a vegetable is one of indicators for determining time appropriate for a harvest. Thus, a user can obtain information on whether the time is appropriate for a harvest by using the image detection module 10 described in Embodiment 1.

Figure 11B:
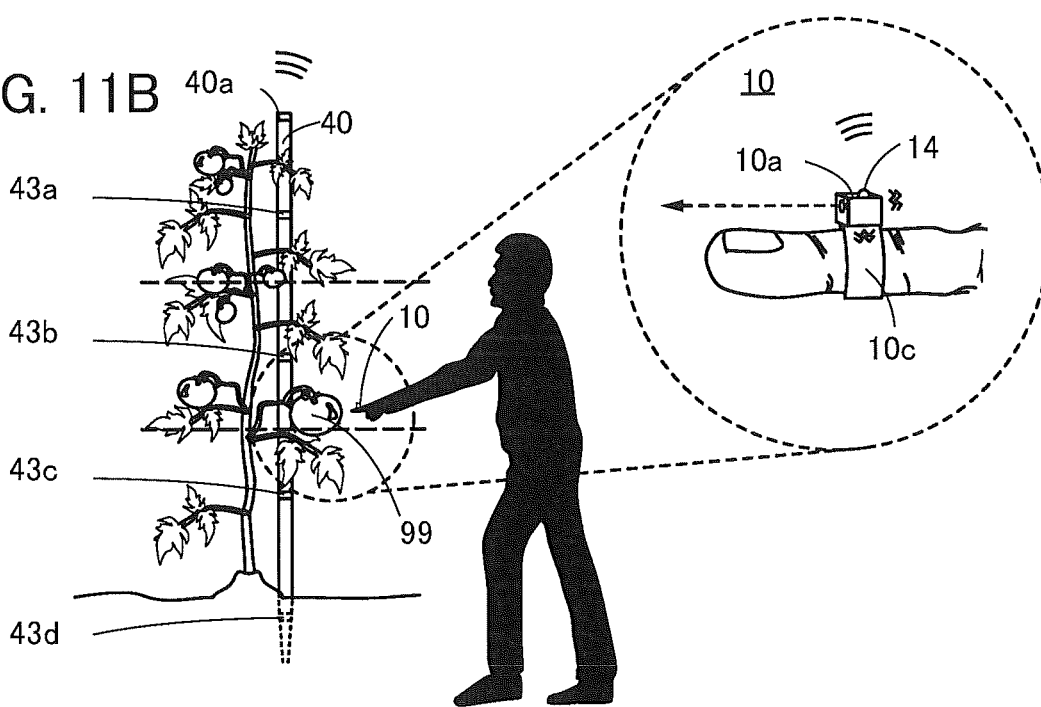

FIG. 11(B) illustrates an example in which a user wears the image detection module 10 described in Embodiment 1 on his/her finger. The image detection module 10 includes the housing 10a and the fixing unit 10c. Although not illustrated, the image detection module 10 includes the neural network 13, the communication module 18, the position sensor 15, the processor 11, the light-emitting element 14, and the passive element 17. The neural network 13 has a function of the imaging device 13d.

The imaging device 13d can obtain an image. An image to be obtained operates in accordance with the movement of the finger, and can capture an image in the direction where a fingertip points. The imaging device 13d preferably changes the setting of a color filter in accordance with a harvest target. For example, a tomato 99 is illustrated in FIG. 11(B) as a harvest target.

The neural network 13 using the color filter CF corresponding to the color of a harvest target can easily detect the harvest target having learned features from a captured image. The imaging device 13d can extract features at a time from imaging data. The processor 11 can transmit second positional information at the time when the harvest target is detected from the image by the neural network 13 to the data server 80 through the communication module 18.

The data server 80 can calculate an integrated value of the environmental information from the second positional information by the neural network 83. The processor 81 can transmit the integrated value of the environmental information of the second positional information to the image detection module 10 through the communication module 88.

The processor 11 can determine the maturity degree of a harvest target by the integrated value of the environmental information received through the communication module 18. The processor 11 operates the passive element 17 or turns on the light-emitting element 14 in accordance with the determination result, whereby a user can be notified whether it is a harvest time of a harvest target.

Furthermore, when a harvest target is managed by environmental information such as accumulated temperature, setting an initial value is important. The initial value is preferably set to the time of pollination, but it is difficult to manage the timing of pollination. Thus, the size, the color, and the positional information of the harvest target that has grown to a given size after pollination may be registered as the initial values. Alternatively, a drone or unmanned aircraft on which an image detection module is mounted may be made to patrol in a house and the size and the positional information at the time when the harvest target has grown to a given size may be registered as the initial values. Alternatively, the initial value may be set by a user.

Figure 12:
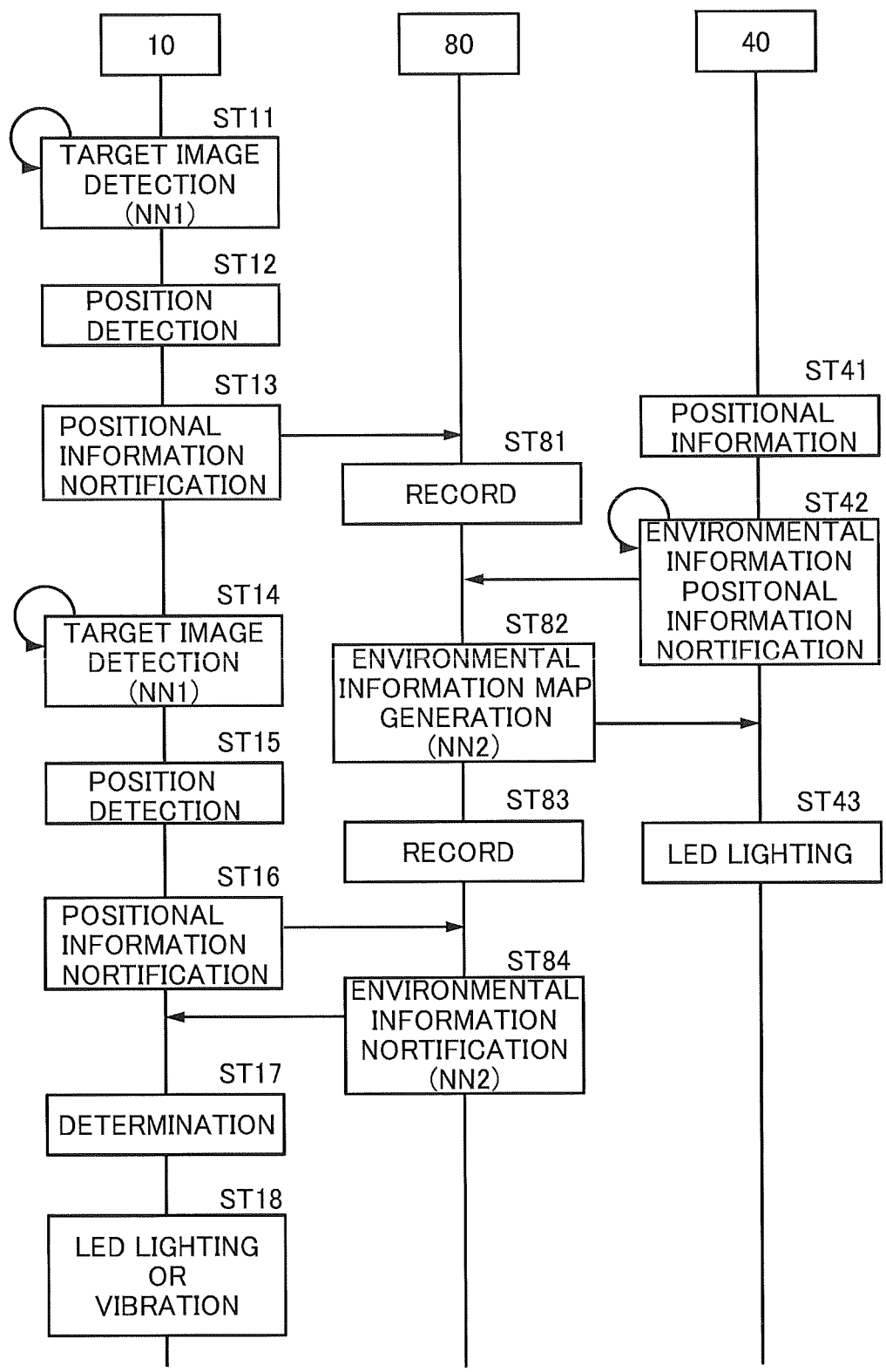
FIG. 12 is a flow chart illustrating the processing of an information management system.

FIG. 12 shows the operations of an environment management system and the image detection module 10 as a flow chart. The environment management system is divided into the data server 80 and the environment monitor module 40. The image detection module 10 includes a neural network NN1 and the data server 80 includes a neural network NN2.

ST11 is a step in which the image detection module 10 detects a target image by the neural network NN1. The target image is detected in order to register an initial value to be managed by the data server 80. The target image may be detected by a drone or unmanned aircraft that includes the image detection module 10.

ST12 is a step in which the second positional information of the target image detected by the image detection module 10 is detected.

ST13 is a step in which the detected second positional information is transmitted to the data server 80.

ST81 is a step in which the second positional information is registered in an environmental information map and an initial value of the second positional information is set. The initial value preferably manages a date and time.

ST41 is a step in which the environment monitor module 40 detects positional information.

ST42 is a step in which the environment monitor module 40 collects environmental information from the environment sensor module 43 periodically. The environment monitor module 40 can transmit the collected environmental information and the first positional information to the data server 80.

ST82 is a step in which the neural network NN2 of the data server 80 generates an environmental information map by using the environmental information and the first positional information received from the environment monitor module 40. When abnormality is detected in the environmental information map, the data server 80 can notify a user of the abnormality by a displayed image, an e-mail, or the like.

ST43 is a step in which the environment monitor module 40 receives information on abnormality from the data server 80. The environment monitor module 40 that has detected the abnormality can be alerted by turning on the light-emitting element 44, for example.

ST83 is a step in which the environmental information and the first positional information received from the environment monitor module 40 are recorded.

ST14 is a step in which the image detection module 10 detects the target image by the neural network NN1.

ST15 is a step in which the image detection module 10 detects the second positional information.

ST16 is a step in which the detected second positional information is transmitted to the data server 80.

ST84 is a step in which accumulated environmental information of the second positional information received from the image detection module 10 is generated by the neural network NN2 of the data server 80 and transmitted to the image detection module 10. Alternatively, the data server 80 may determine the accumulated environmental information until the second position and notify the image detection module 10 of the determination result.

ST17 is a step in which the state of a harvest target is determined by the accumulated environmental information received from the data server 80.

ST18 is a step in which a notification is performed by lighting of an LED or vibration of a vibration motor in accordance with the determination result. By receiving the notification, a user can recognize that the harvest target has a maturity degree enough for a harvest.

The structure and method described above in this embodiment can be implemented in combination as appropriate with the structures and methods described in the other embodiments.

Embodiment 4

In this embodiment, one mode of a semiconductor device included in the image detection module described in the above embodiments is described with reference to FIG. 13 and FIG. 14. Note that as a semiconductor device 100 described in this specification, for example, the processor 11, the memory device 12, the imaging device 13a, the analog/digital converter circuit 13b, the GPU 13c, the light-emitting element 14, the position sensor 15, the battery 16, the passive element 17, and the communication module 18 can be indicated.

<Cross-Sectional Structure of Semiconductor Device 100>

Figure 13:
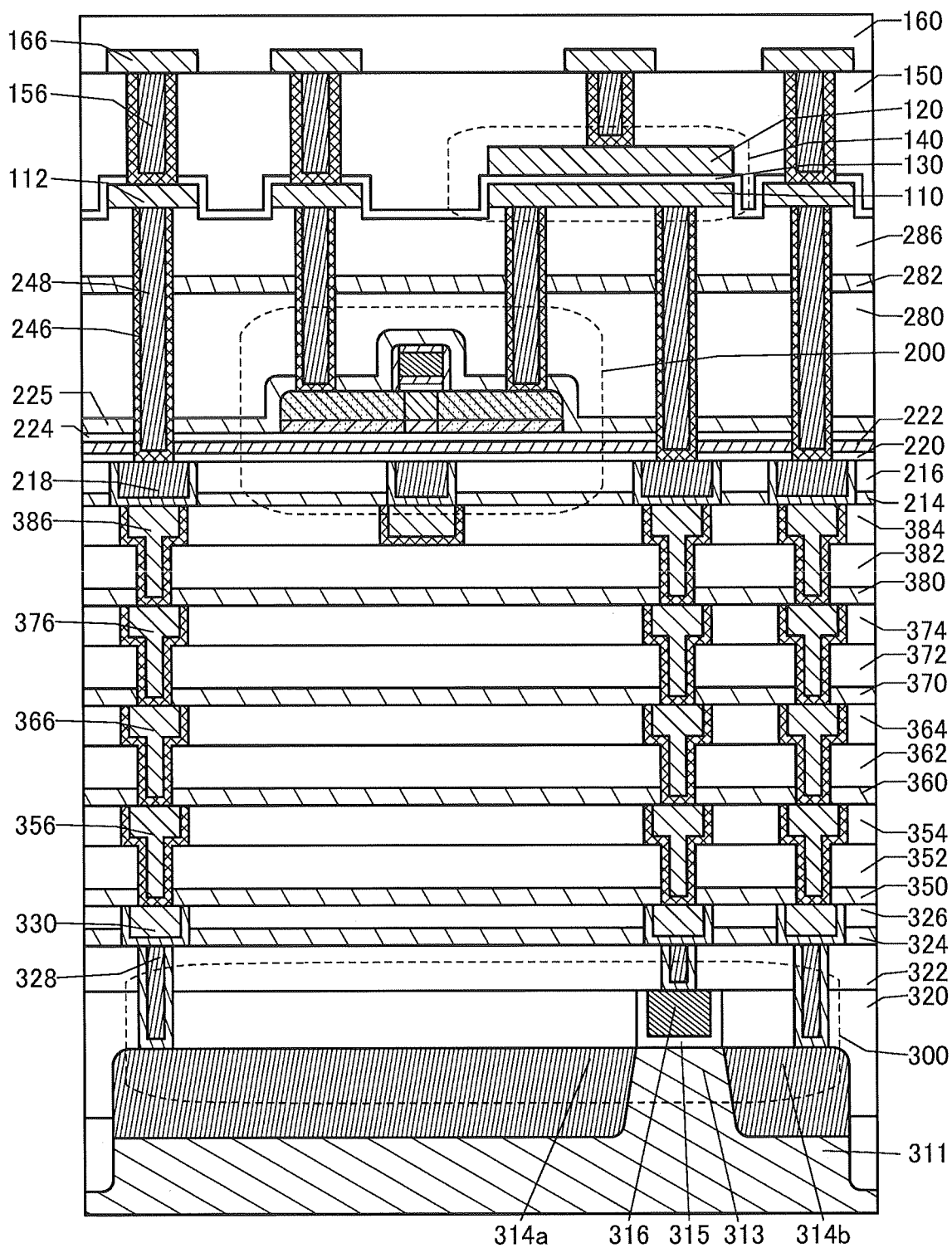
FIG. 13 is a cross-sectional view illustrating a structure example of a semiconductor device.

FIG. 13 is a cross-sectional view illustrating an example of the semiconductor device 100. The semiconductor device 100 includes a transistor 300, a transistor 200, and a capacitor 140. The transistor 200 is provided above the transistor 300, and the capacitor 140 is provided above the transistor 300 and the transistor 200.

The transistor 200 is an OS transistor including an oxide semiconductor in a channel formation region. Since the OS transistor can be formed with high yield even when miniaturized, the transistor 200 can be miniaturized. The use of such a transistor in a semiconductor device allows miniaturization or high integration of the semiconductor device. Since the off-state current of the OS transistor is small, a semiconductor device using it can retain stored contents for a long time. In other words, since refresh operation is not required or frequency of refresh operation is extremely low, the power consumption of the semiconductor device can be sufficiently reduced.

The transistor 300 is provided over a substrate 311 and includes a conductor 316, an insulator 315, a semiconductor region 313 that is part of the substrate 311, and a low-resistance region 314a and a low-resistance region 314b functioning as a source region and a drain region.

The transistor 300 is of either a p-channel type or an n-channel type.

A region of the semiconductor region 313 where a channel is formed, a region in the vicinity thereof, the low-resistance region 314a and the low-resistance region 314b functioning as the source region and the drain region, and the like preferably include a semiconductor such as a silicon-based semiconductor, and preferably include single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing may be used.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron; or a conductive material such as a metal material, an alloy material, or a metal oxide material can be used.

Note that the work function is determined by a material for the conductor, whereby the threshold voltage can be adjusted by changing the material for the conductor. Specifically, it is preferable to use a material such as titanium nitride or tantalum nitride for the conductor. Moreover, in order to ensure both conductivity and embeddability, it is preferable to use a stacked layer of metal materials such as tungsten and aluminum as the conductor, and it is particularly preferable to use tungsten in terms of heat resistance.

In the transistor 300 illustrated in FIG. 13, the semiconductor region 313 (part of the substrate 311) in which a channel is formed has a convex shape. Furthermore, the conductor 316 is provided to cover the side surfaces and the top surface of the semiconductor region 313 with the insulator 315 therebetween. Note that for the conductor 316, a material that adjusts the work function may be used. Such a transistor 300 is also referred to as a fin-type transistor because it utilizes a convex portion of the semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 13 is an example and the structure is not limited thereto; an appropriate transistor is used in accordance with a circuit configuration or a driving method.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride is used, for example.

Note that in this specification, silicon oxynitride refers to a material that contains oxygen at a higher proportion than nitrogen, and silicon nitride oxide refers to a material that contains nitrogen at a higher proportion than oxygen. Note that in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided thereunder. For example, the top surface of the insulator 322 may be planarized by planarization treatment using a chemical mechanical polishing (CMP) method or the like to improve planarity.

Furthermore, as the insulator 324, a film having a barrier property that prevents diffusion of hydrogen and impurities from the substrate 311, the transistor 300, or the like into a region where the transistor 200 is provided is preferably used.

As an example of the film having a barrier property against hydrogen, silicon nitride formed by a CVD method can be used. Here, diffusion of hydrogen into a semiconductor element including an oxide semiconductor, such as the transistor 200, degrades the characteristics of the semiconductor element in some cases. Thus, a film that inhibits the diffusion of hydrogen is preferably used between the transistor 200 and the transistor 300. The film that inhibits diffusion of hydrogen is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is smaller than or equal to $10\times10^{15}$ atoms/cm$^2$, preferably smaller than or equal to $5\times10^{15}$ atoms/cm$^2$ in TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. Furthermore, for example, the dielectric constant of the insulator 326 is preferably 0.7 times or less, further preferably 0.6 times or less the dielectric constant of the insulator 324. When a material with a low permittivity is used for an interlayer film, the parasitic capacitance generated between wirings can be reduced.

Moreover, a conductor 328, a conductor 330, and the like are embedded in the insulator 320, the insulator 322, the insulator 324, and the insulator 326. Note that the conductor 328 and the conductor 330 each have a function of a plug or a wiring. In addition, a plurality of conductors having a function of plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material for each of plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 13, an insulator 350, an insulator 352, an insulator 354, an insulator 360, an insulator 362, an insulator 364, an insulator 370, an insulator 372, an insulator 374, an insulator 380, an insulator 382, and an insulator 384 are stacked in this order. Furthermore, a conductor 356, a conductor 366, a conductor 376, and a conductor 386 are formed in these insulators. These conductors have a function of plugs or wirings. Note that these conductors can be provided using a material similar to those for the conductor 328 and the conductor 330.

Note that as the insulator 350, the insulator 360, the insulator 370, and the insulator 380, an insulator having a barrier property against hydrogen is preferably used, as with the insulator 324. Furthermore, the conductor 356, the conductor 366, the conductor 376, and the conductor 386 preferably include a conductor having a barrier property against hydrogen. For example, when focusing on the insulator 350 and the conductor 356, formation of the conductor 356 in an opening portion of the insulator 350 can inhibit the diffusion of hydrogen from the transistor 300 to the transistor 200. The same applies to the other insulators and conductors.

Note that as the conductor having a barrier property against hydrogen, tantalum nitride is preferably used, for example. Furthermore, by stacking tantalum nitride and tungsten, which has high conductivity, the diffusion of hydrogen from the transistor 300 can be inhibited while the conductivity as a wiring is kept.

An insulator 214 and an insulator 216 are stacked over the insulator 384. A substance having a barrier property against oxygen and hydrogen is preferably used for either the insulator 214 or the insulator 216.

As the insulator 214, for example, a film having a barrier property that prevents diffusion of hydrogen and impurities from the substrate 311 or a region where the transistor 300 is provided into the region where the transistor 200 is provided is preferably used. Thus, a material similar to that for the insulator 324 can be used.

As an example of the film having a barrier property against hydrogen, silicon nitride formed by a CVD method can be used. Here, diffusion of hydrogen into a semiconductor element including an oxide semiconductor, such as the transistor 200, degrades the characteristics of the semiconductor element in some cases. Thus, a film that inhibits the diffusion of hydrogen is preferably used between the transistor 200 and the transistor 300. The film that inhibits diffusion of hydrogen is specifically a film from which a small amount of hydrogen is released.

For the film having a barrier property against hydrogen in the insulator 214, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent entry of impurities such as hydrogen and moisture into the transistor 200 in a fabrication process and after the fabrication of the transistor. Furthermore, release of oxygen from the oxide included in the transistor 200 can be inhibited. Thus, aluminum oxide is suitably used as a protective film for the transistor 200.

For the insulator 216, for example, a material similar to that for the insulator 320 can be used. Furthermore, when a material with a relatively low permittivity is used for an interlayer film, the parasitic capacitance generated between wirings can be reduced. For example, a silicon oxide film or a silicon oxynitride film can be used as the insulator 216.

A conductor 218, a conductor (e.g., an electrode serving as a back gate) included in the transistor 200, and the like are embedded in the insulator 214 and the insulator 216. The conductor 218 can be provided using a material similar to those for the conductor 328 and the conductor 330.

The conductor 218 is preferably a conductor having a barrier property against oxygen, hydrogen, and water. With this structure, the transistor 300 can be separated from the transistor 200 by a layer having a barrier property against oxygen, hydrogen, and water, so that the diffusion of hydrogen from the transistor 300 into the transistor 200 can be inhibited.

The transistor 200 is provided above the insulator 216. Note that an OS transistor may be used as the transistor 200. The details of the transistor 200 will be described later in Embodiment 5.

An insulator 280 is provided above the transistor 200. In the insulator 280, an excess-oxygen region is preferably formed. In particular, in the case of using an oxide semiconductor in the transistor 200, when an insulator including an excess-oxygen region is provided for an interlayer film or the like in the vicinity of the transistor 200, oxygen vacancies in the oxide semiconductor included in the transistor 200 are reduced, whereby the reliability can be improved. The insulator 280 that covers the transistor 200 may function as a planarization film that covers an uneven shape thereunder. Note that the insulator 280 is provided in contact with an insulator 225 formed over the transistor 200.

As the insulator including an excess-oxygen region, specifically, an oxide material from which part of oxygen is released by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably in a range higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used.

An insulator 282 may be provided over the insulator 280. A substance having a barrier property against oxygen and hydrogen is preferably used for the insulator 282. Thus, for the insulator 282, a material similar to that for the insulator 214 can be used. For the insulator 282, a metal oxide such as aluminum oxide, hafnium oxide, or tantalum oxide is preferably used, for example. For example, when the insulator 282 is deposited by a sputtering method using plasma containing oxygen, oxygen can be added to the insulator 280 serving as a base layer of the insulator.

In particular, aluminum oxide has an excellent blocking effect that prevents the passage of both oxygen and impurities such as hydrogen and moisture which are factors of a change in electrical characteristics of the transistor. Accordingly, aluminum oxide can prevent entry of impurities such as hydrogen and moisture into the transistor 200 in a fabrication process and after the fabrication of the transistor. Furthermore, release of oxygen from the oxide included in the transistor 200 can be inhibited. Thus, aluminum oxide is suitably used as a protective film for the transistor 200.

An insulator 286 is provided over the insulator 282. For the insulator 286, for example, a material similar to that for the insulator 320 can be used. Furthermore, when a material with a relatively low permittivity is used for an interlayer film, the parasitic capacitance generated between wirings can be reduced. For example, a silicon oxide film or a silicon oxynitride film can be used as the insulator 286.

A conductor 246, a conductor 248, and the like are embedded in an insulator 220, an insulator 222, an insulator 224, the insulator 225, the insulator 280, the insulator 282, and the insulator 286.

The conductor 246 and the conductor 248 can be provided using a material similar to those for the conductor 328 and the conductor 330.

The capacitor 140 is provided above the transistor 200. The capacitor 140 includes a conductor 110, a conductor 120, and an insulator 130.

A conductor 112 may be provided over the conductor 246 and the conductor 248. Note that the conductor 112 and the conductor 110 can be formed at the same time.

For the conductor 112 and the conductor 110, a metal film containing an element selected from molybdenum, titanium, tantalum, tungsten, aluminum, copper, chromium, neodymium, and scandium; a metal nitride film containing any of the above-described elements as its component (a tantalum nitride film, a titanium nitride film, a molybdenum nitride film, or a tungsten nitride film); or the like can be used. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

The conductor 112 and the conductor 110 each having a single-layer structure are illustrated in FIG. 13; however, the structure is not limited thereto, and a stacked-layer structure of two or more layers may be employed. For example, between a conductor having a barrier property and a conductor having a high conductivity, a conductor which is highly adhesive to the conductor having a barrier property and the conductor having high conductivity may be formed.

In addition, as a dielectric of the capacitor 140, the insulator 130 is provided over the conductor 112 and the conductor 110. The insulator 130 can be provided to have a stacked layer or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, a material having high dielectric strength, such as silicon oxynitride, is preferably used for the insulator 130. With the structure, the dielectric strength of the capacitor 140 can be increased and the electrostatic breakdown of the capacitor 140 can be inhibited owing to the insulator 130.

Over the insulator 130, the conductor 120 is provided to overlap with the conductor 110. Note that for the conductor 120, a conductive material such as a metal material, an alloy material, or a metal oxide material can be used. It is preferable to use a high-melting-point material that has both heat resistance and conductivity, such as tungsten or molybdenum, and it is particularly preferable to use tungsten. Furthermore, in the case where the conductor 120 is formed concurrently with another component such as a conductor, Cu (copper), Al (aluminum), or the like, which is a low-resistance metal material, is used.

An insulator 150 is provided over the conductor 120 and the insulator 130. The insulator 150 can be provided using a material similar to that for the insulator 320. Furthermore, the insulator 150 may function as a planarization film that covers uneven shapes thereunder.

A conductor 156 is embedded in the insulator 150. Note that the conductor 156 can be provided using a material similar to those for the conductor 328 and the conductor 330.

In addition, a conductor 166 is provided over the conductor 156. Moreover, an insulator 160 is provided over the conductor 166 and the insulator 150. Furthermore, the insulator 160 may function as a planarization film that covers uneven shapes thereunder.

The above is the description of the structure example. With the use of this structure, a change in electrical characteristics can be reduced and reliability can be improved in a semiconductor device using an OS transistor. Alternatively, the power consumption of a semiconductor device using an OS transistor can be reduced. Alternatively, a semiconductor device using an OS transistor can be miniaturized or highly integrated. Alternatively, a miniaturized or highly integrated semiconductor device can be provided with high productivity.

<Modification Example of Semiconductor Device 100>

Figure 14:
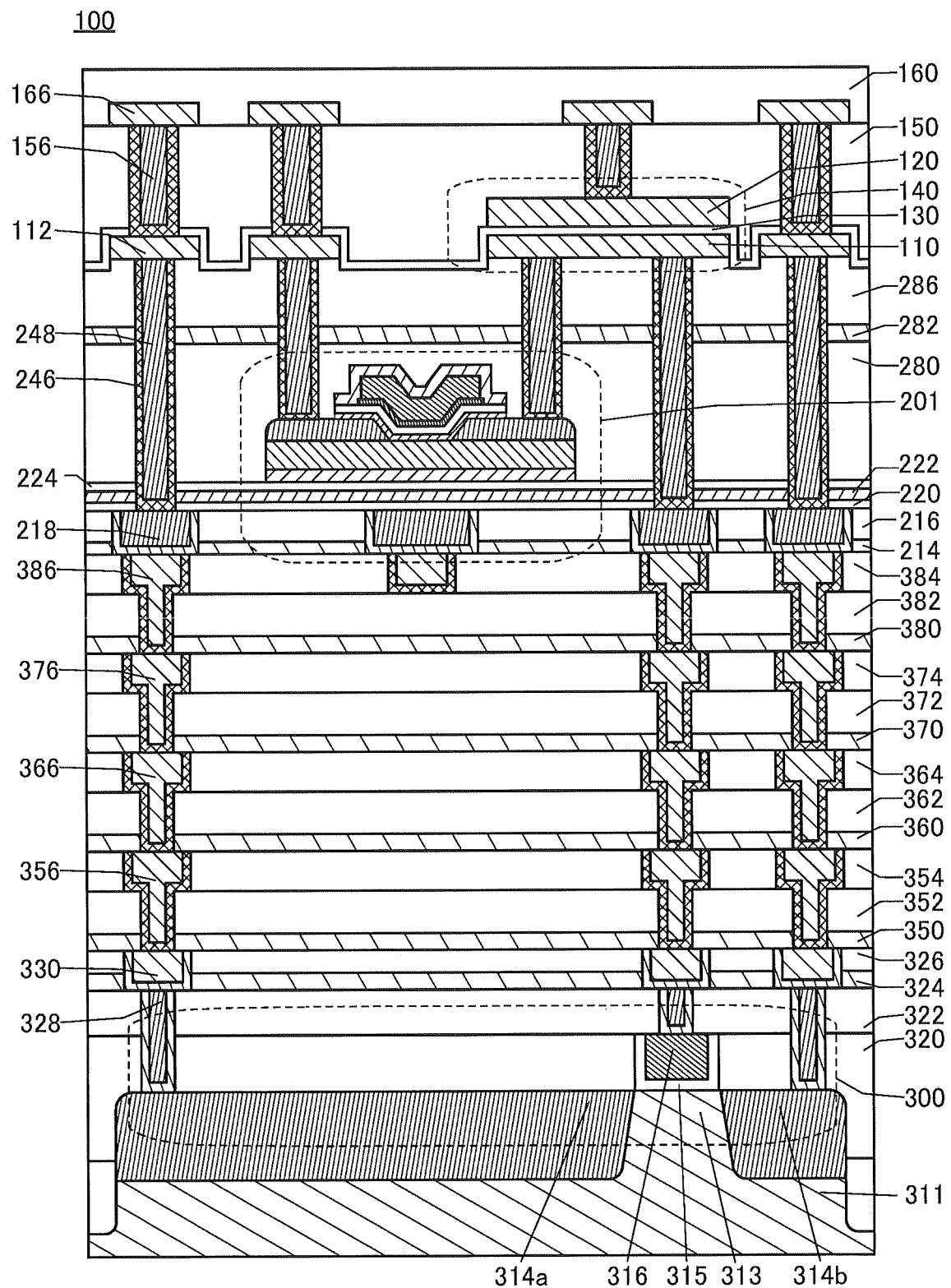
FIG. 14 is a cross-sectional view illustrating a structure example of a semiconductor device.

FIG. 14 illustrates a modification example of this embodiment.

FIG. 14 is a schematic cross-sectional view in which the transistor 200 in FIG. 13 is replaced with a transistor 201. Like the transistor 200, the transistor 201 is an OS transistor. Note that the details of the transistor 201 will be described in Embodiment 5.

For the details of the other components in FIG. 14, the description of FIG. 13 is referred to.

Note that this embodiment can be combined with other embodiments in this specification as appropriate.

Embodiment 5

In this embodiment, the details of the transistor 200 and the transistor 201 described in Embodiment 4 will be described with reference to FIG. 15 to FIG. 18.

<<Transistor 200>>

First, the details of the transistor 200 illustrated in FIG. 13 will be described.

FIG. 15(A) is a top view of a semiconductor device including the transistor 200. Moreover, FIG. 15(B) is a cross-sectional view of a portion indicated by a dashed-dotted line A1-A2 in FIG. 15(A), and is also a cross-sectional view of the transistor 200 in a channel length direction. Furthermore, FIG. 15(C) is a cross-sectional view of a portion indicated by a dashed-dotted line A3-A4 in FIG. 15(A), and is also a cross-sectional view of the transistor 200 in a channel width direction. In the top view of FIG. 15(A), some components are omitted for simplification of the drawing.

As illustrated in FIGS. 15(A) to 15(C), the transistor 200 includes the insulator 224 placed over a substrate (not illustrated), a metal oxide 406a placed over the insulator 224, a metal oxide 406b placed in contact with at least part of the top surface of the metal oxide 406a, an insulator 412 placed over the metal oxide 406b, a conductor 404a placed over the insulator 412, a conductor 404b placed over the conductor 404a, an insulator 419 placed over the conductor 404b, an insulator 418 placed in contact with the side surfaces of the insulator 412, the conductor 404a, the conductor 404b, and the insulator 419, and the insulator 225 placed in contact with the top surface of the metal oxide 406b and in contact with the side surface of the insulator 418. Here, as illustrated in FIG. 15(B), the top surface of the insulator 418 is preferably substantially aligned with the top surface of the insulator 419. Furthermore, the insulator 225 is preferably provided to cover the insulator 419, the conductor 404, the insulator 418, and the metal oxide 406.

In the following description, the metal oxide 406a and the metal oxide 406b are collectively denoted by the metal oxide 406 in some cases. Note that although the structure in which the metal oxide 406a and the metal oxide 406b are stacked in the transistor 200 is illustrated, the present invention is not limited thereto. For example, a structure in which only the metal oxide 406b is provided may be used. Furthermore, the conductor 404a and the conductor 404b are collectively denoted by the conductor 404 in some cases. Note that although the structure in which the conductor 404a and the conductor 404b are stacked in the transistor 200 is illustrated, the present invention is not limited thereto. For example, a structure in which only the conductor 404b is provided may be used.

In a conductor 440, a conductor 440a is formed in contact with an inner wall of an opening of the insulator 384 and a conductor 440b is formed on the inner side. Here, the top surfaces of the conductor 440a and the conductor 440b and the top surface of the insulator 384 can be substantially level with each other. Note that although the structure in which the conductor 440a and the conductor 440b are stacked in the transistor 200 is illustrated, the present invention is not limited thereto. For example, a structure in which only the conductor 440b is provided may be used.

A conductor 310 includes a conductor 310a and a conductor 310b. The conductor 310a is formed in contact with an inner wall of an opening of the insulator 214 and the insulator 216, and the conductor 310b is formed on the inner side. Thus, a structure in which the conductor 310a is in contact with the conductor 440b is preferable. Here, the top surfaces of the conductor 310a and the conductor 310b and the top surface of the insulator 216 can be substantially level with each other. Note that although the structure in which the conductor 310a and the conductor 310b are stacked in the transistor 200 is illustrated, the present invention is not limited thereto. For example, a structure in which only the conductor 310b is provided may be used.

The conductor 404 can function as a top gate, and the conductor 310 can function as a back gate. The potential of the back gate may be the same as that of the top gate, or may be the ground potential or an arbitrary potential. Moreover, by changing the potential of the back gate not in synchronization with but independently of that of the top gate, the threshold voltage of the transistor can be changed.

The conductor 440 extends in the channel width direction in a manner similar to that of the conductor 404, and functions as the conductor 310, that is, a wiring that applies potential to the back gate. Here, when the conductor 310 embedded in the insulator 214 and the insulator 216 is stacked over the conductor 440 functioning as the wiring for the back gate, the insulator 214, the insulator 216, and the like are provided between the conductor 440 and the conductor 404, reducing the parasitic capacitance between the conductor 440 and the conductor 404 and thereby increasing the withstand voltage. The reduction in the parasitic capacitance between the conductor 440 and the conductor 404 can improve the switching speed of the transistor, so that the transistor can have high frequency characteristics. Furthermore, the increase in the withstand voltage between the conductor 440 and the conductor 404 can improve the reliability of the transistor 200. Therefore, the thicknesses of the insulator 214 and the insulator 216 are preferably large. Note that the extending direction of the conductor 440 is not limited thereto; for example, the conductor 440 may extend in the channel length direction of the transistor 200.

Here, it is preferable to use conductive materials that have a function of inhibiting the passage of (that are relatively impermeable to) impurities such as water or hydrogen for the conductor 310a and the conductor 440a. For example, tantalum, tantalum nitride, ruthenium, ruthenium oxide, or the like is preferably used, and a single layer or a stacked layer is used. Owing to this, diffusion of impurities such as hydrogen or water from a lower layer into an upper layer through the conductor 440 and the conductor 310 can be inhibited. Note that it is preferable that the conductor 310a and the conductor 440a have a function of inhibiting the passage of at least one of impurities such as a hydrogen atom, a hydrogen molecule, a water molecule, an oxygen atom, an oxygen molecule, a nitrogen atom, a nitrogen molecule, a nitrogen oxide molecule ($N_2O$, NO, $NO_2$, and the like), and a copper atom and oxygen (for example, an oxygen atom and an oxygen molecule). Furthermore, the same applies to the case where a conductive material having a function of inhibiting the passage of impurities is described below. When the conductor 310a and the conductor 440a have a function of inhibiting the passage of oxygen, the conductivity of the conductor 310b and the conductor 440b can be prevented from being lowered because of oxidation.

Moreover, the conductor 310b preferably uses a conductive material containing tungsten, copper, or aluminum as its main component. In addition, although not illustrated, the conductor 310b may have a stacked-layer structure, and for example, may be a stack of titanium, titanium nitride, and the above-described conductive material.

Furthermore, since the conductor 440b serves as a wiring, a conductor having a higher conductivity than the conductor 310b is preferably used, and a conductive material containing copper or aluminum as its main component can be used, for example. In addition, although not illustrated, the conductor 440b may have a stacked-layer structure and for example, may be a stack of titanium, titanium nitride, and the above-described conductive material.

The insulator 214 can function as a barrier insulating film for preventing impurities such as water or hydrogen from entering the transistor from a lower layer. The insulator 214 preferably uses an insulating material having a function of inhibiting the passage of impurities such as water or hydrogen. For example, for the insulator 214, silicon nitride or the like is preferably used. Accordingly, diffusion of impurities such as hydrogen or water to a layer over the insulator 214 can be inhibited. Note that it is preferable that the insulator 214 have a function of inhibiting the passage of at least one of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Furthermore, the same applies to the case where an insulating material having a function of inhibiting the passage of impurities is described below.

Furthermore, the insulator 214 preferably uses an insulating material having a function of inhibiting the passage of oxygen (for example, an oxygen atom or an oxygen molecule). This can inhibit downward diffusion of oxygen contained in the insulator 224 or the like.

Furthermore, with the structure in which the conductor 310 is stacked over the conductor 440, the insulator 214 can be provided between the conductor 440 and the conductor 310. Here, even when a metal that is easily diffused, such as copper, is used as the conductor 440b, silicon nitride or the like provided as the insulator 214 can prevent diffusion of the metal to a layer over the insulator 214.

Moreover, for the insulator 222, an insulating material having a function of inhibiting the passage of oxygen and impurities such as water or hydrogen is preferably used, and for example, aluminum oxide or hafnium oxide is preferably used. Accordingly, diffusion of impurities such as water or hydrogen from a layer under the insulator 222 to a layer over the insulator 222 can be inhibited. Furthermore, downward diffusion of oxygen contained in the insulator 224 or the like can be inhibited.

Furthermore, the concentration of impurities such as water, hydrogen, or nitrogen oxide in the insulator 224 is preferably reduced. The released amount of hydrogen from the insulator 224 that is converted into the released amount of hydrogen molecules per unit area of the insulator 224 is lower than or equal to $2\times10^{15}$ molecules/$cm^2$, preferably lower than or equal to $1\times10^{15}$ molecules/$cm^2$, further preferably lower than or equal to $5\times10^{14}$ molecules/$cm^2$ in a thermal desorption spectroscopy analysis method (TDS) in a film-surface temperature range of 50° C. to 500° C., for example. Moreover, the insulator 224 is preferably formed using an insulator from which oxygen is released by heating.

The insulator 412 can function as a first gate insulating film, and the insulator 220, the insulator 222, and the insulator 224 can function as a second gate insulating film. Note that although the structure in which the insulator 220, the insulator 222, and the insulator 224 are stacked in the transistor 200 is illustrated, the present invention is not limited thereto. For example, a structure in which any two layers of the insulator 220, the insulator 222, and the insulator 224 are stacked may be used, or a structure in which any one layer of them is used may be used.

As the metal oxide 406, a metal oxide functioning as an oxide semiconductor is preferably used. As the metal oxide, a metal oxide having an energy gap of greater than or equal to 2 eV, preferably greater than or equal to 2.5 eV is preferably used. With the use of a metal oxide having such a wide energy gap, the off-state current of the transistor can be reduced.

A transistor using a metal oxide has an extremely low leakage current in a non-conduction state; thus, a semiconductor device with low power consumption can be provided. Moreover, a metal oxide can be deposited by a sputtering method or the like and thus can be used in a transistor included in a highly integrated semiconductor device.

The metal oxide 406 preferably contains at least indium or zinc. In particular, indium and zinc are preferably contained. In addition, aluminum, gallium, yttrium, tin, or the like is preferably contained. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, or the like may be contained.

Here, the case where the metal oxide 406 is an In-M-Zn oxide containing indium, an element M, and zinc is considered. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that a plurality of above elements may be combined as the element M in some cases.

Note that in this specification and the like, a metal oxide containing nitrogen is also called a metal oxide in some cases. Moreover, a metal oxide containing nitrogen may be called a metal oxynitride.

Here, the atomic ratio of the element M to constituent elements in the metal oxide used as the metal oxide 406a is preferably greater than the atomic ratio of the element M to constituent elements in the metal oxide used as the metal oxide 406b. Moreover, the atomic ratio of the element M to In in the metal oxide used as the metal oxide 406a is preferably greater than the atomic ratio of the element M to In in the metal oxide used as the metal oxide 406b. Furthermore, the atomic ratio of In to the element M in the metal oxide used as the metal oxide 406b is preferably greater than the atomic ratio of In to the element M in the metal oxide used as the metal oxide 406a.

It is preferable that by using the above metal oxide as the metal oxide 406a, the energy of the conduction band minimum of the metal oxide 406a be higher than the energy of the conduction band minimum of a region of the metal oxide 406b where the energy of the conduction band minimum is low. In other words, the electron affinity of the metal oxide 406a is preferably smaller than the electron affinity of the region of the metal oxide 406b where the energy of conduction band minimum is low.

Here, the energy level of the conduction band minimum gradually changes in the metal oxide 406a and the metal oxide 406b. In other words, it continuously changes or is continuously connected. To obtain such a structure, the density of defect states in a mixed layer formed at an interface between the metal oxide 406a and the metal oxide 406b is preferably made low.

Specifically, when the metal oxide 406a and the metal oxide 406b contain the same element (as a main component) in addition to oxygen, a mixed layer with a low density of defect states can be formed. For example, in the case where the metal oxide 406b is an In—Ga—Zn oxide, it is preferable to use an In-Ga—Zn oxide, a Ga—Zn oxide, gallium oxide, or the like as the metal oxide 406a.

In this case, a narrow-gap portion formed in the metal oxide 406b serves as a main carrier path. Since the density of defect states at the interface between the metal oxide 406a and the metal oxide 406b can be made low, the influence of interface scattering on carrier conduction is small, and high on-state current can be obtained.

Furthermore, the metal oxide 406 includes a region 426a, a region 426b, and a region 426c. The region 426a is interposed between the region 426b and the region 426c as illustrated in FIG. 15(B). The region 426b and the region 426c are regions having reduced resistance owing to the deposition of the insulator 225 and are regions having higher conductivity than the region 426a. An impurity element such as hydrogen or nitrogen included in the atmosphere for depositing the insulator 225 is added to the region 426b and the region 426c. Thus, owing to the added impurity element, oxygen vacancies are generated mainly in the regions of the metal oxide 406b that overlap with the insulator 225, and furthermore the impurity element enters the oxygen vacancies, which increases the carrier density and decreases the resistance.

Therefore, the region 426b and the region 426c preferably have a higher concentration of at least one of hydrogen and nitrogen than the region 426a. The concentration of hydrogen or nitrogen is measured by a secondary ion mass spectrometry method (SIMS) or the like. Here, the concentration of hydrogen or nitrogen in the middle of the region of the metal oxide 406b that overlaps with the insulator 412 (for example, a portion in the metal oxide 406b which is located equidistant from both side surfaces in the channel length direction of the insulator 412) is measured as the concentration of hydrogen or nitrogen in the region 426a.

Note that the resistance of the region 426b and the region 426c is reduced by addition of an element that generates oxygen vacancies or an element that is bonded to oxygen vacancies. Typical examples of the element include hydrogen, boron, carbon, nitrogen, fluorine, phosphorus, sulfur, chlorine, titanium, and rare gas. In addition, typical examples of the rare gas element include helium, neon, argon, krypton, and xenon. Thus, the region 426b and the region 426c have a structure in which one or more of the above-described elements are included.

Furthermore, it is preferable in the metal oxide 406a that the atomic ratio of In to the element M in the region 426b and the region 426c be substantially the same as the atomic ratio of In to the element M in the metal oxide 406b. In other words, in the metal oxide 406a, the atomic ratio of In to the element M in the region 426b and the region 426c is preferably larger than the atomic ratio of In to the element M in the region 426a. Here, when the indium content in the metal oxide 406 is increased, the carrier density is increased and the resistance can be decreased. With this structure, even when the thickness of the metal oxide 406b is small and electric resistance of the metal oxide 406b is high in the manufacturing process of the transistor 200, the region 426b and the region 426c in the metal oxide 406 can function as a source region and a drain region owing to the sufficiently reduced resistance of the metal oxide 406a in the region 426b and the region 426c.

Figure 16A:
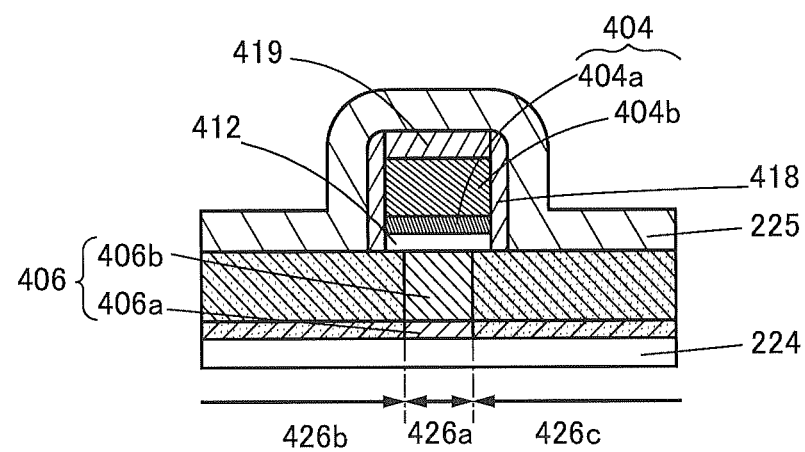
FIGS. 16A and 16B are cross-sectional views illustrating structure examples of a transistor.

An enlarged view of the vicinity of the region 426a illustrated in FIG. 15(B) is illustrated in FIG. 16(A). As illustrated in FIG. 16(A), the region 426b and the region 426c are formed in at least the regions overlapping with the insulator 225 in the metal oxide 406. Here, one of the region 426b and the region 426c in the metal oxide 406b can function as a source region, and the other can function as a drain region. Moreover, the region 426a in the metal oxide 406b can function as a channel formation region.

Note that although the region 426a, the region 426b, and the region 426c are formed in the metal oxide 406b and the metal oxide 406a in FIG. 15(B) and FIG. 16(A), it is acceptable as long as these regions are formed in the metal oxide 406b. Furthermore, although a boundary between the region 426a and the region 426b and a boundary between the region 426a and the region 426c are illustrated as being substantially perpendicular to the top surface of the metal oxide 406 in FIG. 15(B) and the like, this embodiment is not limited thereto. For example, in some cases, the region 426b and the region 426c project to the conductor 404 side in the vicinity of the surface of the metal oxide 406b and are recessed to the insulator 225 side in the vicinity of the bottom surface of the metal oxide 406a.

In the transistor 200, as illustrated in FIG. 16(A), the region 426b and the region 426c are formed in the regions where the metal oxide 406 is in contact with the insulator 225 and the regions overlapping with the vicinity of the both end portions of the insulator 418 and the insulator 412. In this case, portions of the region 426b and the region 426c which overlap with the conductor 404 function as what is called overlap regions (also referred to as Lov regions). Because a high-resistance region is not formed between the channel formation region and the source region or the drain region of the metal oxide 406 in the structure including the Lov region, the on-state current and the mobility of the transistor can be increased.

Figure 16B:
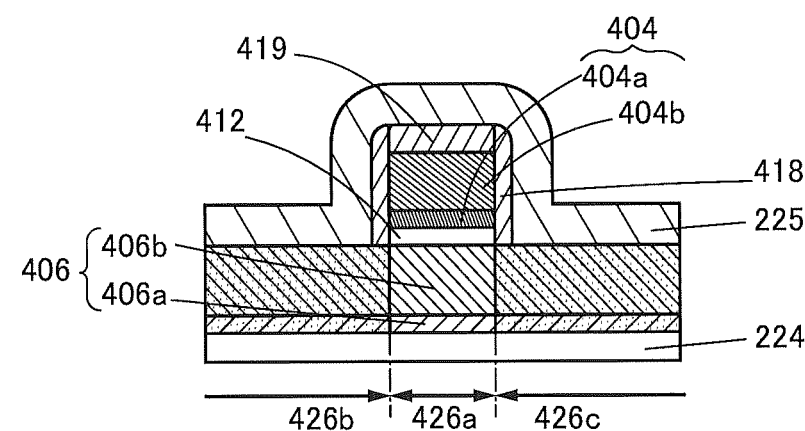

Note that the semiconductor device described in this embodiment is not limited thereto. For example, as illustrated in FIG. 16(B), a structure in which the region 426b and the region 426c are formed in regions where the metal oxide 406 overlaps with the insulator 225 and the insulator 418 may be used. Note that the structure illustrated in FIG. 16(B) can be rephrased as the structure in which the width of the conductor 404 in the channel length direction is substantially the same as the width of the region 426a. With the structure illustrated in FIG. 16(B), a high-resistance region is not formed between the channel formation region and the source region and the drain region, so that the on-state current of the transistor can be increased. Moreover, with the structure illustrated in FIG. 16(B), the gate does not overlap with the source region and the drain region in the channel length direction, so that formation of unnecessary capacitance can be inhibited.

Thus, by appropriately selecting the areas of the region 426b and the region 426c, a transistor having electric characteristics necessary for the circuit design can be easily provided.

The insulator 412 is preferably placed in contact with the top surface of the metal oxide 406b. The insulator 412 is preferably formed using an insulator from which oxygen is released by heating. When the insulator 412 is provided in contact with the top surface of the metal oxide 406b, oxygen can be supplied to the metal oxide 406b effectively. Furthermore, as in the insulator 224, the concentration of impurities such as water or hydrogen in the insulator 412 is preferably reduced. The thickness of the insulator 412 is preferably greater than or equal to 1 nm and less than or equal to 20 nm, and may be approximately 1 nm, for example.

The insulator 412 preferably contains oxygen. For example, the released amount of oxygen molecules that is converted into the released amount of oxygen molecules per unit area of the insulator 412 is higher than or equal to $1 \times 10^{14}$ molecules/cm$^2$, preferably higher than or equal to $2 \times 10^{14}$ molecules/cm$^2$, further preferably higher than or equal to $4 \times 10^{14}$ molecules/cm$^2$ in a thermal desorption spectroscopy analysis method (TDS analysis) in the range of a surface temperature of higher than or equal to 100° C. and lower than or equal to 700° C. or higher than or equal to 100° C. and lower than or equal to 500° C.

The insulator 412, the conductor 404, and the insulator 419 each include a region overlapping with the metal oxide 406b. In addition, side surfaces of the insulator 412, the conductor 404a, the conductor 404b, and the insulator 419 are preferably substantially aligned with each other.

As the conductor 404a, a conductive oxide is preferably used. For example, the metal oxide that can be used as the metal oxide 406a or the metal oxide 406b can be used. In particular, an In—Ga—Zn-based oxide with a metal atomic ratio of [In]:[Ga]:[Zn]=4:2:3 to 4:1 and a value in the vicinity thereof, which has high conductivity, is preferably used. When the above conductor 404a is provided, the passage of oxygen into the conductor 404b can be inhibited, and an increase in the electric resistance value of the conductor 404b due to oxidation can be prevented.

Moreover, when such a conductive oxide is deposited by a sputtering method, oxygen can be added to the insulator 412, so that oxygen can be supplied to the metal oxide 406b. Thus, oxygen vacancies in the region 426a of the metal oxide 406 can be reduced.

For the conductor 404b, a metal such as tungsten can be used, for example. Alternatively, as the conductor 404b, a conductor that can add impurities such as nitrogen to the conductor 404a to improve the conductivity of the conductor 404a may be used. For example, titanium nitride or the like is preferably used for the conductor 404b. Furthermore, the conductor 404b may have a structure in which a metal such as tungsten is stacked over a metal nitride such as titanium nitride.

Here, the conductor 404 having a function of a gate electrode is provided to cover the top surface in the vicinity of the region 426a and the side surface, which is in the channel width direction, of the metal oxide 406b with the insulator 412 interposed therebetween. Thus, the electric field of the conductor 404 having a function of a gate electrode can electrically surround the top surface in the vicinity of the region 426a and the side surface, which is in the channel width direction, of the metal oxide 406b. The structure of the transistor in which the channel formation region is electrically surrounded by the electric field of the conductor 404 is referred to as a surrounded channel (s-channel) structure. Thus, a channel can be formed in the top surface in the vicinity of the region 426a and the side surface, which is in the channel width direction, of the metal oxide 406b; therefore, a large amount of current can flow between the source and the drain, and a current in a conduction state (on-state current) can be large. Moreover, since the top surface in the vicinity of the region 426a and the side surface, which is in the channel width direction, of the metal oxide 406b are surrounded by the electric field of the conductor 404, a leakage current in a non-conduction state (off-state current) can be small.

The insulator 419 is preferably placed over the conductor 404b. In addition, side surfaces of the insulator 419, the conductor 404a, the conductor 404b, and the insulator 412 are preferably substantially aligned with each other. The insulator 419 is preferably deposited by an atomic layer deposition (ALD) method. In that case, the insulator 419 can be deposited to have a thickness of approximately greater than or equal to 1 nm and less than or equal to 20 nm, preferably approximately greater than or equal to 5 nm and less than or equal to 10 nm. Here, for the insulator 419 as well as the insulator 418, an insulating material having a function of inhibiting the passage of oxygen and impurities such as water or hydrogen is preferably used; aluminum oxide, hafnium oxide, or the like is preferably used, for example.

When the insulator 419 is provided, the insulator 419 and the insulator 418 which have a function of inhibiting the passage of oxygen and impurities such as water or hydrogen can cover the top surface and the side surfaces of the conductor 404. This can prevent entry of impurities such as water or hydrogen into the metal oxide 406 through the conductor 404. Thus, the insulator 418 and the insulator 419 have a function of a gate cap that protects the gate.

The insulator 418 is provided in contact with the side surfaces of the insulator 412, the conductor 404, and the insulator 419. Furthermore, the top surface of the insulator 418 is preferably substantially aligned with the top surface of the insulator 419. The insulator 418 is preferably deposited by an ALD method. In that case, the insulator 418 can be deposited to have a thickness of approximately greater than or equal to 1 nm and less than or equal to 20 nm, preferably approximately greater than or equal to 1 nm and less than or equal to 3 nm, and for example, 1 nm.

As described above, the region 426b and the region 426c of the metal oxide 406 are formed by the impurity element added in the deposition of the insulator 225. In the case where the transistor is miniaturized and formed to have a channel length of approximately 10 nm to 30 nm, the impurity element contained in the source region or the drain region might be diffused to bring electrical connection between the source region and the drain region. In view of this, the insulator 418 is formed as described in this embodiment, so that the distance between regions of the metal oxide 406 that are in contact with the insulator 225 is increased; accordingly, electrical connection between the source region and the drain region can be prevented. Furthermore, when the insulator 418 is formed using an ALD method, the thickness thereof is as small as or smaller than the length of the miniaturized channel, an excessive increase of the distance between the source region and the drain region is not caused, and thereby an increase in the resistance can be prevented.

Here, for the insulator 418, an insulating material having a function of inhibiting the passage of oxygen and impurities such as water or hydrogen is preferably used, and for example, aluminum oxide or hafnium oxide is preferably used. Accordingly, oxygen in the insulator 412 can be prevented from diffusing to the outside. Furthermore, entry of impurities such as hydrogen or water to the metal oxide 406 from an end portion or the like of the insulator 412 can be inhibited.

The insulator 418 is preferably formed by depositing an insulating film by an ALD method and then performing anisotropic etching so as to leave a portion of the insulating film that is in contact with the side surfaces of the insulator 412, the conductor 404, and the insulator 419. Thus, an insulator having a small thickness as described above can be easily formed. Furthermore, since the insulator 419 is provided over the conductor 404 here, the portions of the insulator 418 in contact with the insulator 412 and the conductor 404 can be left sufficiently even when the insulator 419 is partly removed by the anisotropic etching.

The insulator 225 is provided to cover the insulator 419, the insulator 418, the metal oxide 406, and the insulator 224. Here, the insulator 225 is provided in contact with the top surfaces of the insulator 419 and the insulator 418 and in contact with the side surface of the insulator 418. As described above, the insulator 225 adds impurities such as hydrogen or nitrogen to the metal oxide 406, so that the region 426b and the region 426c are formed. Thus, the insulator 225 preferably contains at least one of hydrogen and nitrogen.

Furthermore, the insulator 225 is preferably provided in contact with the side surface of the metal oxide 406b and the side surface of the metal oxide 406a as well as the top surface of the metal oxide 406b. This enables a resistance reduction to the side surface of the metal oxide 406b and the side surface of the metal oxide 406a in the region 426b and the region 426c.

Moreover, for the insulator 225, an insulating material having a function of inhibiting the passage of oxygen and impurities such as water or hydrogen is preferably used. For example, as the insulator 225, silicon nitride, silicon nitride oxide, silicon oxynitride, aluminum nitride, aluminum nitride oxide, or the like is preferably used. Formation of such an insulator 225 can prevent a reduction in carrier density due to oxygen passing through the insulator 225 and oxygen being supplied to oxygen vacancies in the region 426b and the region 426c. Furthermore, impurities such as water or hydrogen can be prevented from passing through the insulator 225 and excessively enlarging the region 426b and the region 426c to the region 426a side.

The insulator 280 is preferably provided over the insulator 225. As in the insulator 224 or the like, the concentration of impurities such as water or hydrogen in the insulator 280 is preferably reduced.

In openings formed in the insulator 280 and the insulator 225, a conductor 450a and a conductor 451a, and a conductor 450b and a conductor 451b are placed. The conductor 450a and the conductor 451a, and the conductor 450b and the conductor 451b are preferably provided to face each other with the conductor 404 interposed therebetween.

Here, the conductor 450a is formed in contact with an inner wall of the opening of the insulator 280 and the insulator 225, and the conductor 451a is formed on the inner side. The region 426b of the metal oxide 406 is positioned in at least part of a bottom portion of the opening, and the conductor 450a is in contact with the region 426b. Similarly, the conductor 450b is formed in contact with the inner wall of the opening of the insulator 280 and the insulator 225, and the conductor 451b is formed on the inner side. The region 426c of the metal oxide 406 is positioned in at least part of a bottom portion of the opening, and the conductor 450b is in contact with the region 426c.

The conductor 450a and the conductor 451a function as one of a source electrode and a drain electrode, and the conductor 450b and the conductor 451b function as the other of the source electrode and the drain electrode.

For the conductor 450a and the conductor 450b as well as the conductor 310a or the like, a conductive material having a function of inhibiting the passage of impurities such as water or hydrogen is preferably used. For example, tantalum, tantalum nitride, titanium, titanium nitride, ruthenium, or ruthenium oxide is preferably used, and a single layer or a stacked layer may be used. This can inhibit entry of impurities such as hydrogen or water from a layer over the insulator 280 to the metal oxide 406 through the conductor 451a and the conductor 451b.

Moreover, the conductor 451a and the conductor 451b preferably use a conductive material containing tungsten, copper, or aluminum as its main component. Furthermore, although not illustrated, the conductor 451a and the conductor 451b may have a stacked-layer structure, and for example, may be a stack of titanium, titanium nitride, and the above-described conductive material.

Next, materials for components of the transistor 200 will be described.

<Substrate>

As a substrate over which the transistor 200 is formed, for example, an insulator substrate, a semiconductor substrate, or a conductor substrate may be used. As the insulator substrate, a glass substrate, a quartz substrate, a sapphire substrate, a stabilized zirconia substrate (an yttria-stabilized zirconia substrate or the like), or a resin substrate is given, for example. Moreover, as the semiconductor substrate, a semiconductor substrate of silicon, germanium, or the like, or a compound semiconductor substrate of silicon carbide, silicon germanium, gallium arsenide, indium phosphide, zinc oxide, or gallium oxide is given, for example. Furthermore, a semiconductor substrate in which an insulator region is provided in the above semiconductor substrate, for example, an SOI (Silicon On Insulator) substrate or the like is given. As the conductor substrate, a graphite substrate, a metal substrate, an alloy substrate, a conductive resin substrate, or the like is given. Alternatively, a substrate including a metal nitride, a substrate including a metal oxide, or the like is given. A substrate which is an insulator substrate provided with a conductor or a semiconductor, a substrate which is a semiconductor substrate provided with a conductor or an insulator, a substrate which is a conductor substrate provided with a semiconductor or an insulator, or the like is also given. Alternatively, any of these substrates over which an element is provided may be used. As the element provided over the substrate, a capacitor, a resistor, a switching element, a light-emitting element, a memory element, or the like is given.

Alternatively, a flexible substrate may be used as the substrate. Note that as a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. Note that as the substrate, a sheet, a film, or a foil containing a fiber may be used. In addition, the substrate may have elasticity. Moreover, the substrate may have a property of returning to its original shape or a property of not returning to its original shape when bending or pulling is stopped. The substrate includes a region having a thickness of, for example, greater than or equal to 5 µm and less than or equal to 700 µm, preferably greater than or equal to 10 µm and less than or equal to 500 µm, and further preferably greater than or equal to 15 µm and less than or equal to 300 µm. When the substrate has a small thickness, the semiconductor device including the transistor can be lightweight. Furthermore, when the substrate has a small thickness, even in the case of using glass or the like, the substrate may have elasticity or a property of returning to its original shape when bending or pulling is stopped. Therefore, an impact or the like applied to the semiconductor device over the substrate, which is caused by dropping or the like, can be reduced. That is, a durable semiconductor device can be provided.

For the substrate which is a flexible substrate, metal, an alloy, resin, glass, or fiber thereof can be used, for example. The substrate which is a flexible substrate preferably has a lower coefficient of linear expansion because deformation due to an environment is inhibited. For the substrate which is a flexible substrate, for example, a material whose coefficient of linear expansion is lower than or equal to $1\times10^{-3}$/K, lower than or equal to $5\times10^{-5}$/K, or lower than or equal to $1\times10^{--5}$/K may be used. Examples of the resin include polyester, polyolefin, polyamide (nylon, aramid, or the like), polyimide, polycarbonate, and acrylic. In particular, aramid is preferably used for the substrate which is a flexible substrate because of its low coefficient of linear expansion.

<Insulator>

As the insulator, oxide, nitride, oxynitride, nitride oxide, metal oxide, metal oxynitride, metal nitride oxide, or the like having an insulating property is given.

When the transistor is surrounded by an insulator that has a function of inhibiting the passage of oxygen and impurities such as hydrogen, the electrical characteristics of the transistor can be stabilized. For example, an insulator that has a function of inhibiting the passage of oxygen and impurities such as hydrogen may be used as the insulator 222 and the insulator 214.

As the insulator that has a function of inhibiting the passage of oxygen and impurities such as hydrogen, for example, a single layer or a stacked layer of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Furthermore, for example, for the insulator 222 and the insulator 214, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride may be used. Note that the insulator 222 and the insulator 214 preferably include aluminum oxide, hafnium oxide, or the like.

As the insulator 384, the insulator 216, the insulator 220, the insulator 224, and the insulator 412, for example, a single layer or a stacked layer of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. For example, the insulator 384, the insulator 216, the insulator 220, the insulator 224, and the insulator 412 each preferably include silicon oxide, silicon oxynitride, or silicon nitride.

The insulator 220, the insulator 222, the insulator 224, and/or the insulator 412 preferably include an insulator with a high dielectric constant. For example, the insulator 220, the insulator 222, the insulator 224, and/or the insulator 412 each preferably include gallium oxide, hafnium oxide, zirconium oxide, oxide containing aluminum and hafnium, oxynitride containing aluminum and hafnium, oxide containing silicon and hafnium, oxynitride containing silicon and hafnium, or nitride containing silicon and hafnium. Alternatively, the insulator 220, the insulator 222, the insulator 224, and/or the insulator 412 each preferably have a stacked-layer structure of silicon oxide or silicon oxynitride and an insulator with a high dielectric constant. Because silicon oxide and silicon oxynitride have thermal stability, a combination of silicon oxide or silicon oxynitride with an insulator with a high dielectric constant allows the stacked-layer structure to be thermally stable and have a high dielectric constant. For example, when a structure in which aluminum oxide, gallium oxide, or hafnium oxide is in contact with the metal oxide 406 in each of the insulator 224 and the insulator 412 is used, silicon contained in silicon oxide or silicon oxynitride can be prevented from entering the metal oxide 406. Furthermore, for example, when a structure in which silicon oxide or silicon oxynitride is in contact with the metal oxide 406 in each of the insulator 224 and the insulator 412 is used, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 384, the insulator 216, and the insulator 280 preferably include an insulator with a low dielectric constant. For example, the insulator 384, the insulator 216, and the insulator 280 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. Alternatively, the insulator 384, the insulator 216, and the insulator 280 preferably have a stacked-layer structure of silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide, and a resin. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (nylon, aramid, or the like), polyimide, polycarbonate, and acrylic.

As the insulator 418 and the insulator 419, an insulator having a function of inhibiting the passage of oxygen and impurities such as hydrogen may be used. As the insulator 418 and the insulator 419, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; or silicon nitride may be used, for example.

<Conductor>

For the conductor 404a, the conductor 404b, the conductor 310a, the conductor 310b, the conductor 450a, the conductor 450b, the conductor 451a, and the conductor 451b, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity typified by polycrystalline silicon including an impurity element such as phosphorus, or silicide such as nickel silicide may be used.

Moreover, for the above-described conductors, especially for the conductor 404a, the conductor 310a, the conductor 450a, and the conductor 450b, a conductive material containing oxygen and a metal element contained in a metal oxide that can be used for the metal oxide 406 may be used. A conductive material containing the above-described metal element and nitrogen may be used. For example, a conductive material containing nitrogen such as titanium nitride or tantalum nitride may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. By using such a material, hydrogen contained in the metal oxide 406 can be captured in some cases. Alternatively, hydrogen entering from an external insulator or the like can be captured in some cases.

Alternatively, a stack of a plurality of conductive layers formed using the above materials may be used. For example, a stacked-layer structure in which a material containing any of the above metal elements and a conductive material containing oxygen are combined may be used. Alternatively, a stacked-layer structure in which a material containing any of the above metal elements and a conductive material containing nitrogen are combined may be used. A stacked-layer structure in which a material containing any of the above metal elements, a conductive material containing oxygen, and a conductive material containing nitrogen are combined may be used.

Note that when oxide is used for the channel formation region in the transistor, a stacked-layer structure in which a material containing the above-described metal element and a conductive material containing oxygen are combined is preferably employed for the gate electrode. In this case, the conductive material containing oxygen is preferably provided on the channel formation region side. When the conductive material containing oxygen is provided on the channel formation region side, oxygen released from the conductive material is likely to be supplied to the channel formation region.

<Metal Oxide Applicable to Metal Oxide 406>

The metal oxide 406 according to the present invention will be described below. As the metal oxide 406, a metal oxide functioning as an oxide semiconductor is preferably used.

The metal oxide 406 preferably contains at least indium or zinc. In particular, indium and zinc are preferably contained. In addition, aluminum, gallium, yttrium, tin, or the like is preferably contained. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, or the like may be contained.

Here, the case where the metal oxide 406 contains indium, the element M, and zinc is considered. Note that the terms of the atomic ratio of indium, the element M, and zinc contained in the metal oxide 406 are denoted by [In], [M], and [Zn], respectively.

Preferred ranges of the atomic ratio of indium, the element M, and zinc contained in the metal oxide 406 will be described with reference to FIG. 17(A), FIG. 17(B), and FIG. 17(C). Note that the atomic ratio of oxygen is not shown in FIG. 17(A), FIG. 17(B), and FIG. 17(C). In addition, the terms of the atomic ratio of indium, the element M, and zinc contained in the metal oxide 406 are denoted by [In], [M], and [Zn], respectively.

Figure 17A:
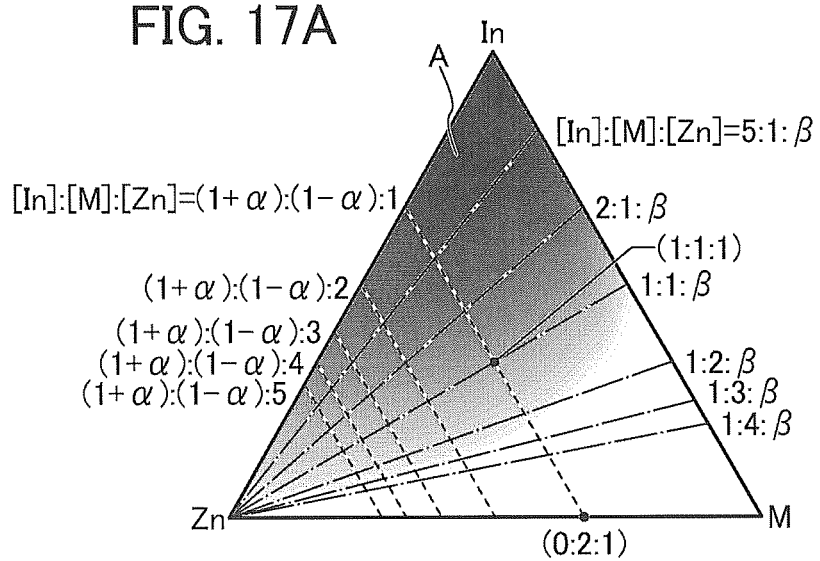
FIGS. 17A-17C are diagrams illustrating an atomic ratio range of a metal oxide.
Figure 17B:
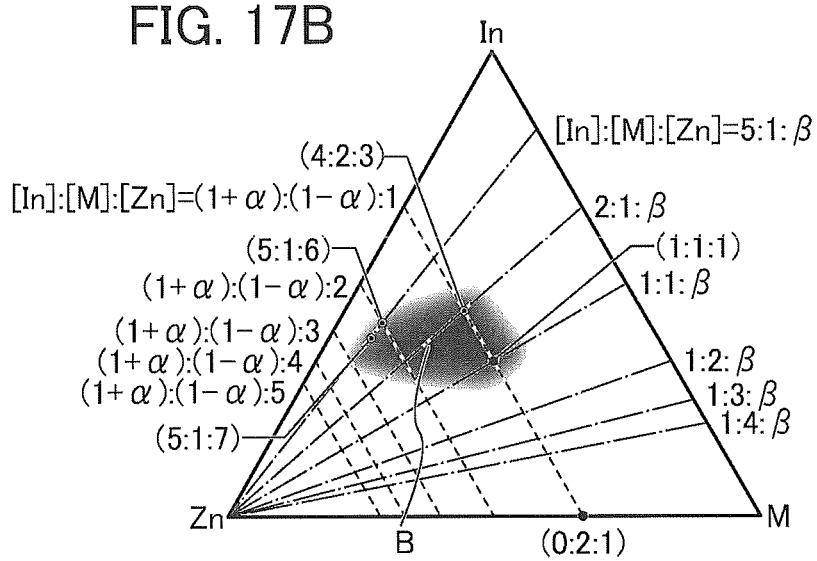
Figure 17C:
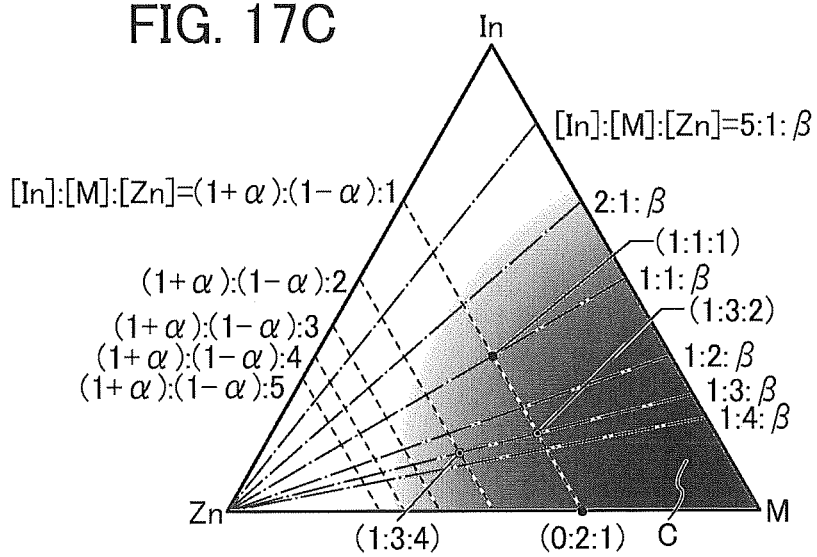

In FIG. 17(A), FIG. 17(B), and FIG. 17(C), broken lines indicate a line representing the atomic ratio of $[In]:[M]:[Zn]=(1+\alpha):(1-\alpha):1$ $(-1\leq\alpha\leq1)$, a line representing the atomic ratio of $[In]:[M]:[Zn]=(1+\alpha):(1-\alpha):2$, a line representing the atomic ratio of $[In]:[M]:[Zn]=(1+\alpha):(1-\alpha):3$, a line representing the atomic ratio of $[In]:[M]:[Zn]=(1+\alpha):(1-\alpha):4$, and a line representing the atomic ratio of $[In]:[M]:[Zn]=(1+\alpha):(1-\alpha):5$.

Furthermore, dashed-dotted lines indicate a line representing the atomic ratio of $[In]:[M]:[Zn]=5:1:\beta$ $(\beta\geq0)$, a line representing the atomic ratio of $[In]:[M]:[Zn]=2:1:\beta$, a line representing the atomic ratio of $[In]:[M]:[Zn]=1:1:\beta$, a line representing the atomic ratio of $[In]:[M]:[Zn]=1:2:\beta$, a line representing the atomic ratio of $[In]:[M]:[Zn]=1:3:\beta$, and a line representing the atomic ratio of $[In]:[M]:[Zn]=1:4:\beta$.

Furthermore, a metal oxide with an atomic ratio of $[In]:[M]:[Zn]=0:2:1$ and a value in the vicinity thereof illustrated in FIG. 17(A), FIG. 17(B), and FIG. 17(C) tends to have a spinel crystal structure.

In addition, a plurality of phases coexist in the metal oxide in some cases (two-phases coexistence, three-phases coexistence, or the like). For example, with an atomic ratio having a value in the vicinity of $[In]:[M]:[Zn]=0:2:1$, two phases of a spinel crystal structure and a layered crystal structure are likely to coexist. In addition, with an atomic ratio having a value in the vicinity of $[In]:[M]:[Zn]=1:0:0$, two phases of a bixbyite crystal structure and a layered crystal structure are likely to coexist. In the case where a plurality of phases coexist in the metal oxide, a crystal grain boundary might be formed between different crystal structures.

A region A illustrated in FIG. 17(A) represents an example of the preferred range of the atomic ratio of indium, the element M, and zinc contained in the metal oxide 406.

When the metal oxide has a higher content of indium, the carrier mobility (electron mobility) of the metal oxide can be increased. Thus, a metal oxide having a high content of indium has higher carrier mobility than a metal oxide having a low content of indium.

By contrast, when the content of indium and zinc in a metal oxide becomes lower, carrier mobility becomes lower. Thus, with an atomic ratio of $[In]:[M]:[Zn]=0:1:0$ and a value in the vicinity thereof (for example, a region C illustrated in FIG. 17(C)), high insulating properties are obtained.

For example, the metal oxide used as the metal oxide 406b preferably has an atomic ratio represented by the region A in FIG. 17(A), with which high carrier mobility is obtained. The metal oxide used as the metal oxide 406b may have an atomic ratio of In:Ga:Zn=4:2:3 to 4.1 and approximately a value in the vicinity thereof, for example. By contrast, the metal oxide used as the metal oxide 406a preferably has an atomic ratio represented by the region C illustrated in FIG. 17(C), with which relatively high insulating properties are obtained. The metal oxide used as the metal oxide 406a may have an atomic ratio of In:Ga:Zn=approximately 1:3:4.

In the region A, particularly in a region B illustrated in FIG. 17(B), an excellent metal oxide having high carrier mobility and high reliability can be obtained.

Note that the region B includes [In]:[M]:[Zn]=4:2:3 to 4.1 and a value in the vicinity thereof. The value in the vicinity includes [In]:[M]:[Zn]=5:3:4. In addition, the region B includes [In]:[M]:[Zn]=5:1:6 and a value in the vicinity thereof and [In]:[M]:[Zn]=5:1:7 and a value in the vicinity thereof.

Furthermore, in the case where an In-M-Zn oxide is used as the metal oxide 406, it is preferable to use a target including a polycrystalline In-M-Zn oxide as the sputtering target. Note that the atomic ratio of the deposited metal oxide varies from the above atomic ratios of metal elements contained in the sputtering targets in a range of ±40%. For example, when the composition ratio of a sputtering target used for the metal oxide 406 is In:Ga:Zn=4:2:4.1 [atomic ratio], the composition ratio of the deposited metal oxide may be In:Ga:Zn=4:2:3 [atomic ratio] or in the vicinity thereof. Moreover, when the composition ratio of a sputtering target used for the metal oxide 406 is In:Ga:Zn=5:1:7 [atomic ratio], the composition ratio of the deposited metal oxide may be In:Ga:Zn=5:1:6 [atomic ratio] or in the vicinity thereof.

Note that the property of a metal oxide is not uniquely determined by an atomic ratio. Even with the same atomic ratio, the property of a metal oxide might be different depending on a formation condition. For example, in the case where the metal oxide 406 is deposited with a sputtering apparatus, a film having an atomic ratio deviated from the atomic ratio of the target is formed. In addition, [Zn] in the film might be smaller than [Zn] in the target depending on the substrate temperature in deposition. Thus, the illustrated regions are each a region representing an atomic ratio with which a metal oxide tends to have specific characteristics, and boundaries of the region A to the region C are not clear.

<Composition of Metal Oxide>

The composition of a CAC (Cloud-Aligned Composite)-OS that can be used in an OS transistor will be described below.

Note that in this specification and the like, "CAAC (c-axis aligned crystal)" or "CAC (Cloud-Aligned Composite)" might be stated. Note that CAAC refers to an example of a crystal structure, and CAC refers to an example of a function or a material composition.

A CAC-OS or a CAC-metal oxide has a conducting function in a part of the material and has an insulating function in a part of the material, and has a function of a semiconductor as the whole material. Note that in the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC-metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC-metal oxide is formed of components having different bandgaps. For example, the CAC-OS or the CAC-metal oxide is formed of a component having a wide gap due to the insulating region and a component having a narrow gap due to the conductive region. When carriers flow in such a structure, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, high on-state current and high field-effect mobility, can be obtained.

In other words, the CAC-OS or the CAC-metal oxide can also be called a matrix composite or a metal matrix composite.

<Structure of Metal Oxide>

Oxide semiconductors can be classified into single crystal oxide semiconductors and non-single crystal oxide semiconductors. Examples of a non-single crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the plurality of nanocrystals are connected.

The nanocrystal is basically a hexagon but is not always a regular hexagon and is a non-regular hexagon in some cases. Furthermore, a pentagonal lattice arrangement, a heptagonal lattice arrangement, and the like are included in the distortion in some cases. Note that a clear crystal grain boundary (also referred to as a grain boundary) cannot be observed even in the vicinity of distortion in the CAAC-OS. That is, formation of a crystal grain boundary is inhibited by the distortion of a lattice arrangement. This is probably because the CAAC-OS can tolerate distortion owing to a low density of oxygen atom arrangement in an a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. Furthermore, when indium of the In layer is replaced by the element M, the layer can also be referred to as an (In, M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

The nc-OS has a periodic atomic arrangement in a microscopic region (for example, a region with a size greater than or equal to 1 nm and less than or equal to 10 nm, in particular, a region with a size greater than or equal to 1 nm and less than or equal to 3 nm). In addition, no regularity of crystal orientation is observed between different nanocrystals in the nc-OS. Thus, the orientation is not observed in the whole film. Accordingly, in some cases, the nc-OS cannot be distinguished from an a-like OS or an amorphous oxide semiconductor depending on an analysis method.

The a-like OS is an oxide semiconductor that has a structure between those of the nc-OS and the amorphous oxide semiconductor. The a-like OS has a void or a low-density region. That is, the a-like OS has low crystallinity as compared with the nc-OS and the CAAC-OS.

An oxide semiconductor has various structures with different properties. Two or more kinds among the amorphous oxide semiconductor, the polycrystalline oxide semiconductor, the a-like OS, the nc-OS, and the CAAC-OS may be included in an oxide semiconductor of one embodiment of the present invention.

<Transistor Including Metal Oxide>

Next, the case where the metal oxide is used for a transistor will be described.

Note that when the metal oxide is used for a transistor, the transistor having high field-effect mobility can be achieved. In addition, the transistor having high reliability can be achieved.

Moreover, the carrier density in the region 426a of the metal oxide 406b in the transistor is preferably low. In the case of reducing the carrier density of the metal oxide, the concentration of impurities in the metal oxide is reduced so that the density of defect states is reduced. In this specification and the like, a state with a low impurity concentration and a low density of defect states is referred to as highly purified intrinsic or substantially highly purified intrinsic. For example, the carrier density of the region 426a of the metal oxide 406b is lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$.

The highly purified intrinsic or substantially highly purified intrinsic metal oxide has a low density of defect states and accordingly has a low density of trap states in some cases.

Charge trapped by the trap states in the metal oxide takes a long time to be released and may behave like fixed charge. Thus, the transistor whose channel region is formed in the oxide semiconductor having a high density of trap states has unstable electrical characteristics in some cases.

In order to stabilize electrical characteristics of the transistor, it is effective to reduce the concentration of impurities in the region 426a of the metal oxide 406b. In addition, in order to reduce the concentration of impurities in the region 426a of the metal oxide 406b, the concentration of impurities in an adjacent film is also preferably reduced. As examples of the impurities, hydrogen, nitrogen, alkali metal, alkaline earth metal, iron, nickel, silicon, and the like are given.

<Impurities>

Here, the influence of each impurity in the metal oxide will be described.

When silicon or carbon that is one of Group 14 elements is contained in the metal oxide, defect states are formed in the metal oxide. Thus, the concentration of silicon or carbon (the concentration measured by SIMS) in the region 426a of the metal oxide 406b is set to be lower than or equal to $2 \times 10^{18}$ atoms/cm$^3$, preferably lower than or equal to $2 \times 10^{17}$ atoms/cm$^3$.

When the metal oxide contains an alkali metal or an alkaline earth metal, defect states are formed and carriers are generated, in some cases. Thus, a transistor including a metal oxide that contains an alkali metal or an alkaline earth metal is likely to have normally-on characteristics. Therefore, it is preferable to reduce the concentration of an alkali metal or an alkaline earth metal in the region 426a of the metal oxide 406b. Specifically, the concentration of an alkali metal or an alkaline earth metal in the region 426a of the metal oxide 406b, which is measured by SIMS, is lower than or equal to $1 \times 10^{18}$ atoms/cm$^3$, preferably lower than or equal to $2 \times 10^{16}$ atoms/cm$^3$.

Moreover, the metal oxide containing nitrogen easily becomes n-type by generation of electrons serving as carriers and an increase of carrier density. Thus, the transistor containing nitrogen in the region 426a of the metal oxide 406b tends to have normally-on characteristics. For this reason, nitrogen in the region 426a of the metal oxide 406b is preferably reduced as much as possible; for example, the concentration of nitrogen in the region 426a of the metal oxide 406b is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$ in SIMS.

Hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom generates an electron serving as a carrier. Thus, the transistor containing much hydrogen in the region 426a of the metal oxide 406b tends to have normally-on characteristics. For this reason, hydrogen in the region 426a of the metal oxide 406b is preferably reduced as much as possible. Specifically, the hydrogen concentration of the metal oxide, which is measured by SIMS, is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

By reducing impurities in the region 426a of the metal oxide 406b sufficiently, the transistor can have stable electrical characteristics.

<<Transistor 201>>

Next, the details of the transistor 201 illustrated in FIG. 14 will be described.

FIG. 18(A) is a top view of the transistor 201. Moreover, FIG. 18(B) is a cross-sectional view of a portion indicated by a dashed-dotted line A1-A2 in FIG. 18(A), and is also a cross-sectional view of the transistor 201 in a channel length direction. Furthermore, FIG. 18(C) is a cross-sectional view of a portion indicated by a dashed-dotted line A3-A4 in FIG. 18(A), and is also a cross-sectional view of the transistor 201 in a channel width direction. In the top view of FIG. 18(A), some components are omitted for simplification of the drawing. In addition, the components common to the transistor 201 and the transistor 200 are denoted by the same reference numerals.

As illustrated in FIGS. 18(A) to 18(C), the transistor 201 includes the insulator 224 placed over a substrate (not illustrated), the metal oxide 406*a* placed over the insulator 224, the metal oxide 406*b* placed in contact with at least part of the top surface of the metal oxide 406*a*, a conductor 452*a* and a conductor 452*b* placed in contact with at least part of the top surface of the metal oxide 406*b*, a metal oxide 406*c* placed in contact with at least part of the top surface of the metal oxide 406*b* and over the conductor 452*a* and the conductor 452*b*, an insulator 413 placed over the metal oxide 406*c*, a conductor 405*a* placed over the insulator 413, a conductor 405*b* placed over the conductor 405*a*, and an insulator 420 placed over the conductor 405*b*.

A conductor 405 (the conductor 405*a* and the conductor 405*b*) can function as a top gate, and the conductor 310 can function as a back gate. The potential of the back gate may be the same as that of the top gate, or may be the ground potential or an arbitrary potential. Moreover, by changing the potential of the back gate not in synchronization with but independently of that of the top gate, the threshold voltage of the transistor can be changed.

The conductor 405*a* can be provided using a material similar to that for the conductor 404*a* in FIG. 15. The conductor 405*b* can be provided using a material similar to that for the conductor 404*b* in FIG. 15.

The conductor 452*a* has a function of one of a source electrode and a drain electrode, and the conductor 452*b* has a function of the other of the source electrode and the drain electrode.

A metal such as aluminum, titanium, chromium, nickel, copper, yttrium, zirconium, molybdenum, silver, tantalum, or tungsten, or an alloy containing any of them as its main component can be used for each of the conductors 452*a* and 452*b*. Although a single-layer structure is illustrated in the drawings, a stacked-layer structure of two or more layers may be used. Furthermore, a transparent conductive material containing indium oxide, tin oxide, or zinc oxide may be used.

In the transistor 201, a channel is preferably formed in the metal oxide 406*b*. Therefore, for the metal oxide 406*c*, a material having a higher insulating property than the metal oxide 406*b* is preferably used. For the metal oxide 406*c*, a material similar to that for the metal oxide 406*a* is preferably used.

By providing the metal oxide 406*c* for the transistor 201, the transistor 201 can be a buried-channel transistor. Moreover, oxidation of end portions of the conductor 452*a* and the conductor 452*b* can be prevented. Furthermore, a leakage current between the conductor 405 and the conductor 452*a* (or the conductor 405 and the conductor 452*b*) can be prevented. Note that the metal oxide 406*c* may be omitted depending on the case.

For the insulator 420, an insulating material having a function of inhibiting the passage of oxygen and impurities such as water or hydrogen is preferably used. For example, for the insulator 420, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride may be used.

Provision of the insulator 420 in the transistor 201 can prevent oxidation of the conductor 405. Furthermore, impurities such as water or hydrogen can be prevented from entering the metal oxide 406.

The transistor 201 can have a larger contact area between the metal oxide 406*b* and the electrode (the source electrode or the drain electrode) than the transistor 200. Furthermore, a step for forming the region 426*b* and the region 426*c* illustrated in FIG. 15 is not necessary. Thus, the transistor 201 can have larger on-state current than the transistor 200. In addition, the manufacturing process can be simplified.

For the details of the other components of the transistor 201, the description of the transistor 200 can be referred to.

Note that this embodiment can be combined with other embodiments in this specification as appropriate.

Embodiment 6

In this embodiment, an example of an imaging device of one embodiment of the present invention is described with reference to drawings.

Figure 19:
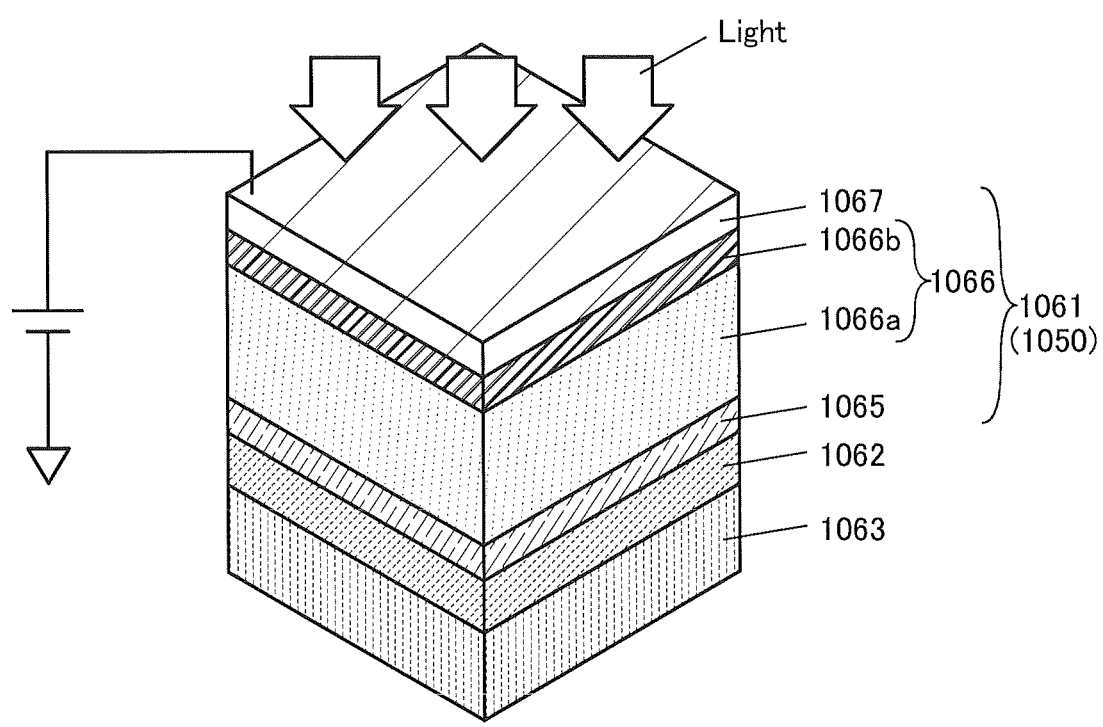
FIG. 19 is a diagram illustrating a structure of a pixel of an imaging device.

FIG. 19 illustrates a structure example of a pixel of the above-described imaging device including a pixel circuit. The pixel includes a layer 1061, a layer 1062, and a layer 1063, which have portions overlapping with each other.

The layer 1061 has a structure of a photoelectric conversion element 1050. The photoelectric conversion element 1050 includes an electrode 1065 corresponding to a pixel electrode, a photoelectric conversion portion 1066, and an electrode 1067 corresponding to a common electrode.

A low-resistance metal layer or the like is preferably used for the electrode 1065. For example, aluminum, titanium, tungsten, tantalum, silver, or a stacked layer thereof can be used.

A conductive layer having a high light-transmitting property with respect to visible light (Light) is preferably used for the electrode 1067. For example, indium oxide, tin oxide, zinc oxide, indium tin oxide, gallium zinc oxide, indium gallium zinc oxide, or graphene can be used. Note that the electrode 1067 can be omitted.

For example, a pn-junction photodiode including a selenium-based material in a photoelectric conversion layer can be used for the photoelectric conversion portion 1066. The selenium-based material, which is a p-type semiconductor, is preferably used for a layer 1066*a*, and gallium oxide, which is an n-type semiconductor, or the like is preferably used for a layer 1066*b*.

A photoelectric conversion element including a selenium-based material has properties with high external quantum efficiency with respect to visible light. Such a photoelectric conversion element can be a highly sensitive sensor in which the amount of amplification of electrons with respect to the amount of incident light is large because of avalanche multiplication effect. A selenium-based material has a high light-absorption coefficient, and thus has advantages in production; for example, a photoelectric conversion layer can be formed as a thin film. A thin film of a selenium-based material can be formed using a vacuum evaporation method, a sputtering method, or the like.

As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, zinc oxide, gallium oxide, indium oxide, tin oxide, or mixed oxide in which the above oxides coexist can be used. In addition, these materials also have a function of a hole injection blocking layer, so that a dark current can be decreased.

Note that the structure of the layer 1061 is not limited to the above structure, and may be a pn-junction photodiode in which one of a p-type silicon semiconductor and an n-type silicon semiconductor is used for the layer 1066*a*, and the other of the p-type silicon semiconductor and the n-type silicon semiconductor is used for the layer 1066*b*. Alternatively, a pin-junction photodiode in which an i-type silicon semiconductor layer is provided between the layer 1066*a* and the layer 1066*b* may be used.

The above pn-junction photodiode or pin-junction photodiode can be formed using single crystal silicon. In that case, the layer 1061 and the layer 1062 are preferably electrically connected through a bonding step. Furthermore, the pin-junction photodiode can be formed using a thin film of amorphous silicon, microcrystalline silicon, polycrystalline silicon, or the like.

The layer 1062 can be a layer including, for example, OS transistors (the transistor 51 and the transistor 52). In the circuit structure of the pixel illustrated in FIG. 8(A), when the intensity of light incident on the photoelectric conversion element 1050 is low, the potential of the charge detection portion is low. Since the OS transistor has extremely low off-state current, current based on a gate potential can be accurately output even when the gate potential is extremely low. Thus, it is possible to widen the detection range of illuminance, i.e., the dynamic range.

A period during which charge can be held in the charge accumulation portion (the node ND1) can be extremely long owing to the low off-state current characteristics of the transistor 51 and the transistor 52. Therefore, a global shutter system in which charge accumulation operation is performed in all the pixels at the same time can be used without complicating the circuit structure and operation method.

The layer 1063 can be a support substrate or a layer including Si transistors (the transistor 53 and the transistor 54). The Si transistor can include an active region in a single-crystal silicon substrate or include a crystalline silicon active layer over an insulating surface. In the case where a single-crystal silicon substrate is used for the layer 1063, a pn-junction photodiode or a pin-junction diode may be formed in the single-crystal silicon substrate. In this case, the layer 1061 can be omitted.

Figure 20A:
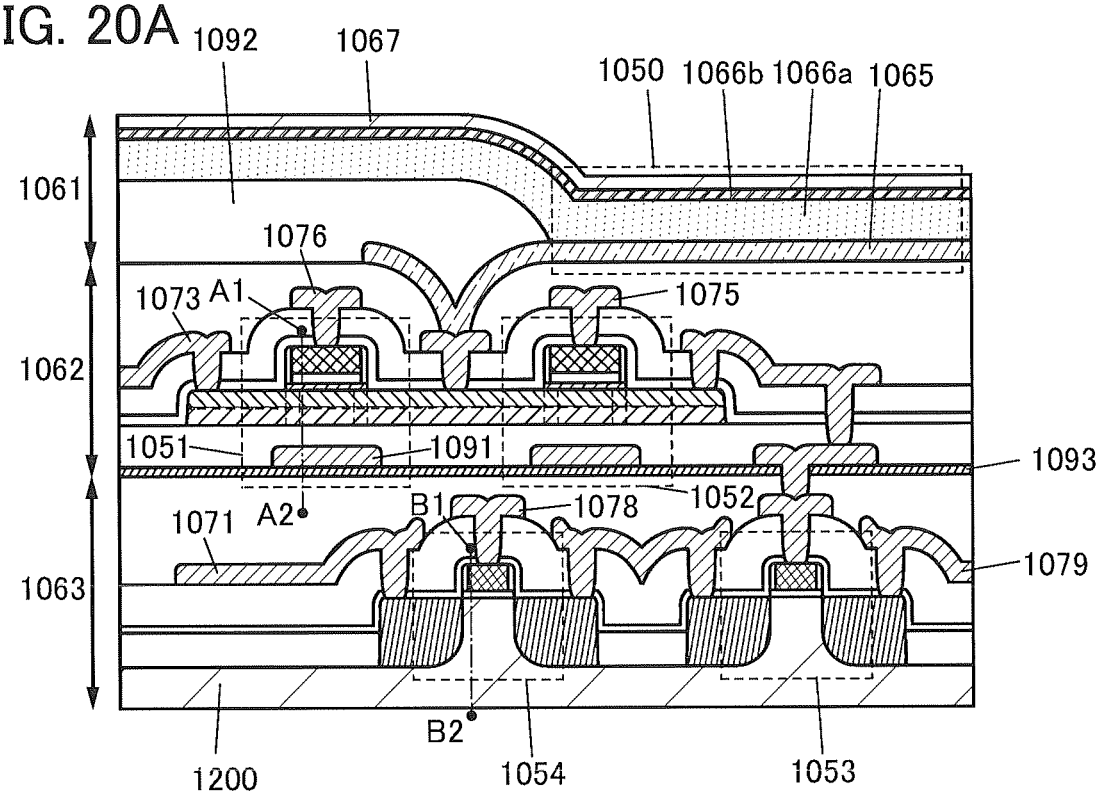
FIGS. 20A-20C are cross-sectional views illustrating a structure of an imaging device.
Figure 20B:
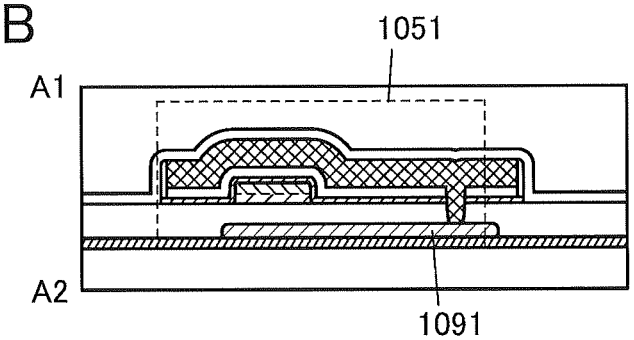
Figure 20C:
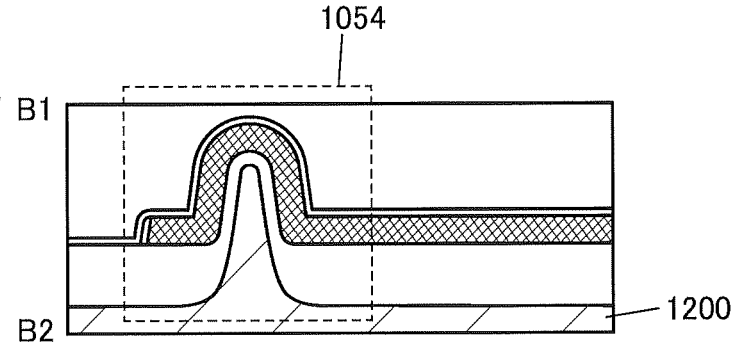

FIGS. 20(A), 20(B), and 20(C) are diagrams illustrating a specific structure of the imaging device illustrated in FIG. 19. For example, the transistors 51, 52, 53, and 54 illustrated in FIG. 8(A) correspond to the transistors 1051, 1052, 1053, and 1054 in FIG. 20, respectively. FIG. 20(A) is a cross-sectional view in the channel length direction of the transistors 1051, 1052, 1053, and 1054. FIG. 20(B) is a cross-sectional view taken along dashed-dotted line A1-A2, and illustrates a cross section in the channel width direction of the transistor 1051. FIG. 20(C) is a cross-sectional view taken along dashed-dotted line B1-B2, and illustrates a cross section in the channel width direction of the transistor 1054. Here, the transistor 55, the capacitor 33, and the capacitor 34 illustrated in FIG. 8(A) are not illustrated because of a paper space.

The imaging device can be a stack of the layer 1061 to the layer 1063. The layer 1061 can include a partition wall 1092 in addition to the photoelectric conversion element 1050 including a selenium layer. The partition wall 1092 is provided so as to cover a step of the electrode 1065. The selenium layer used for the photoelectric conversion element 1050 has high resistance and can have a structure not divided between pixels.

The transistors 1051 and 1052, which are OS transistors, are provided in the layer 1062. Although both of the transistors 1051 and 1052 include back gates 1091, either of them may include the back gate. As illustrated in FIG. 20(B), the back gate 1091 might be electrically connected to a front gate of the transistor, which is provided to face the back gate. Alternatively, a structure in which a fixed potential different from that for the front gate can be supplied to the back gate 1091 may be employed.

Figure 21A:
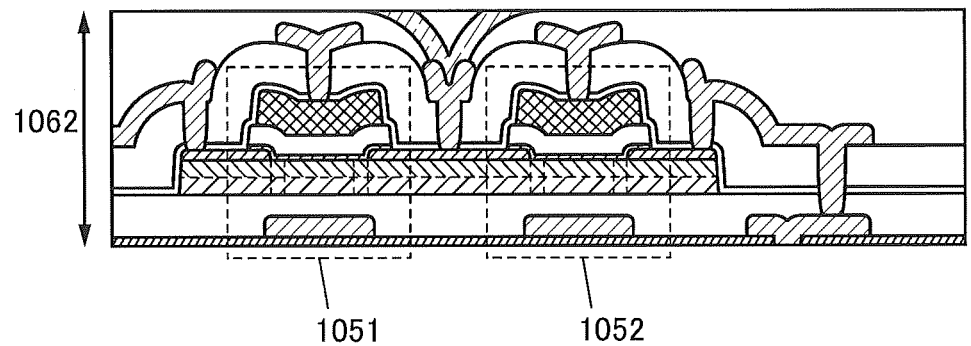
FIGS. 21A-21C are cross-sectional views illustrating structures of an imaging device.

Although FIG. 20(A) illustrates a top-gate transistor having a self-aligned structure as an example of an OS transistor, a transistor having a non-self-aligned structure may be used as illustrated in FIG. 21(A).

Figure 21B:
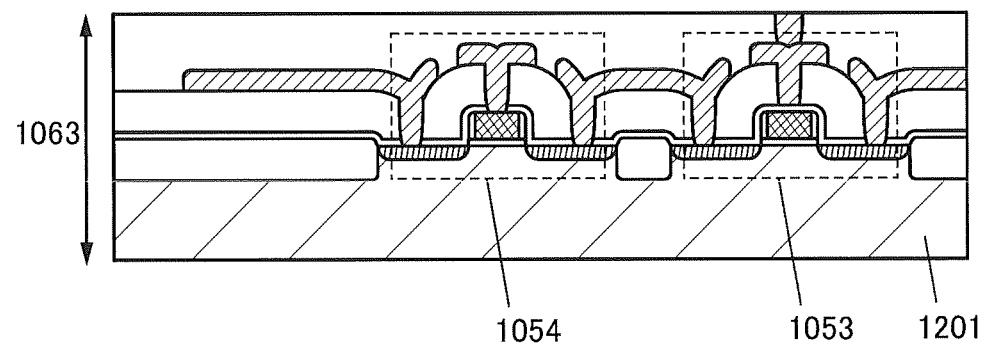
Figure 21C:
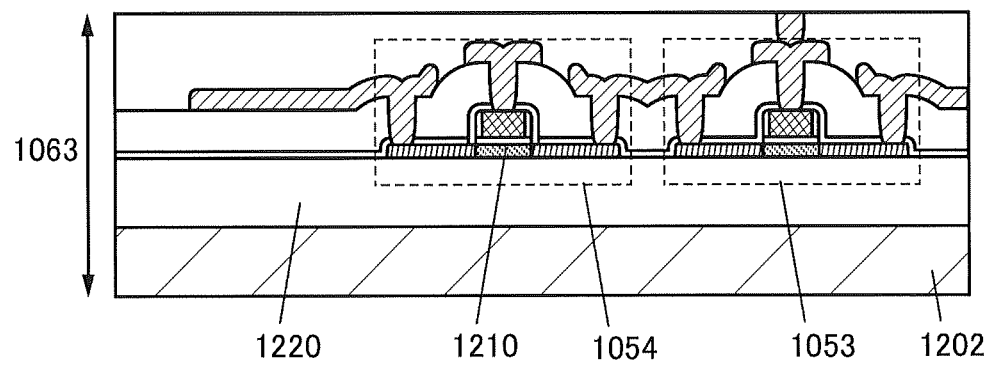

The transistor 1053 and the transistor 1054, which are Si transistors, are provided in the layer 1063. Although FIG. 20(A) illustrates an example in which the Si transistor includes a fin semiconductor layer provided in a silicon substrate 1200, a planar transistor including an active region in a silicon substrate 1201 may be used as illustrated in FIG. 21(B). Alternatively, as illustrated in FIG. 21(C), transistors each including a semiconductor layer 1210 of a silicon thin film may be used. The semiconductor layer 1210 can be single crystal silicon formed over an insulating layer 1220 over a silicon substrate 1202 (SOI (Silicon on Insulator)), for example. Alternatively, polycrystalline silicon formed over an insulating surface of a glass substrate or the like may be used. In addition, a circuit for driving a pixel can be provided in the layer 1063.

An insulating layer 1093 that has a function of preventing diffusion of hydrogen is provided between a region where OS transistors are formed and a region where Si transistors are formed. Dangling bonds of silicon are terminated with hydrogen in insulating layers provided in the vicinities of the active regions of the transistors 1053 and 1054. Meanwhile, hydrogen in insulating layers provided in the vicinity of the oxide semiconductor layer that is the active layer of the transistors 1051 and 1052 is a factor of generation of carriers in the oxide semiconductor layer.

Hydrogen is confined in the one layer by the insulating layer 1093, so that the reliability of the transistors 1053 and 1054 can be improved. Furthermore, diffusion of hydrogen from the one layer to the other layer is inhibited, so that the reliability of the transistors 1051 and 1052 can also be improved.

For the insulating layer 1093, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

Figure 22A:
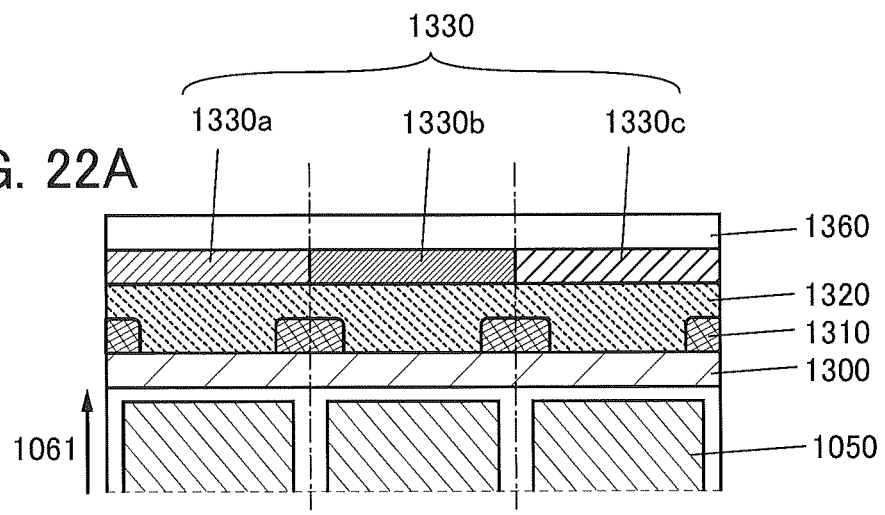
FIGS. 22A-22C are cross-sectional views illustrating structures of an imaging device.

FIG. 22(A) is a cross-sectional view illustrating an example in which a color filter and the like are added to the imaging device of one embodiment of the present invention. The cross-sectional view illustrates part of a region including pixel circuits for three pixels. An insulating layer 1300 is formed over the layer 1061 where the photoelectric conversion element 1050 is formed. As the insulating layer 1300, for example, a silicon oxide film having a high light-transmitting property with respect to visible light can be used. In addition, a silicon nitride film may be stacked as a passivation film. Furthermore, a dielectric film of hafnium oxide or the like may be stacked as an anti-reflection film.

A light-blocking layer 1310 may be formed over the insulating layer 1300. The light-blocking layer 1310 has a function of preventing color mixing of light passing through the upper color filter. As the light-blocking layer 1310, a metal layer of aluminum, tungsten, or the like can be used. Alternatively, the metal layer and a dielectric film having a function of an anti-reflection film may be stacked.

An organic resin layer 1320 can be provided as a planarization film over the insulating layer 1300 and the light-blocking layer 1310. A color filter 1330 (a color filter 1330a, a color filter 1330b, or a color filter 1330c) is formed in each pixel. For example, a color of R (red), G (green), B (blue), Y (yellow), C (cyan), M (magenta), or the like is assigned to the color filter 1330a, the color filter 1330b, and the color filter 1330c, so that a color image can be obtained.

For example, an insulating layer 1360 having a light-transmitting property with respect to visible light can be provided over the color filter 1330.

Figure 22B:
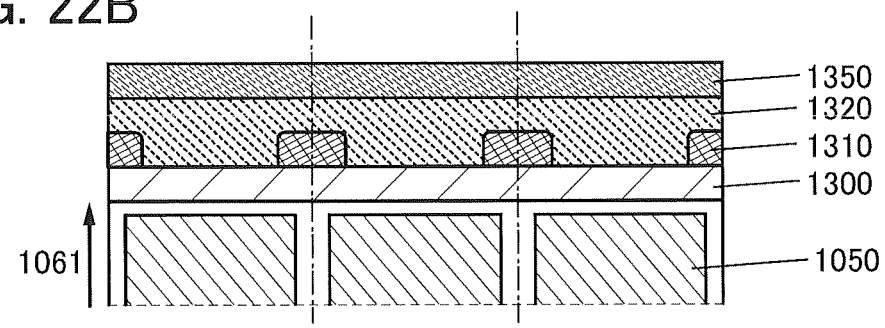

As illustrated in FIG. 22(B), an optical conversion layer 1350 may be used instead of the color filter 1330. Such a structure enables the imaging device to capture images in various wavelength regions.

When a filter that blocks light with a wavelength shorter than or equal to that of visible light is used as the optical conversion layer 1350, for example, it is possible to obtain an infrared imaging device. Furthermore, when a filter that blocks light with a wavelength shorter than or equal to that of near infrared light is used as the optical conversion layer 1350, it is possible to obtain a far-infrared imaging device. Furthermore, when a filter that blocks light with a wavelength longer than or equal to that of visible light is used as the optical conversion layer 1350, it is possible to obtain an ultraviolet imaging device.

Furthermore, when a scintillator is used as the optical conversion layer 1350, it is possible to obtain an imaging device that captures an image visualizing the intensity of radiation and is used for an X-ray imaging device or the like. Radiations such as X-rays that pass through an object to enter a scintillator are converted into light (fluorescence) such as visible light or ultraviolet light owing to a photoluminescence phenomenon. Then, the light is detected by the photoelectric conversion element 1050, whereby image data is obtained. Moreover, the imaging device having the above structure may be used in a radiation detector or the like.

A scintillator contains a substance that, when irradiated with radiation such as X-rays or gamma rays, absorbs energy thereof to emit visible light or ultraviolet light. For example, it is possible to use a resin or ceramics in which $Gd_2O_2S$:Tb, $Gd_2O_2S$:Pr, $Gd_2O_2S$:Eu, BaFC:Eu, NaI, CsI, $CaF_2$, $BaF_2$, $CeF_3$, LiF, LiI, or ZnO is dispersed.

In the photoelectric conversion element 1050 using a selenium-based material, radiation such as X-rays can be directly converted into charge; thus, a structure that does not require the scintillator can be employed.

Figure 22C:
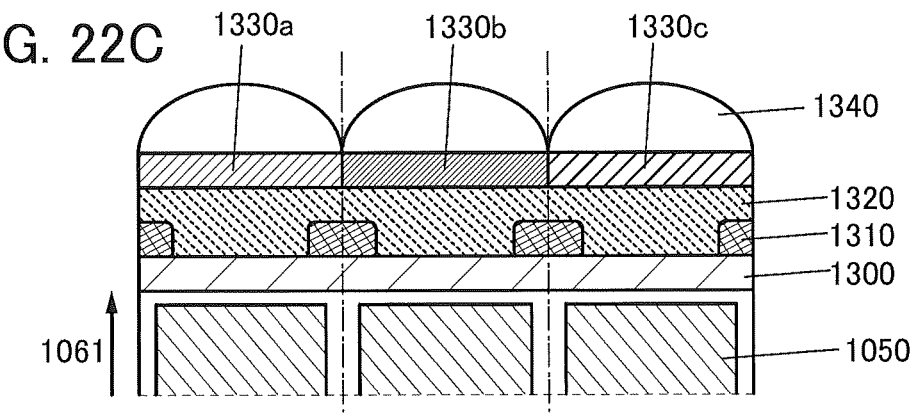

As illustrated in FIG. 22(C), a microlens array 1340 may be provided over the color filter 1330a, the color filter 1330b, and the color filter 1330c. Light passing through lenses included in the microlens array 1340 goes through the color filters positioned thereunder to reach the photoelectric conversion element 1050. The microlens array 1340 may be provided over the optical conversion layer 1350 illustrated in FIG. 22(B).

Hereinafter, examples of a package and a camera module in each of which an image sensor chip is placed will be described. For the image sensor chip, the structure of the above imaging device can be employed.

FIG. 23(A1) is an external perspective view of the top surface side of a package in which an image sensor chip is placed. The package includes a package substrate 1410 to which an image sensor chip 1450 is fixed, a cover glass 1420, an adhesive 1430 for bonding the package substrate 1410 and the cover glass 1420, and the like.

FIG. 23(A2) is an external perspective view of the bottom surface side of the package. A BGA (Ball grid array) structure in which solder balls are provided as bumps 1440 on the bottom surface of the package is employed. Note that, not limited to the BGA, an LGA (Land grid array) or a PGA (Pin Grid Array), or the like may be employed.

FIG. 23(A3) is a perspective view of the package, in which parts of the cover glass 1420 and the adhesive 1430 are omitted. Electrode pads 1460 are formed over the package substrate 1410, and the electrode pads 1460 and the bumps 1440 are electrically connected via through-holes. The electrode pads 1460 are electrically connected to electrodes of the image sensor chip 1450 through wires 1470.

Furthermore, FIG. 23(B1) is an external perspective view of the top surface side of a camera module in which an image sensor chip is placed in a package with a built-in lens. The camera module includes a package substrate 1411 to which an image sensor chip 1451 is fixed, a lens cover 1421, a lens 1435, and the like. Furthermore, an IC chip 1490 having functions of a driver circuit, a signal conversion circuit, and the like of an imaging device is provided between the package substrate 1411 and the image sensor chip 1451; thus, the structure as an SiP (System in package) is formed.

FIG. 23(B2) is an external perspective view of the bottom surface side of the camera module. On the bottom surface and side surfaces of the package substrate 1411, a QFN (Quad flat no-lead package) structure in which lands 1441 for mounting are provided is employed. Note that this structure is just an example, and a QFP (Quad flat package), the above-mentioned BGA, or the like may also be employed.

FIG. 23(B3) is a perspective view of the module, in which parts of the lens cover 1421 and the lens 1435 are omitted. The lands 1441 are electrically connected to electrode pads 1461, and the electrode pads 1461 are electrically connected to the image sensor chip 1451 or the IC chip 1490 through wires 1471.

The image sensor chip placed in a package having the above form can be easily mounted on a printed substrate or the like, and the image sensor chip can be incorporated into a variety of semiconductor devices and electronic devices.

Note that this embodiment can be combined with other embodiments in this specification as appropriate.

Embodiment 7

As electronic devices that can include an imaging device of one embodiment of the present invention, display devices, personal computers, image memory devices or image reproducing devices provided with a recording medium, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 24 illustrates specific examples of these electronic devices. In the electronic devices illustrated in FIG. 24, face authentication is performed by a neural network with the use of the image detection module of one embodiment of the present invention, and a target is focused on by an imaging device, whereby an image with high quality can be obtained.

Figure 24A:
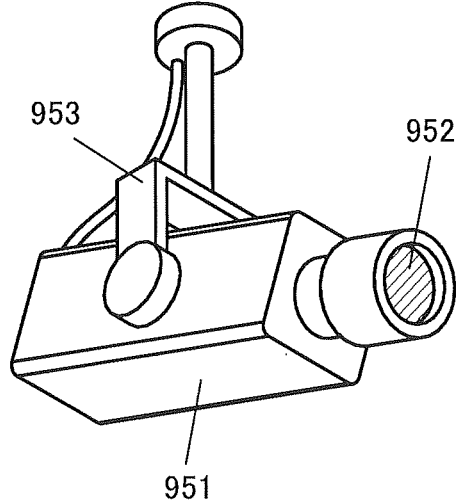
FIGS. 24A-24F are diagrams illustrating structure examples of an electronic device.

FIG. 24(A) is a surveillance camera, which includes a housing 951, a lens 952, a support portion 953, and the like. The imaging device of one embodiment of the present invention can be included, as a component for obtaining an image, in the surveillance camera. Note that a surveillance camera is a name in common use and does not limit the use thereof. A device that has a function of a surveillance camera can also be called a camera or a video camera, for example.

Figure 24B:
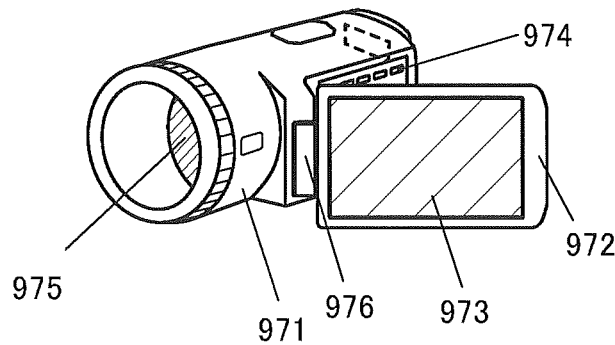

FIG. 24(B) is a video camera, which includes a first housing 971, a second housing 972, a display portion 973, an operation key 974, a lens 975, a connection portion 976, and the like. The operation key 974 and the lens 975 are provided on the first housing 971, and the display portion 973 is provided on the second housing 972. The imaging device of one embodiment of the present invention can be included, as a component for obtaining an image, in the video camera.

Figure 24C:
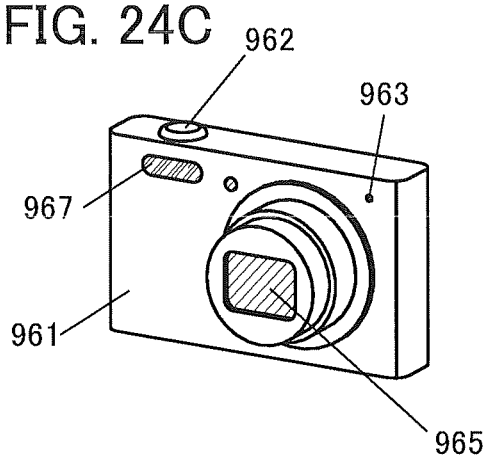

FIG. 24(C) is a digital camera, which includes a housing 961, a shutter button 962, a microphone 963, a light-emitting portion 967, a lens 965, and the like. The imaging device of one embodiment of the present invention can be included, as a component for obtaining an image, in the digital camera.

Figure 24D:
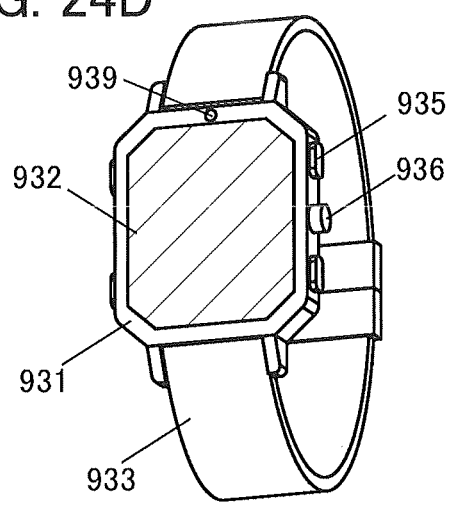

FIG. 24(D) is a wrist-watch-type information terminal, which includes a housing 931, a display portion 932, a wristband 933, an operation button 935, a crown 936, a camera 939, and the like. The display portion 932 may be a touch panel. The imaging device of one embodiment of the present invention can be included, as a component for obtaining an image, in the information terminal.

Figure 24E:
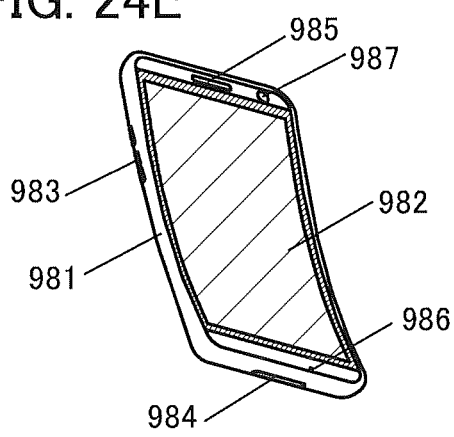

FIG. 24(E) is an example of a cellular phone, which includes a housing 981, a display portion 982, an operation button 983, an external connection port 984, a speaker 985, a microphone 986, a camera 987, and the like. The display portion 982 of the cellular phone includes a touch sensor. All operations including making a call and inputting text can be performed by touch on the display portion 982 with a finger, a stylus, or the like. The imaging device of one embodiment of the present invention can be included, as a component for obtaining an image, in the cellular phone.

Figure 24F:
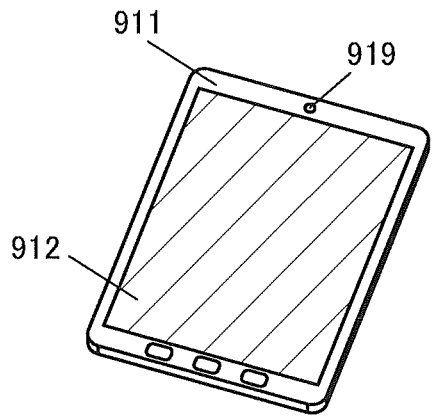

FIG. 24(F) is a portable data terminal, which includes a housing 911, a display portion 912, a camera 919, and the like. Input and output of information can be performed by a touch panel function of the display portion 912. The imaging device of one embodiment of the present invention can be included, as a component for obtaining an image, in the portable data terminal.

Figure 25A:
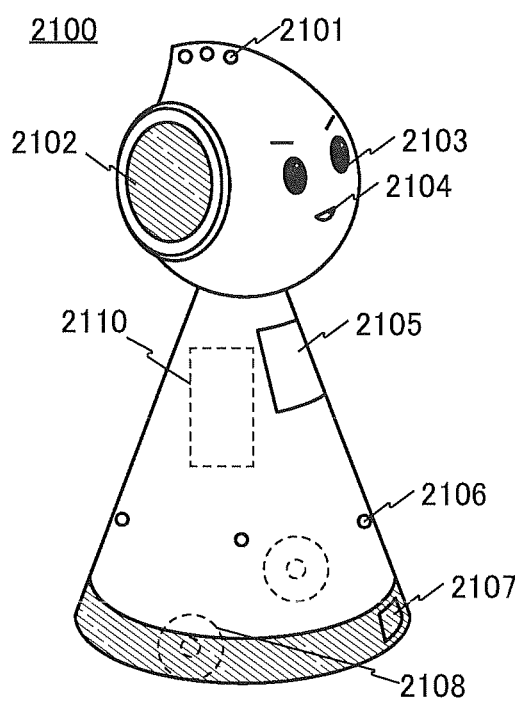
FIGS. 25A-25E are diagrams illustrating structure examples of an electronic device.

A robot 2100 illustrated in FIG. 25(A) includes an arithmetic device 2110, an illuminance sensor 2101, a microphone 2102, an image detection module 2103, a speaker 2104, a display 2105, an image detection module 2106, an obstacle sensor 2107, and a moving mechanism 2108.

The above electronic components can be used for the arithmetic device 2110, the illuminance sensor 2101, the image detection module 2103, the display 2105, the image detection module 2106, the obstacle sensor 2107, and the like of the robot 2100.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel.

The image detection module 2103 and the image detection module 2106 have a function of capturing an image around the robot 2100. The obstacle sensor 2107 can detect whether an obstacle exists or not in the direction where the robot 2100 advances with the moving mechanism 2108. The robot 2100 can recognize the surrounding environment by using the image detection module 2103, the image detection module 2106, and the obstacle sensor 2107 and can move safely.

Figure 25B:
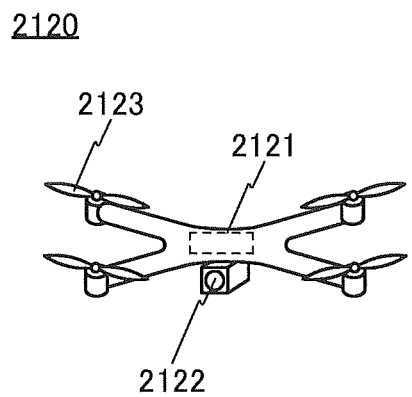

A flying object 2120 illustrated in FIG. 25(B) includes an arithmetic device 2121, a propeller 2123, and an image detection module 2122 and has a function of flying autonomously.

The flying object 2120 can search a target having features of a learned image in a specified space by the image detection module 2122, and can transmit positional information of a detected target to a data server.

Figure 25C:
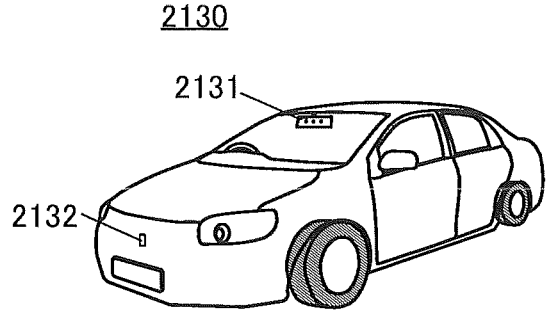

FIG. 25(C) is an external view illustrating an example of an automobile. An automobile 2130 includes an image detection module 2131 and an image detection module 2132. A plurality of image detection modules are preferably provided although not illustrated. For example, it is preferable that an image detection module be provided on the rear position in order to obtain an image in the back. The automobile 2130 also includes various sensors and the like such as an infrared radar, a millimeter wave radar, and a laser radar. The automobile 2130 determines traffic conditions therearound such as the presence of a pedestrian with analyzing images captured by the image detection module 2131 and the image detection module 2132, and thus can perform automatic driving.

Figure 25D:
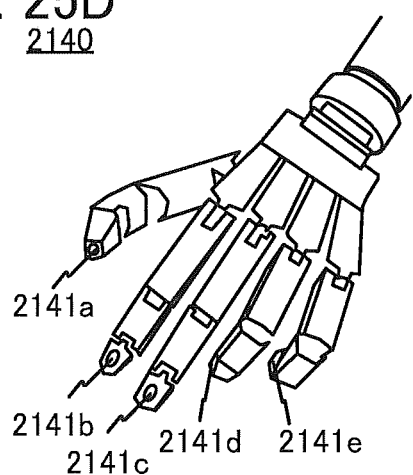

FIG. 25(D) illustrates an example of a robot. A robot 2140 includes image detection modules 2141a to 2141e on respective fingertips. The robot 2140 can select a specified target from a plurality of targets and increase response to operations such as grabbing or avoiding by using neural networks of the image detection modules 2141a to 2141e. When a target is selected, it is important to perform selection while learning is performed. In other words, a captured image is transmitted to a data server, and then the neural network can perform learning again using the captured image.

Figure 25E:
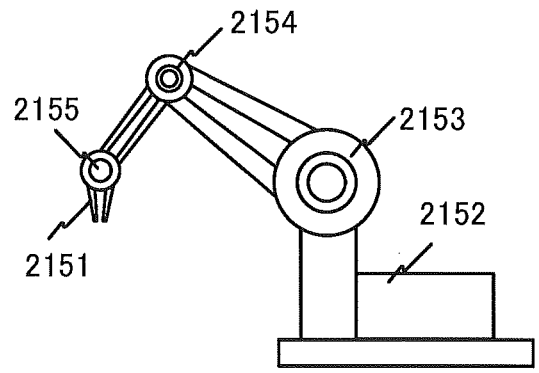

FIG. 25(E) illustrates an example of an industrial robot. The industrial robot preferably includes a plurality of drive shafts to control the driving range minutely. An example in which an industrial robot 2150 includes a functional portion 2151, a control portion 2152, a drive shaft 2153, a drive shaft 2154, and a drive shaft 2155 is illustrated. The functional portion 2151 preferably includes an image detection module.

The functional portion 2151 preferably has one or more functions of grabbing, cutting, welding, applying, and bonding targets, for example. The productivity of the industrial robot 2150 is increased in proportion to an increase in the response. Thus, an image detection module is preferably used for fast recognition of a target.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an electroluminescence (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on a current), a plasma display panel (PDP), an electron emitter, a display element including a carbon nanotube, a liquid crystal element, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (a registered trademark), an interferometric modulation (IMOD) element, a MEMS shutter display element, an optical-interference-type MEMS display element, or a piezoelectric ceramic display), quantum dots, and the like. Other than the above, the display element, the display device, the light-emitting element, or the light-emitting device may include a display media whose contrast, luminance, reflectivity, transmittance, or the like changes by electrical or magnetic effect. An example of a display device having EL elements includes an EL display. Examples of a display device including an electron emitter include a field emission display (FED), an SED-type flat panel display (SED: Surface-conduction Electron-emitter Display), and the like. Examples of a display device using a liquid crystal element include a liquid crystal display (a transmissive liquid crystal display, a transflective liquid crystal display, a reflective liquid crystal display, a direct-view liquid crystal display, or a projection liquid crystal display). Examples of display devices using electronic ink, electronic liquid powder (a registered trademark), or electrophoretic elements include electronic paper and the like. Examples of display devices containing quantum dots in each pixel include a quantum dot display. Note that quantum dots may be provided not as display elements but as part of a backlight. The use of quantum dots enables display with high color purity. Note that in the case of achieving a transflective liquid crystal display or a reflective liquid crystal display, some or all of pixel electrodes function as reflective electrodes. For example, some or all of pixel electrodes contain aluminum, silver, or the like. Moreover, in such a case, a memory circuit such as SRAM can be provided under the reflective electrodes. Thus, the power consumption can be further reduced. Note that in the case where an LED chip is used, graphene or graphite may be provided under an electrode or a nitride semiconductor of the LED chip. Graphene or graphite may be a multilayer film in which a plurality of layers are stacked. Providing graphene or graphite in the above manner facilitates formation of a nitride semiconductor thereover, such as an n-type GaN semiconductor layer including crystals. Furthermore, a p-type GaN semiconductor layer including crystals or the like can be provided thereover, and thus the LED chip can be formed. Note that an MN layer may be provided between graphene or graphite and the n-type GaN semiconductor layer including crystals. The GaN semiconductor layers included in the LED chip may be formed by MOCVD. Note that when graphene is provided, the GaN semiconductor layers included in the LED chip can also be formed by a sputtering method. In the case of a display element including microelectromechanical systems (MEMS), a drying agent may be provided in a space where the display element is sealed (e.g., between an element substrate over which the display element is placed and a counter substrate provided opposite to the element substrate). Providing a drying agent can prevent MEMS and the like from becoming difficult to move or deteriorating easily because of moisture.

Note that this embodiment can be combined with other embodiments in this specification as appropriate.

NOTES ON THE DESCRIPTION IN THIS SPECIFICATION AND THE LIKE

The following are notes on the description of the structures in the above embodiments.

Notes on One Embodiment of the Present Invention Described in Embodiments

One embodiment of the present invention can be constituted by appropriately combining the structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or more of different embodiments, for example.

Note that in each embodiment, a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or more of different embodiments, much more diagrams can be formed.

Notes on Ordinal Numbers

Ordinal numbers such as "first", "second", and "third" in this specification and the like are used in order to avoid confusion among components. Thus, the number of components is not limited. In addition, the order of components is not limited. In this specification and the like, for example, a "first" component in one embodiment can be referred to as a "second" component in other embodiments or the scope of claims. Furthermore, in this specification and the like, for example, a "first" component in one embodiment can be omitted in other embodiments or the scope of claims.

Notes on Description for Drawings

Embodiments are described with reference to drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted.

Moreover, in this specification and the like, terms for describing arrangement, such as "over" and "under", are used for convenience for describing the positional relation between components with reference to drawings. The positional relation between components is changed as appropriate in accordance with a direction in which the components are described. Thus, terms for describing arrangement are not limited to those described in this specification and can be rephrased as appropriate in accordance with circumstances.

Furthermore, the term "over" or "under" does not necessarily mean that a component is placed directly above or directly below and in direct contact with another component. For example, the expression "electrode B over insulating layer A" does not necessarily mean that the electrode B is formed on and in direct contact with the insulating layer A and does not exclude the case where another component is provided between the insulating layer A and the electrode B.

In drawings, the size, the layer thickness, or the region is shown arbitrarily for description convenience. Therefore, they are not limited to the scale. Note that the drawings are schematically shown for clarity, and embodiments of the present invention are not limited to shapes or values shown in the drawings. For example, variation in signal, voltage, or current due to noise or variation in signal, voltage, or current due to difference in timing can be included.

In drawings such as a perspective view, illustration of some components might be omitted for clarity of the drawings.

Moreover, the same components or components having similar functions, components formed using the same material, components formed at the same time, or the like in the drawings are denoted by the same reference numerals in some cases, and the repeated description thereof is omitted in some cases.

Notes on Expressions that can be Rephrased

In this specification and the like, one of a source and a drain is denoted by "one of a source and a drain" (or a first electrode or a first terminal) and the other of the source and the drain is denoted by "the other of the source and the drain" (or a second electrode or a second terminal) in the description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate in accordance with circumstances. In this specification and the like, the two terminals other than the gate may be referred to as a first terminal and a second terminal or as a third terminal and a fourth terminal. Furthermore, in the case where a transistor described in this specification and the like has two or more gates (such a structure is referred to as a dual-gate structure in some cases), these gates are referred to as a first gate and a second gate or as a front gate and a back gate in some cases. In particular, the term "front gate" can be replaced with a simple term "gate". The term "back gate" can be replaced with a simple term "gate". Note that a bottom gate is a terminal that is formed before a channel formation region in manufacture of a transistor, and a "top gate" is a terminal that is formed after a channel formation region in manufacture of a transistor.

A transistor has three terminals referred to as a gate, a source, and a drain. A gate is a terminal that functions as a control terminal that controls the conduction state of a transistor. Depending on the type of the transistor or levels of potentials supplied to the terminals, one of two input/output terminals functions as a source and the other functions as a drain. Therefore, the terms "source" and "drain" can be interchanged in this specification and the like.

In addition, in this specification and the like, the term "electrode" or "wiring" does not functionally limit a component. For example, an "electrode" is used as part of a "wiring" in some cases, and vice versa. Furthermore, the term "electrode" or "wiring" can also mean the case where a plurality of "electrodes" or "wirings" are formed in an integrated manner.

In this specification and the like, voltage and potential can be replaced with each other as appropriate. Voltage refers to a potential difference from a reference potential, and when the reference potential is a ground potential, for example, voltage can be replaced with potential. The ground potential does not necessarily mean 0 V. Note that potentials are relative, and the potential supplied to a wiring or the like is changed depending on the reference potential, in some cases.

Note that in this specification and the like, the terms "film", "layer", and the like can be interchanged with each other depending on the case or in accordance with circumstances. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or in accordance with circumstances. For example, the term "conductive layer" or "conductive film" can be changed into the term "conductor" in some cases. Furthermore, for example, the term "insulating layer" or "insulating film" can be changed into the term "insulator" in some cases.

Note that in this specification and the like, the terms "wiring", "signal line", "power source line", and the like can be interchanged with each other depending on the case or in accordance with circumstances. For example, the term "wiring" can be changed into the term "signal line" in some cases. Also, for example, the term "wiring" can be changed into the term "power source line" in some cases. Inversely, the term "signal line", "power source line", or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or in accordance with circumstances. Inversely, the term "signal" or the like can be changed into the term "potential" in some cases.

Notes on Definitions of Terms

Definitions of the terms mentioned in the above embodiments will be explained below.

<<Impurity in Semiconductor>>

An impurity in a semiconductor refers to, for example, an element other than the main components of a semiconductor layer. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, and nitrogen, for example. In the case of an oxide semiconductor, oxygen vacancies may be formed by entry of impurities such as hydrogen. Moreover, in the case where the semiconductor is a silicon layer, examples of an impurity which changes characteristics of the semiconductor include oxygen, Group 1 elements except hydrogen, Group 2 elements, Group 13 elements, and Group 15 elements.

<<Transistor>>

In this specification, a transistor is an element having at least three terminals including a gate, a drain, and a source. A channel formation region is included between the drain (a drain terminal, a drain region, or a drain electrode) and the source (a source terminal, a source region, or a source electrode). When a voltage which exceeds the threshold voltage is supplied between the gate and the source, a channel is formed in the channel formation region, whereby current can flow between the source and the drain.

Furthermore, functions of a source and a drain are sometimes interchanged with each other when transistors having different polarities are used or when the direction of current is changed in circuit operation, for example. Therefore, the terms "source" and "drain" can be interchanged in this specification and the like.

<<Switch>>

In this specification and the like, a switch is in a conduction state (on state) or in a non-conduction state (off state) to determine whether a current flows or not. Alternatively, a switch has a function of selecting and changing a current path.

Examples of the switch that can be used are an electrical switch, a mechanical switch, and the like. That is, a switch can be any element capable of controlling current, and is not limited to a certain element.

Examples of the electrical switch are a transistor (for example, a bipolar transistor or a MOS transistor), a diode (for example, a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of the mechanical switch is a switch formed using a MEMS (micro electro mechanical system) technology, such as a digital micromirror device (DMD). Such a switch includes an electrode which can be moved mechanically, and operates by controlling conduction and non-conduction with movement of the electrode.

<<Connection>>

In this specification and the like, a description X and Y are connected includes the case where X and Y are electrically connected, the case where X and Y are functionally connected, and the case where X and Y are directly connected. Accordingly, without being limited to a predetermined connection relation, for example, a connection relation shown in drawings or text, a connection relation other than the connection relation shown in drawings or text is also included.

Note that X, Y, and the like used here each denote an object (for example, a device, an element, a circuit, a wiring, an electrode, a terminal, a conductive film, or a layer).

For example, in the case where X and Y are electrically connected, one or more elements that enable electrical connection between X and Y (for example, a switch, a transistor, a capacitor, an inductor, a resistor, a diode, a display element, a light-emitting element, or a load) can be connected between X and Y. Note that the switch has a function of being controlled to be turned on or off. That is, the switch has a function of being in a conduction state (on state) or a non-conduction state (off state) to determine whether a current flows or not.

For example, in the case where X and Y are functionally connected, one or more elements that enable functional connection between X and Y (for example, a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. Note that, for example, even when another circuit is interposed between X and Y, X and Y are functionally connected if a signal output from X is transmitted to Y.

Note that an explicit description, X and Y are electrically connected, includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "being electrically connected" is the same as the explicit simple expression "being connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by using an expression similar to these examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and Z2 denotes an object (for example, a device, an element, a circuit, a wiring, an electrode, a terminal, a conductive film, or a layer).

Note that even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes in its category such a case where one conductive film has functions of a plurality of components.

<<Parallel and Perpendicular>>

In this specification, "parallel" indicates a state where the angle formed between two straight lines is greater than or equal to −10° and less than or equal to 10°. Accordingly, the case where the angle is greater than or equal to −5° and less than or equal to 5° is also included. In addition, "substantially parallel" indicates a state where the angle formed between two straight lines is greater than or equal to −30° and less than or equal to 30°. In addition, "perpendicular" indicates a state where the angle formed between two straight lines is greater than or equal to 80° and less than or equal to 100°. Accordingly, the case where the angle is greater than or equal to 85° and less than or equal to 95° is also included. In addition, "substantially perpendicular" indicates a state where the angle formed between two straight lines is greater than or equal to 60° and less than or equal to 120°.

REFERENCE NUMERALS

CF2: color filter, ND1: node, ND2: node, ND3: node, ND4: node, NN1: neural network, NN2: neural network, 10: image detection module, 10a: housing, 10b: opening portion, 10c: fixing unit, 11: processor, 12: memory device, 13: neural network, 13a: imaging device, 13b: analog/digital converter circuit, 13c: GPU, 13d: imaging device, 13e: imaging portion, 14: light-emitting element, 15: position sensor, 16: battery, 17: passive element, 18: communication module, 21: pixel, 21a: wiring, 22: gate driver, 23: adder circuit, 31: capacitor, 32: capacitor, 33: capacitor, 34: capacitor, 35: capacitor, 36: capacitor, 40: environment monitor module, 40a: control portion, 40b: housing, 41: processor, 42: memory device, 43: environment sensor module, 43a: environment sensor module, 43b: environment sensor module, 43c: environment sensor module, 43d: environment sensor module, 44: light-emitting element, 45: position sensor, 46: battery, 47: battery, 48: communication module, 51: transistor, 52: transistor, 53: transistor, 54: transistor, 55: transistor, 56: transistor, 57: transistor, 58: transistor, 61: signal line, 62: signal line, 65: signal line, 66: signal line, 67: signal line, 68: signal line, 69: signal line, 71: wiring, 72: wiring, 73: wiring, 74: wiring, 75: wiring, 76: wiring, 77: wiring, 80: data server, 81: processor, 82: memory device, 83: neural network, 88: communication module, 91: neuron, 91a: input element, 91b: synapse circuit, 91c: sigmoid function circuit, 100: semiconductor device, 110: conductor, 112: conductor, 120: conductor, 130: insulator, 140: capacitor, 150: insulator, 156: conductor, 160: insulator, 166: conductor, 200: transistor, 201: transistor, 214: insulator, 216: insulator, 218: conductor, 220: insulator, 222: insulator, 224: insulator, 225: insulator, 246: conductor, 248: conductor, 280: insulator, 282: insulator, 286: insulator, 300: transistor, 310: conductor, 310a: conductor, 310b: conductor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: conductor, 404a: conductor, 404b: conductor, 405: conductor, 405a: conductor, 405b: conductor, 406: metal oxide, 406a: metal oxide, 406b: metal oxide, 406c: metal oxide, 412: insulator, 413: insulator, 418: insulator, 419: insulator, 420: insulator, 426a: region, 426b: region, 426c: region, 440: conductor, 440a: conductor, 440b: conductor, 450a: conductor, 450b: conductor, 451a: conductor, 451b: conductor, 452a: conductor, 452b: conductor, 911: housing, 912: display portion, 919: camera, 931: housing, 932: display portion, 933: wristband, 935: button, 936: crown, 939: camera, 951: housing, 952: lens, 953: support portion, 961: housing, 962: shutter button, 963: microphone, 965: lens, 967: light-emitting portion, 971: housing, 972: housing, 973: display portion, 974: operation key, 975: lens, 976: connection portion, 981: housing, 982: display portion, 983: operation button, 984: external connection port, 985: speaker, 986: microphone, 987: camera, 1050: photoelectric conversion element, 1052: transistor, 1054: transistor, 1061: layer, 1062: layer, 1063: layer, 1065: electrode, 1066: photoelectric conversion portion, 1066a: layer, 1066b: layer, 1067: electrode, 1091: back gate, 1092: partition wall, 1093: insulating layer, 1200: silicon substrate, 1201: silicon substrate, 1202: silicon substrate, 1210: semiconductor layer, 1220: insulating layer, 1300: insulating layer, 1310: light-blocking layer, 1320: organic resin layer, 1330: color filter, 1330a: color filter, 1330b: color filter, 1330c: color filter, 1340: microlens array, 1350: optical conversion layer, 1360: insulating layer, 1410: package substrate, 1411: package substrate, 1420: cover glass, 1421: lens cover, 1430: adhesive, 1435: lens, 1440: bump, 1441: land, 1450: image sensor chip, 1451: image sensor chip, 1460: electrode pad, 1461: electrode pad, 1470: wire, 1471: wire, 1490: IC chip, 2100: robot, 2101: illuminance sensor, 2102: microphone, 2103: image detection module, 2104: speaker, 2105: display, 2106: image detection module, 2107: obstacle sensor, 2108: moving mechanism, 2110: arithmetic device, 2120: flying object, 2121: arithmetic device, 2122: image detection module, 2123: propeller, 2130: automobile, 2131: image detection module, 2132: image detection module, 2140: robot, 2141a: image detection module, 2141e: image detection module, 2150: industrial robot, 2151: functional portion, 2152: control portion, 2153: drive shaft, 2154: drive shaft, 2155: drive shaft This application is based on Japanese Patent Application Serial No. 2017-099346 filed with Japan Patent Office on May 18, 2017, the entire contents of which are hereby incorporated herein by reference.

The invention claimed is:

1. An image detection module comprising a first neural network,
  wherein the first neural network comprises an imaging device, wherein the imaging device comprises a plurality of pixels, a first signal line, a second signal line, a third signal line, a fourth signal line, a fifth signal line, a first wiring, a second wiring, a third wiring, and a fourth wiring, wherein the pixel comprises a first transistor, a second transistor, a third transistor, a fourth transistor, a fifth transistor, a first capacitor, a second capacitor, and a photodiode, wherein a gate of the first transistor is electrically connected to the first signal line, wherein one of a source and a drain of the first transistor is electrically connected to the first wiring, wherein the other of the source and the drain of the first transistor is electrically connected to one of a source and a drain of the second transistor and one electrode of the photodiode, wherein the other electrode of the photodiode is electrically connected to the second wiring, wherein a gate of the second transistor is electrically connected to the second signal line, wherein the other of the source and the drain of the second transistor is electrically connected to a gate of the third transistor and one electrode of the first capacitor, wherein one of a source and a drain of the third transistor is electrically connected to the first wiring, wherein the other of the source and the drain of the third transistor is electrically connected to one of a source and a drain of the fourth transistor, wherein a gate of the fourth transistor is electrically connected to the third signal line, wherein the other of the source and the drain of the fourth transistor is electrically connected to the fourth wiring, wherein the other electrode of the first capacitor is electrically connected to one electrode of the second capacitor and one of a source and a drain of the fifth transistor, wherein a gate of the fifth transistor is electrically connected to the fourth signal line, wherein the other of the source and the drain of the fifth transistor is electrically connected to the fifth signal line, wherein the other electrode of the second capacitor is electrically connected to the third wiring, wherein a first node is formed by connecting the other of the source and the drain of the second transistor, the gate of the third transistor, and the one electrode of the first capacitor, and wherein a second node is formed by connecting the other electrode of the first capacitor, the one electrode of the second capacitor, and the one of the source and the drain of the fifth transistor.

2. The image detection module according to claim 1, wherein the imaging device further comprises a gate driver, a plurality of adder circuits, a plurality of analog/digital converter circuits, a sixth signal line, a seventh signal line, a fifth wiring, a sixth wiring, a seventh wiring, and an eighth wiring, wherein the adder circuit comprises a sixth transistor, a seventh transistor, an eighth transistor, a third capacitor, and a fourth capacitor, wherein the gate driver is electrically connected to the plurality of pixels through the third signal line, wherein the adder circuit is electrically connected to the plurality of pixels through the fourth wiring, wherein the fourth wiring is electrically connected to the analog/digital converter circuit through the adder circuit, wherein the fourth wiring is electrically connected to one electrode of the third capacitor, one of a source and a drain of the sixth transistor, and one of a source and a drain of the eighth transistor, wherein a gate of the sixth transistor is electrically connected to the sixth signal line, wherein the other of the source and the drain of the sixth transistor is electrically connected to the fifth wiring, wherein the other electrode of the third capacitor is electrically connected to one electrode of the fourth capacitor and one of a source and a drain of the seventh transistor, wherein a gate of the seventh transistor is electrically connected to the seventh signal line, wherein the other of the source and the drain of the seventh transistor is electrically connected to the sixth wiring, wherein the other electrode of the fourth capacitor is electrically connected to the eighth wiring, wherein a gate of the eighth transistor is electrically connected to the other of the source and the drain of the eighth transistor and the seventh wiring, wherein a third node is formed by connecting the one electrode of the third capacitor, the one of the source and the drain of the sixth transistor, the one of the source and the drain of the eighth transistor, the analog/digital converter circuit, and the fourth wiring, and wherein a fourth node is formed by connecting the other electrode of the third capacitor, the one electrode of the fourth capacitor, and the one of the source and the drain of the seventh transistor.

3. The image detection module according to claim 2, wherein a first voltage is supplied from the fifth signal line to the one electrode of the second capacitor through the fifth transistor, wherein the first voltage is supplied from the third wiring to the other electrode of the second capacitor, wherein the second capacitor has a function of a first electrode having the first voltage, wherein the first voltage is supplied from the sixth wiring to the one electrode of the fourth capacitor through the seventh transistor, wherein the first voltage is supplied from the eighth wiring to the other electrode of the fourth capacitor, wherein the fourth capacitor has a function of a second electrode having the first voltage, wherein a signal supplied to the first signal line turns on the first transistor, wherein a signal supplied to the second signal line turns on the second transistor, wherein the first node is updated by a reset voltage supplied to the first wiring, wherein a signal supplied to the first signal line turns off the first transistor, wherein at the first node, imaging data is updated by a photocurrent flowing through the photodiode, wherein a signal supplied to the second signal line turns off the second transistor, wherein the imaging data retained in the first capacitor is retained in the first node, wherein the imaging data is supplied to the gate of the third transistor, wherein the gate driver has a function of supplying a scan signal to the third signal line, wherein the scan signal controls the fourth transistor,
wherein the imaging data is converted into a first current by the third transistor,
wherein the first current is supplied to the fourth wiring through the fourth transistor,
wherein the first current is supplied to the third capacitor of the adder circuit through the fourth wiring,
wherein the third capacitor converts the first current into a first output voltage and changes a potential of the third node, and
wherein the first output voltage is supplied to the analog/digital converter circuit, whereby the image detection module functions as an imaging element.

4. The image detection module according to claim 2,
wherein an offset potential is supplied from the fifth wiring to the third node through the sixth transistor,
wherein the offset potential is supplied from the sixth wiring to the fourth node through the seventh transistor,
wherein a first voltage is supplied from the eighth wiring to the other electrode of the fourth capacitor,
wherein a signal supplied to the first signal line turns on the first transistor,
wherein a signal supplied to the second signal line turns on the second transistor,
wherein the first node is updated by a reset voltage supplied to the first wiring through the first transistor,
wherein the second node is updated by the first voltage supplied to the fifth signal line through the fifth transistor,
wherein a second voltage is supplied from the third wiring to the other electrode of the second capacitor as a weight coefficient,
wherein a signal supplied to the first signal line turns off the first transistor,
wherein a signal supplied to the fourth signal line turns off the fifth transistor,
wherein at the first node, the imaging data is updated by a photocurrent flowing through the photodiode,
wherein a signal supplied to the second signal line turns off the second transistor,
wherein the imaging data retained in the first capacitor is retained in the first node,
wherein the third wiring is updated from the second voltage to the first voltage,
wherein the first node generates a third voltage obtained by adding the second voltage to the imaging data by capacitive coupling between the first capacitor and the second capacitor,
wherein the third voltage has a multiplication function corresponding to a difference from the second voltage when supplied to the gate of the third transistor,
wherein the gate driver has a function of supplying scan signals to a plurality of the third signal lines,
wherein the scan signals control the fourth transistors of the plurality of pixels,
wherein the imaging data of each of the pixels is converted into a first current by the third transistor,
wherein the first current is supplied to the fourth wiring through the fourth transistor,
wherein the fourth wiring generates a second current obtained by adding the first currents output from the pixels,
wherein the second current is supplied to the third capacitor of the adder circuit through the fourth wiring,
wherein the third capacitor converts the second current into a second output voltage using the offset potential as a reference and changes a potential of the third node, and
wherein the second output voltage is supplied to the analog/digital converter circuit, whereby the imaging device functions as a neuron having a product-sum operation function.

5. The image detection module according to claim 4,
wherein the eighth transistor has a function of a diode,
wherein the second output voltage has a function of being output while a potential higher than or equal to a determination voltage supplied to the seventh wiring is clipped,
wherein the analog/digital converter circuit has a function of setting the determination voltage supplied to the seventh wiring to a maximum value of an analog input voltage,
wherein when the second output voltage is the same as the determination voltage, the analog/digital converter circuit detects the maximum value, and
wherein when the analog/digital converter circuit detects the maximum value, the neuron of the first neural network has a function of determining ignition.

6. The image detection module according to claim 5,
wherein a pixel data potential for learning is supplied from the fifth signal line to the second node through the fifth transistor,
wherein the second voltage is supplied from the third wiring to the other electrode of the second capacitor as a weight coefficient,
wherein a signal supplied to the first signal line turns off the first transistor,
wherein a signal supplied to the second signal line turns off the second transistor,
wherein a signal supplied to the fourth signal line turns off the fifth transistor,
wherein the first node retains the reset voltage,
wherein the third wiring is updated from the second voltage to the pixel data potential for learning, and
wherein the first node has a function of generating a fourth voltage obtained by adding the reset voltage, the pixel data potential for learning, and the second voltage by capacitive coupling, whereby the first neural network has a learning function.

7. The image detection module according to claim 1, comprising a transistor, wherein the transistor comprises a metal oxide in a semiconductor layer.

8. The image detection module according to claim 7, wherein the transistor comprising a metal oxide in a semiconductor layer comprises a back gate.

9. An image detection module comprising a plurality of pixels, the plurality of pixels configured to serve as a neuron and an imaging device,
wherein the pixel comprises a first transistor, a second transistor, a third transistor, a first capacitor, a second capacitor, and a photodiode,
wherein the photodiode is electrically connected to one of a source and a drain of the first transistor,
wherein the other electrode of the first transistor is electrically connected to a gate of the second transistor,
wherein the gate of the second transistor is electrically connected to one electrode of the first capacitor,
wherein the other electrode of the first capacitor is electrically connected to one electrode of the second capacitor, wherein the other electrode of the first capacitor is electrically connected to one of a source and a drain of the third transistor, wherein the gate of the second transistor is configured to retain charge corresponding to an amount of a photocurrent generated by light detection of the photodiode, wherein a data potential for learning is supplied to the other of the source and the drain of the third transistor, and wherein a potential corresponding to a weight coefficient is supplied to the other electrode of the second capacitor.

10. The image detection module according to claim 9, wherein a channel formation region of the third transistor comprises an oxide semiconductor material.

11. The image detection module according to claim 9, wherein a channel formation region of the second transistor comprises silicon, and wherein a channel formation region of the third transistor comprises an oxide semiconductor material.

\* \* \* \* \*